(12) United States Patent
Myli et al.

(10) Patent No.: US 8,506,768 B2
(45) Date of Patent: *Aug. 13, 2013

(54) LOW-MAINTENANCE COATINGS, AND METHODS FOR PRODUCING LOW-MAINTENANCE COATINGS

(75) Inventors: Kari B. Myli, Sauk City, WI (US); Annette J. Krisko, Sauk City, WI (US); James E. Brownlee, Richland Center, WI (US); Gary L. Pfaff, Cazenovia, WI (US)

(73) Assignee: Cardinal CG Company, Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/875,221

(22) Filed: Sep. 3, 2010

(65) Prior Publication Data
US 2010/0326817 A1    Dec. 30, 2010

Related U.S. Application Data

(62) Division of application No. 12/209,679, filed on Sep. 12, 2008, now Pat. No. 7,820,309.

(60) Provisional application No. 60/972,527, filed on Sep. 14, 2007, provisional application No. 61/039,760, filed on Mar. 26, 2008.

(51) Int. Cl.
*C23C 14/34* (2006.01)

(52) U.S. Cl.
USPC ............ 204/192.26; 204/192.27; 204/192.28

(58) Field of Classification Search
USPC .............. 204/192.26, 192.27, 192.28
See application file for complete search history.

(56) References Cited

U.S. PATENT DOCUMENTS

| | | | |
|---|---|---|---|
| 1,256,818 A | 2/1918 | Nile | 206/454 |
| 2,808,351 A | 10/1952 | Colbert | 117/211 |
| 2,780,553 A | 2/1957 | Pawlyk | 106/1 |
| 3,505,092 A | 4/1970 | Ryan | 117/33.3 |
| 3,528,906 A | 9/1970 | Cash, Jr. | 204/298 |
| 3,679,291 A | 7/1972 | Apfel et al. | 359/587 |
| 3,727,666 A | 4/1973 | Vander Sluis | 164/72 |
| 3,829,197 A | 8/1974 | Thelen | 359/588 |
| 3,840,451 A | 10/1974 | Golyanov | 204/192 |
| 3,844,924 A | 10/1974 | Cunningham | 204/298 |
| 3,852,098 A | 12/1974 | Bloss | 117/106 |
| 3,854,796 A | 12/1974 | Thelen | 359/588 |
| 3,911,579 A | 10/1975 | Lane | 30/346 |

(Continued)

FOREIGN PATENT DOCUMENTS

| | | |
|---|---|---|
| CA | 2290999 | 5/1998 |
| DE | 39 06 453 | 9/1990 |

(Continued)

OTHER PUBLICATIONS

Machine Translation of JP 2003-311157 dated Nov. 5, 2003.*

(Continued)

*Primary Examiner* — Rodney McDonald
(74) *Attorney, Agent, or Firm* — Fredrikson & Byron, PA

(57) ABSTRACT

The invention provides a substrate bearing a low-maintenance coating. In some embodiments, the coating includes a low-maintenance film that includes both titanium oxide and tungsten oxide. The invention also provides methods and equipment for depositing such coatings.

20 Claims, 22 Drawing Sheets

(56) References Cited

U.S. PATENT DOCUMENTS

| | | | |
|---|---|---|---|
| 3,925,182 A | 12/1975 | Carmichael | 204/192 |
| 3,934,961 A | 1/1976 | Itoh | 359/586 |
| 3,968,018 A | 7/1976 | Lane | 204/192 |
| 3,970,037 A | 7/1976 | Sopko | 118/48 |
| 3,990,784 A | 11/1976 | Gelber | 350/166 |
| 4,012,119 A | 3/1977 | Adams | 349/30 |
| 4,029,566 A | 6/1977 | Brandmair | 204/290.08 |
| 4,045,125 A | 8/1977 | Farges | 350/166 |
| 4,052,520 A | 10/1977 | Chang | 427/164 |
| 4,060,660 A | 11/1977 | Carlson | 428/408 |
| 4,107,350 A | 8/1978 | Berg | 427/38 |
| 4,130,672 A | 12/1978 | Onoki | 427/164 |
| 4,166,018 A | 8/1979 | Chapin | |
| 4,194,022 A | 3/1980 | Gillery | 427/109 |
| 4,212,663 A | 7/1980 | Aslami | 65/144 |
| 4,212,903 A | 7/1980 | Schnell | 427/127 |
| 4,214,014 A | 7/1980 | Hofer | 427/40 |
| 4,216,259 A | 8/1980 | Groth | 428/216 |
| 4,238,276 A | 12/1980 | Kinugawa | 216/23 |
| 4,252,629 A | 2/1981 | Bewer | 204/290.03 |
| 4,261,722 A | 4/1981 | Novak | 65/60 |
| 4,322,276 A | 3/1982 | Meckel | 204/192.26 |
| 4,331,526 A | 5/1982 | Kuehnie | 204/192.13 |
| 4,332,922 A | 6/1982 | Kossmehl | 525/478 |
| 4,336,119 A | 6/1982 | Gillery | 204/192.13 |
| 4,351,861 A | 9/1982 | Henery | 428/255.1 |
| 4,356,073 A | 10/1982 | McKelvey | 204/192.12 |
| 4,377,613 A | 3/1983 | Gordon | 428/212 |
| 4,422,917 A | 12/1983 | Hayfield | 204/196.01 |
| 4,440,822 A | 4/1984 | Gordon | 428/212 |
| 4,465,575 A | 8/1984 | Love | 204/192 |
| 4,466,258 A | 8/1984 | Sando | 68/56 |
| 4,466,877 A | 8/1984 | McKelvey | 204/298.23 |
| 4,485,146 A | 11/1984 | Mizuhashi | 428/428 |
| 4,486,286 A | 12/1984 | Lewin | 204/192 |
| 4,503,125 A | 3/1985 | Nelson | 428/408 |
| 4,504,519 A | 3/1985 | Zelez | 427/39 |
| 4,556,599 A | 12/1985 | Sato | |
| 4,568,622 A | 2/1986 | Minami | 430/51 |
| 4,569,738 A | 2/1986 | Kieser | 204/173 |
| 4,571,350 A | 2/1986 | Parker | 427/109 |
| 4,576,864 A | 3/1986 | Krautter | 428/328 |
| 4,661,409 A | 4/1987 | Kieser | 428/408 |
| 4,663,234 A | 5/1987 | Bouton | |
| 4,673,475 A | 6/1987 | Windischmann | 204/192.11 |
| 4,692,428 A | 9/1987 | Murrell | |
| 4,704,339 A | 11/1987 | Green | 428/689 |
| 4,713,311 A | 12/1987 | Senske | 430/127 |
| 4,717,622 A | 1/1988 | Kurokawa | 428/408 |
| 4,725,345 A | 2/1988 | Sakamoto | 204/192.31 |
| 4,728,529 A | 3/1988 | Etzkorn | 427/39 |
| 4,732,454 A | 3/1988 | Saito | 350/164 |
| 4,737,252 A | 4/1988 | Hoffman | 204/192.16 |
| 4,769,291 A | 9/1988 | Belkind | 428/630 |
| 4,777,090 A | 10/1988 | Ovshinsky | 428/408 |
| 4,780,334 A | 10/1988 | Ackerman | 427/248.1 |
| 4,798,660 A | 1/1989 | Ermer | 204/192.17 |
| 4,814,056 A | 3/1989 | Welty | 204/298.11 |
| 4,816,127 A | 3/1989 | Eltouky | 204/192.15 |
| 4,834,857 A | 5/1989 | Gillery | 204/192.27 |
| 4,838,935 A | 6/1989 | Dunlop | |
| 4,849,081 A | 7/1989 | Ross | 204/192.15 |
| 4,851,095 A | 7/1989 | Scobey | 204/192.12 |
| 4,854,670 A | 8/1989 | Mellor | |
| 4,859,493 A | 8/1989 | Lemelson | 427/451 |
| 4,861,680 A | 8/1989 | Meyer | 428/623 |
| 4,882,827 A | 11/1989 | Kusumi | 29/527.2 |
| 4,883,574 A | 11/1989 | Dos Santos | |
| 4,894,133 A | 1/1990 | Hedgcoth | 204/192.15 |
| 4,902,580 A | 2/1990 | Gillery | |
| 4,915,977 A | 4/1990 | Okamoto | 427/37 |
| 4,919,778 A | 4/1990 | Dietrich | 204/192.27 |
| 4,931,213 A | 6/1990 | Cass | 340/664 |
| 4,931,315 A | 6/1990 | Mellor | |
| 4,940,636 A | 7/1990 | Brock | |
| 4,952,430 A | 8/1990 | Bowser | 428/34 |
| 4,954,465 A | 9/1990 | Kawashima | |
| 4,961,958 A | 10/1990 | Desphandey | 427/38 |
| 4,963,240 A | 10/1990 | Fukasawa | |
| 4,981,568 A | 1/1991 | Taranko | 204/192.31 |
| 4,990,234 A | 2/1991 | Szczyrbowski | 204/192.23 |
| 4,995,893 A | 2/1991 | Jenkins | |
| 4,997,576 A | 3/1991 | Heller | |
| 5,006,248 A | 4/1991 | Anderson | |
| 5,008,002 A | 4/1991 | Uno | 204/192.31 |
| 5,020,288 A | 6/1991 | Swensen | 52/202 |
| 5,026,415 A | 6/1991 | Yamamoto | 65/305 |
| 5,032,421 A | 7/1991 | Sarma | 427/38 |
| 5,035,784 A | 7/1991 | Anderson | |
| 5,047,131 A | 9/1991 | Wolfe | |
| 5,071,206 A | 12/1991 | Hood | 359/360 |
| 5,073,241 A | 12/1991 | Watanabe | 204/192.15 |
| 5,073,450 A | 12/1991 | Nietering | 428/336 |
| 5,073,451 A | 12/1991 | Iida | |
| 5,090,985 A | 2/1992 | Soubeyrand | 65/60.52 |
| 5,104,539 A | 4/1992 | Anderson | |
| 5,105,310 A | 4/1992 | Dickey | 359/586 |
| 5,106,671 A | 4/1992 | Amberger | 428/215 |
| 5,107,643 A | 4/1992 | Swensen | 52/202 |
| 5,108,574 A | 4/1992 | Kirs | 208/298.22 |
| 5,110,637 A | 5/1992 | Ando | |
| 5,126,218 A | 6/1992 | Clarke | 429/245 |
| RE34,035 E | 8/1992 | Dimigen | 428/244 |
| 5,139,633 A | 8/1992 | Kashida | 204/192.15 |
| 5,160,534 A | 11/1992 | Hiraki | |
| 5,165,972 A | 11/1992 | Porter | 428/1 |
| 5,168,003 A | 12/1992 | Proscia | |
| 5,171,414 A | 12/1992 | Amberger | 204/192.26 |
| 5,176,897 A | 1/1993 | Lester | |
| 5,179,468 A | 1/1993 | Gasloli | |
| 5,190,807 A | 3/1993 | Kimock | 428/216 |
| 5,194,990 A | 3/1993 | Boulos | 359/587 |
| 5,196,400 A | 3/1993 | Chen | 505/476 |
| 5,201,926 A | 4/1993 | Szczyrbowski | 65/60.2 |
| 5,209,996 A | 5/1993 | Kashida | 430/5 |
| 5,211,759 A | 5/1993 | Zimmerman | 118/723 |
| 5,234,487 A | 8/1993 | Wickersham | |
| 5,245,468 A | 9/1993 | Demiryont | 359/359 |
| 5,254,392 A | 10/1993 | Burns | 428/212 |
| 5,284,539 A | 2/1994 | McKernan | 156/154 |
| 5,286,524 A | 2/1994 | Slutz | 427/249 |
| 5,298,048 A | 3/1994 | Lingle | |
| 5,298,338 A | 3/1994 | Hiraki | |
| 5,302,449 A | 4/1994 | Eby | 428/336 |
| 5,306,547 A | 4/1994 | Hood | 428/213 |
| 5,306,569 A | 4/1994 | Hiraki | |
| 5,318,830 A | 6/1994 | Takamatsu | |
| 5,338,422 A | 8/1994 | Belkind | 204/192.12 |
| 5,342,676 A | 8/1994 | Zagdoun | 428/216 |
| 5,346,600 A | 9/1994 | Nieh | 204/192.3 |
| 5,354,446 A | 10/1994 | Kida | 204/298.22 |
| 5,356,718 A | 10/1994 | Athey | |
| 5,366,764 A | 11/1994 | Sunthankar | 427/248.1 |
| 5,378,527 A | 1/1995 | Nakanishi | 428/216 |
| 5,394,269 A | 2/1995 | Takamatsu | 359/580 |
| 5,397,050 A | 3/1995 | Mueller | |
| 5,401,543 A | 3/1995 | O'Neill | 427/580 |
| 5,405,517 A | 4/1995 | Lampkin | 204/192.12 |
| 5,415,756 A | 5/1995 | Wolfe | 204/192.23 |
| 5,417,827 A | 5/1995 | Finley | |
| 5,424,130 A | 6/1995 | Nakanishi | 428/410 |
| 5,453,459 A | 9/1995 | Roberts | 524/123 |
| 5,470,527 A | 11/1995 | Yamanobe | |
| 5,470,661 A | 11/1995 | Bailey | 428/408 |
| 5,476,713 A | 12/1995 | Abiko | 428/332 |
| 5,482,602 A | 1/1996 | Cooper | 204/192.11 |
| 5,496,621 A | 3/1996 | Makita | |
| 5,498,475 A | 3/1996 | Takigawa | 428/334 |
| 5,507,930 A | 4/1996 | Yamashita | 204/192.15 |
| 5,512,152 A | 4/1996 | Schicht | |
| 5,513,039 A | 4/1996 | Lu | |
| 5,514,485 A | 5/1996 | Ando | |
| 5,520,996 A | 5/1996 | Balian | 428/216 |
| 5,525,406 A | 6/1996 | Goodman | |

| | | | | | | |
|---|---|---|---|---|---|---|
| 5,527,755 A | 6/1996 | Wenski | | 5,891,556 A | 4/1999 | Anderson .................... 428/216 |
| 5,529,631 A | 6/1996 | Yoshikawa ................ 118/78 | | 5,896,553 A | 4/1999 | Lo |
| 5,552,180 A | 9/1996 | Finley | | 5,897,957 A | 4/1999 | Goodman |
| 5,558,751 A | 9/1996 | Mahler ................ 204/298.26 | | 5,935,716 A | 8/1999 | McCurdy |
| 5,563,734 A | 10/1996 | Wolfe ...................... 359/360 | | 5,939,188 A | 8/1999 | Moncur |
| 5,569,362 A | 10/1996 | Lerbet | | 5,939,194 A | 8/1999 | Hashimoto ................ 428/411 |
| 5,569,501 A | 10/1996 | Bailey ...................... 427/577 | | 5,939,201 A | 8/1999 | Boire |
| 5,589,280 A | 12/1996 | Gibbons .................... 428/626 | | 5,948,538 A | 9/1999 | Brochot |
| 5,593,784 A | 1/1997 | Chinzi ...................... 428/413 | | 5,961,843 A | 10/1999 | Hayakawa ................ 210/748 |
| 5,593,786 A | 1/1997 | Parker ...................... 428/426 | | 5,962,115 A | 10/1999 | Zmelty ...................... 428/216 |
| 5,594,585 A | 1/1997 | Komatsu .................... 359/512 | | 5,965,246 A | 10/1999 | Guiselin .................... 428/212 |
| 5,595,813 A | 1/1997 | Ogawa | | 5,968,328 A | 10/1999 | Teschner ................ 204/298.25 |
| 5,595,825 A | 1/1997 | Guiselin .................... 428/428 | | 5,972,184 A | 10/1999 | Hollars ................ 204/298.08 |
| 5,597,622 A | 1/1997 | Zoller ...................... 427/563 | | 5,981,426 A | 11/1999 | Langford |
| 5,599,422 A | 2/1997 | Adams, Jr. .................... 156/510 | | 5,993,734 A | 11/1999 | Snowman |
| 5,609,924 A | 3/1997 | McCurdy ...................... 427/475 | | 6,013,372 A | 1/2000 | Hayakawa |
| 5,611,899 A | 3/1997 | Maass ................ 204/298.08 | | 6,027,766 A | 2/2000 | Greenberg |
| 5,616,225 A | 4/1997 | Sieck ................ 204/298.14 | | 6,037,289 A | 3/2000 | Chopin |
| 5,616,532 A | 4/1997 | Heller ...................... 502/242 | | 6,040,939 A | 3/2000 | Demiryont |
| 5,618,388 A | 4/1997 | Seeser ................ 204/192.12 | | 6,045,903 A | 4/2000 | Seino ...................... 428/331 |
| 5,618,590 A | 4/1997 | Naruse ...................... 427/249 | | 6,046,403 A * | 4/2000 | Yoshikawa et al. .......... 136/257 |
| 5,620,572 A | 4/1997 | Bjornard ................ 204/192.12 | | 6,054,024 A | 4/2000 | Toyama ................ 204/192.29 |
| 5,624,423 A | 4/1997 | Anjur ................ 604/385.21 | | 6,054,227 A | 4/2000 | Greenberg |
| 5,624,760 A | 4/1997 | Collins ...................... 428/426 | | 6,068,914 A | 5/2000 | Boire |
| 5,633,208 A | 5/1997 | Ishikawa ...................... 438/699 | | 6,071,606 A | 6/2000 | Yamazaki |
| 5,635,287 A | 6/1997 | Balian | | 6,071,623 A | 6/2000 | Sugawara |
| 5,643,423 A | 7/1997 | Kimock ................ 204/192.35 | | 6,074,981 A | 6/2000 | Tada |
| 5,643,432 A | 7/1997 | Qiu ................ 205/50 | | 6,077,482 A | 6/2000 | Kanno |
| 5,645,699 A | 7/1997 | Sieck ................ 204/192.12 | | 6,077,492 A | 6/2000 | Anpo |
| 5,645,900 A | 7/1997 | Ong ...................... 427/571 | | 6,090,489 A | 7/2000 | Hayakawa |
| 5,669,144 A | 9/1997 | Hahn ................ 30/346.54 | | 6,103,363 A | 8/2000 | Boire |
| 5,674,625 A | 10/1997 | Takahashi .................... 428/428 | | 6,114,043 A | 9/2000 | Joret ...................... 428/428 |
| 5,674,658 A | 10/1997 | Burberry .................... 430/262 | | 6,120,747 A | 9/2000 | Sugishima |
| 5,679,431 A | 10/1997 | Chen ...................... 428/65.3 | | 6,124,044 A | 9/2000 | Swidler ...................... 428/500 |
| 5,679,978 A | 10/1997 | Kawahara | | 6,139,803 A | 10/2000 | Watanabe |
| 5,683,560 A | 11/1997 | Szczyrbowski ......... 204/298.23 | | 6,139,968 A | 10/2000 | Knapp |
| 5,683,561 A | 11/1997 | Hollars ................ 204/298 | | 6,153,067 A | 11/2000 | Maishev |
| 5,686,372 A | 11/1997 | Langford | | 6,154,311 A | 11/2000 | Simmons, Jr. |
| 5,698,262 A | 12/1997 | Soubeyrand ................ 427/255.3 | | 6,156,171 A | 12/2000 | Hollars ................ 204/298.25 |
| 5,715,103 A | 2/1998 | Amano | | 6,156,409 A | 12/2000 | Doushita |
| 5,719,705 A | 2/1998 | Machol ...................... 359/581 | | 6,165,256 A | 12/2000 | Hayakawa |
| 5,723,172 A | 3/1998 | Sherman ...................... 427/109 | | 6,165,598 A | 12/2000 | Nelson ...................... 428/212 |
| 5,724,187 A | 3/1998 | Varaprasad .................... 359/608 | | 6,165,616 A | 12/2000 | Lemelson ...................... 428/408 |
| 5,725,746 A | 3/1998 | Dickey ................ 204/298.21 | | 6,171,659 B1 | 1/2001 | Vanden Brande ............ 427/523 |
| 5,733,660 A | 3/1998 | Makita ...................... 428/426 | | 6,179,971 B1 | 1/2001 | Kittrell |
| 5,733,669 A | 3/1998 | Veyhl ...................... 428/698 | | 6,179,972 B1 | 1/2001 | Kittrell |
| 5,744,215 A | 4/1998 | Neuman | | 6,191,062 B1 | 2/2001 | Hayakawa ................ 502/159 |
| 5,745,291 A | 4/1998 | Jenkinson .................... 359/586 | | 6,193,378 B1 | 2/2001 | Tonar |
| 5,750,265 A | 5/1998 | Goodman .................... 428/432 | | 6,193,856 B1 | 2/2001 | Kida |
| 5,755,867 A | 5/1998 | Chikuni ................ 106/287.16 | | 6,194,346 B1 | 2/2001 | Tada |
| 5,762,674 A | 6/1998 | Maltby, Jr. .................... 65/60.1 | | 6,197,101 B1 | 3/2001 | Matsumura ............ 106/287.11 |
| 5,763,087 A | 6/1998 | Falabella .................... 428/408 | | 6,210,750 B1 | 4/2001 | Cho ...................... 427/190 |
| 5,780,119 A | 7/1998 | Dearnaley .................... 427/528 | | 6,210,779 B1 | 4/2001 | Watanabe ...................... 428/208 |
| 5,780,149 A | 7/1998 | McCurdy | | 6,228,480 B1 | 5/2001 | Kimura |
| 5,780,380 A | 7/1998 | Endoh | | 6,228,502 B1 | 5/2001 | Saitoh |
| 5,789,040 A | 8/1998 | Martinu ...................... 427/575 | | 6,238,738 B1 | 5/2001 | McCurdy |
| 5,811,191 A | 9/1998 | Neuman | | 6,242,752 B1 | 6/2001 | Soma |
| 5,812,405 A | 9/1998 | Meredith, Jr. | | 6,248,397 B1 | 6/2001 | Ye |
| 5,814,195 A | 9/1998 | Lehan ................ 204/192.12 | | 6,261,693 B1 | 7/2001 | Veerasamy ...................... 428/408 |
| 5,814,196 A | 9/1998 | Hollars ................ 204/298.15 | | 6,270,633 B1 | 8/2001 | Onaka ...................... 204/192.12 |
| 5,820,994 A | 10/1998 | Gotoh ...................... 428/451 | | 6,274,244 B1 | 8/2001 | Finley |
| 5,827,490 A | 10/1998 | Jones | | 6,299,981 B1 | 10/2001 | Azzopardi |
| 5,830,252 A | 11/1998 | Finley | | 6,319,326 B1 | 11/2001 | Koh |
| 5,830,327 A | 11/1998 | Kolenkow ................ 204/192.12 | | 6,326,079 B1 | 12/2001 | Philippe |
| 5,830,332 A | 11/1998 | Babich ................ 204/192.15 | | 6,329,060 B1 | 12/2001 | Barkac |
| 5,846,613 A | 12/1998 | Neuville .................... 427/575 | | 6,329,925 B1 | 12/2001 | Skiver ...................... 340/815.4 |
| 5,849,200 A | 12/1998 | Heller ...................... 210/748 | | 6,333,084 B1 | 12/2001 | Woodard ...................... 428/34 |
| 5,854,169 A | 12/1998 | Heller | | 6,334,938 B2 | 1/2002 | Kida |
| 5,854,708 A | 12/1998 | Komatsu | | 6,335,479 B1 | 1/2002 | Yamada |
| 5,863,398 A | 1/1999 | Kardokus | | 6,336,998 B1 | 1/2002 | Wang |
| 5,866,199 A | 2/1999 | Swidler ...................... 427/154 | | 6,337,124 B1 | 1/2002 | Anderson |
| 5,866,260 A | 2/1999 | Adams, Jr. .................... 428/426 | | 6,346,174 B1 | 2/2002 | Finley |
| 5,869,187 A | 2/1999 | Nakamura | | 6,350,397 B1 | 2/2002 | Heikkila ...................... 264/39 |
| 5,869,808 A | 2/1999 | Hyllberg .................... 219/216 | | 6,352,755 B1 | 3/2002 | Finley |
| 5,871,843 A | 2/1999 | Yoneda | | 6,354,109 B1 | 3/2002 | Boire ...................... 65/60.1 |
| 5,873,203 A | 2/1999 | Thiel | | 6,362,121 B1 | 3/2002 | Chopin |
| 5,874,701 A | 2/1999 | Watanabe | | 6,365,010 B1 | 4/2002 | Hollars ................ 204/192.12 |
| 5,877,391 A | 3/1999 | Kanno | | 6,365,014 B2 | 4/2002 | Finley |
| 5,888,593 A | 3/1999 | Petrmichl ...................... 427/563 | | 6,368,664 B1 | 4/2002 | Veerasamy |

| Patent | Date | Name | Ref |
|---|---|---|---|
| 6,368,668 B1 | 4/2002 | Kobayashi | |
| 6,379,746 B1 | 4/2002 | Birch | 427/154 |
| 6,379,764 B1 | 4/2002 | Pusateri | 428/40.1 |
| 6,379,776 B1 | 4/2002 | Tada | |
| 6,387,844 B1 | 5/2002 | Fujishima | |
| 6,403,686 B1 | 6/2002 | Pickett et al. | 524/431 |
| 6,413,581 B1 | 7/2002 | Greenberg | |
| 6,413,604 B1 | 7/2002 | Matthews | 428/40.1 |
| 6,414,213 B2 | 7/2002 | Ohmori | |
| 6,419,800 B2* | 7/2002 | Anzaki et al. | 204/192.12 |
| 6,425,670 B1 | 7/2002 | Komatsu | |
| 6,428,172 B1 | 8/2002 | Hutzel | 359/838 |
| 6,436,542 B1 | 8/2002 | Ogino | |
| 6,440,278 B1 | 8/2002 | Kida | |
| 6,447,123 B2 | 9/2002 | Tonar | 359/604 |
| 6,451,178 B2 | 9/2002 | Szczyrbowski | 204/192.13 |
| 6,461,686 B1 | 10/2002 | Vanderstraeten | |
| 6,464,951 B1 | 10/2002 | Kittrell | |
| 6,465,088 B1 | 10/2002 | Talpaert | |
| 6,468,402 B1 | 10/2002 | Vanderstraeten | |
| 6,468,403 B1 | 10/2002 | Shimizu | |
| 6,468,428 B1 | 10/2002 | Nishii | |
| 6,488,824 B1 | 12/2002 | Hollars | 204/192.22 |
| 6,500,690 B1 | 12/2002 | Yamagishi | 438/57 |
| 6,501,387 B2 | 12/2002 | Skiver | 340/815.4 |
| 6,511,587 B2 | 1/2003 | Vanderstraeten | |
| 6,570,709 B2 | 5/2003 | Katayama | |
| 6,576,344 B1 | 6/2003 | Doushita | |
| 6,582,839 B1 | 6/2003 | Yamamoto | |
| 6,596,664 B2 | 7/2003 | Kittrell | |
| 6,635,155 B2 | 10/2003 | Miyamura | |
| 6,660,365 B1 | 12/2003 | Krisko | 428/149 |
| 6,673,738 B2 | 1/2004 | Ueda | |
| 6,677,063 B2 | 1/2004 | Finley | |
| 6,679,978 B2 | 1/2004 | Johnson | |
| 6,680,135 B2 | 1/2004 | Boire | |
| 6,682,773 B2 | 1/2004 | Medwick | 427/154 |
| 6,716,323 B1 | 4/2004 | Siddle | |
| 6,720,066 B2 | 4/2004 | Talpaert | |
| 6,722,159 B2 | 4/2004 | Greenberg | |
| 6,730,630 B2 | 5/2004 | Okusako | |
| 6,733,889 B2 | 5/2004 | Varanasi | |
| 6,743,343 B2 | 6/2004 | Kida | |
| 6,743,749 B2 | 6/2004 | Morikawa | |
| 6,761,984 B2 | 7/2004 | Anzaki | |
| 6,770,321 B2 | 8/2004 | Hukari | |
| 6,777,030 B2 | 8/2004 | Veerasamy | |
| 6,777,091 B2 | 8/2004 | Kijima | 428/428 |
| 6,781,738 B2 | 8/2004 | Kikuchi | |
| 6,787,199 B2 | 9/2004 | Anpo | |
| 6,789,906 B2 | 9/2004 | Tonar | |
| 6,794,065 B1 | 9/2004 | Morikawa | |
| 6,800,182 B2 | 10/2004 | Mitsui | |
| 6,800,183 B2 | 10/2004 | Takahashi | 204/298.28 |
| 6,800,354 B2 | 10/2004 | Baumann | |
| 6,804,048 B2 | 10/2004 | MacQuart | |
| 6,811,856 B2 | 11/2004 | Nun | |
| 6,818,309 B1 | 11/2004 | Talpaert | |
| 6,829,084 B2 | 12/2004 | Takaki | |
| 6,830,785 B1 | 12/2004 | Hayakawa | |
| 6,833,089 B1 | 12/2004 | Kawahara | |
| 6,835,688 B2 | 12/2004 | Morikawa | |
| 6,840,061 B1 | 1/2005 | Hurst | |
| 6,846,556 B2 | 1/2005 | Boire | |
| 6,869,644 B2 | 3/2005 | Buhay | |
| 6,870,657 B1 | 3/2005 | Fitzmaurice | |
| 6,872,441 B2 | 3/2005 | Baumann | |
| 6,875,319 B2 | 4/2005 | Nadaud | |
| 6,878,242 B2 | 4/2005 | Wang | |
| 6,878,450 B2 | 4/2005 | Anpo | |
| 6,881,701 B2 | 4/2005 | Jacobs | |
| 6,890,656 B2 | 5/2005 | Iacovangelo | |
| 6,908,698 B2 | 6/2005 | Yoshida | |
| 6,908,881 B1 | 6/2005 | Sugihara | |
| 6,916,542 B2 | 7/2005 | Buhay | |
| 6,921,579 B2 | 7/2005 | O'Shaughnessy | 428/432 |
| 6,929,862 B2 | 8/2005 | Hurst | |
| 6,939,611 B2 | 9/2005 | Fujishima | |
| 6,952,299 B1 | 10/2005 | Fukazawa | |
| 6,954,240 B2 | 10/2005 | Hamamoto | |
| 6,962,759 B2 | 11/2005 | Buhay | |
| 6,964,731 B1 | 11/2005 | Krisko | |
| 6,974,629 B1 | 12/2005 | Krisko et al. | 428/432 |
| 6,997,570 B2 | 2/2006 | Nakaho | |
| 7,005,188 B2 | 2/2006 | Anderson | |
| 7,005,189 B1 | 2/2006 | Tachibana | |
| 7,011,691 B2 | 3/2006 | Abe | |
| 7,022,416 B2 | 4/2006 | Teranishi | |
| 7,049,002 B2 | 5/2006 | Greenberg | |
| 7,052,585 B2 | 5/2006 | Veerasamy | |
| 7,060,643 B2 | 6/2006 | Sanbayashi | |
| 7,096,692 B2 | 8/2006 | Greenberg | |
| 7,118,936 B2 | 10/2006 | Kobayashi | |
| 7,138,181 B2 | 11/2006 | McCurdy | |
| 7,157,840 B2 | 1/2007 | Fujishima | |
| 7,175,911 B2 | 2/2007 | Zhou | |
| 7,179,527 B2 | 2/2007 | Sato | |
| 7,195,821 B2 | 3/2007 | Tixhon | |
| 7,198,699 B2 | 4/2007 | Thomsen | |
| 7,211,513 B2 | 5/2007 | Remington, Jr. | |
| 7,211,543 B2 | 5/2007 | Nakabayashi | |
| 7,223,523 B2 | 5/2007 | Boykin | |
| 7,232,615 B2 | 6/2007 | Buhay | |
| 7,255,831 B2 | 8/2007 | Wei | |
| 7,261,942 B2 | 8/2007 | Andrews | |
| 7,264,741 B2 | 9/2007 | Hartig | |
| 7,294,365 B2 | 11/2007 | Hayakawa | |
| 7,294,404 B2 | 11/2007 | Krisko | |
| 7,300,634 B2 | 11/2007 | Yaniv | |
| 7,309,405 B2 | 12/2007 | Cho | |
| 7,309,664 B1 | 12/2007 | Marzolin | |
| 7,311,961 B2 | 12/2007 | Finley | |
| 7,320,827 B2 | 1/2008 | Fujisawa | |
| 7,323,249 B2 | 1/2008 | Athey | |
| 7,348,054 B2 | 3/2008 | Jacquiod | |
| 7,354,624 B2 | 4/2008 | Millero | |
| 7,361,963 B2 | 4/2008 | Ikadai | |
| 7,387,839 B2 | 6/2008 | Gueneau | |
| 7,534,466 B2 | 5/2009 | Hartig | 427/166 |
| 7,604,865 B2 | 10/2009 | Krisko | 428/432 |
| 7,713,632 B2 | 5/2010 | Krisko | 428/432 |
| 2001/0007715 A1 | 7/2001 | Toyoshima | 428/426 |
| 2001/0016262 A1 | 8/2001 | Toyoshima | 204/192.12 |
| 2001/0030808 A1 | 10/2001 | Komatsu | |
| 2002/0012779 A1 | 1/2002 | Miyashita | |
| 2002/0014634 A1 | 2/2002 | Koyama | 257/192 |
| 2002/0016250 A1 | 2/2002 | Hayakawa | |
| 2002/0028361 A1 | 3/2002 | Boire | |
| 2002/0045073 A1 | 4/2002 | Finley | 428/701 |
| 2002/0046945 A1 | 4/2002 | Hosokawa | 204/192.12 |
| 2002/0071956 A1 | 6/2002 | Boire | |
| 2002/0102352 A1 | 8/2002 | Hartig | 428/216 |
| 2002/0110638 A1 | 8/2002 | Boire | |
| 2002/0119307 A1 | 8/2002 | Boire | |
| 2002/0155265 A1 | 10/2002 | Choi | 428/212 |
| 2002/0155299 A1 | 10/2002 | Harris | 428/428 |
| 2002/0172775 A1 | 11/2002 | Buhay | |
| 2003/0038028 A1 | 2/2003 | Schultheis | |
| 2003/0039843 A1 | 2/2003 | Johnson | |
| 2003/0043464 A1 | 3/2003 | Dannenberg | 359/585 |
| 2003/0048538 A1 | 3/2003 | Tonar | 359/604 |
| 2003/0054177 A1 | 3/2003 | Jin | |
| 2003/0064231 A1 | 4/2003 | Hurst | 428/432 |
| 2003/0096701 A1 | 5/2003 | Fujishima | |
| 2003/0143437 A1 | 7/2003 | Ohtsu | |
| 2003/0152780 A1 | 8/2003 | Baumann | |
| 2003/0180547 A1 | 9/2003 | Buhay | |
| 2003/0186089 A1 | 10/2003 | Kikuchi | |
| 2003/0207028 A1 | 11/2003 | Boire | |
| 2003/0215647 A1 | 11/2003 | Yoshida | |
| 2003/0224620 A1 | 12/2003 | Kools | |
| 2003/0235695 A1 | 12/2003 | Greenberg | 428/432 |
| 2003/0235720 A1 | 12/2003 | Athey | |
| 2004/0005466 A1 | 1/2004 | Arai | |
| 2004/0009356 A1 | 1/2004 | Medwick | |
| 2004/0020761 A1 | 2/2004 | Thomsen | 204/192.12 |
| 2004/0032655 A1 | 2/2004 | Kikuchi | 359/444 |
| 2004/0043260 A1 | 3/2004 | Nadaud | |

| | | | | | | |
|---|---|---|---|---|---|---|
| 2004/0063320 A1 | 4/2004 | Hollars ..................... 438/689 | | 2006/0196765 A1 | 9/2006 | Cheng |
| 2004/0069623 A1 | 4/2004 | Vanderstraeten | | 2006/0201203 A1 | 9/2006 | Labrousse |
| 2004/0115362 A1 | 6/2004 | Hartig | | 2006/0210783 A1 | 9/2006 | Seder |
| 2004/0140198 A1 | 7/2004 | Cho | | 2006/0210810 A1 | 9/2006 | Harris |
| 2004/0146721 A1 | 7/2004 | Hartig ..................... 428/216 | | 2006/0225999 A1 | 10/2006 | Fukawa |
| 2004/0149307 A1 | 8/2004 | Hartig | | 2006/0228476 A1 | 10/2006 | McCurdy |
| 2004/0163945 A1 | 8/2004 | Hartig ..................... 427/571 | | 2006/0234064 A1 | 10/2006 | Baubet |
| 2004/0179978 A1 | 9/2004 | Kobayashi | | 2006/0247125 A1 | 11/2006 | Choi |
| 2004/0180216 A1 | 9/2004 | Veerasamy | | 2006/0263610 A1 | 11/2006 | Greenberg |
| 2004/0180220 A1 | 9/2004 | Gueneau | | 2006/0275612 A1 | 12/2006 | Baubet |
| 2004/0196580 A1 | 10/2004 | Nakaho | | 2007/0025000 A1 | 2/2007 | Lin |
| 2004/0202890 A1 | 10/2004 | Kutilek | | 2007/0029187 A1 | 2/2007 | Krasnov |
| 2004/0206024 A1 | 10/2004 | Graf | | 2007/0029527 A1 | 2/2007 | Mills |
| 2004/0214010 A1 | 10/2004 | Murata | | 2007/0030569 A1 | 2/2007 | Lu |
| 2004/0216487 A1 | 11/2004 | Boire | | 2007/0031593 A1 | 2/2007 | Krasnov |
| 2004/0219348 A1 | 11/2004 | Jacquiod | | 2007/0031681 A1 | 2/2007 | Anzaki |
| 2004/0241040 A1 | 12/2004 | Wei | | 2007/0031682 A1 | 2/2007 | Krasnov |
| 2004/0241490 A1 | 12/2004 | Finley | | 2007/0042893 A1 | 2/2007 | Koike |
| 2004/0247901 A1 * | 12/2004 | Suzuki et al. ................. 428/451 | | 2007/0065670 A1 | 3/2007 | Varaprasad |
| 2004/0248725 A1 | 12/2004 | Hiraoka | | 2007/0077406 A1 | 4/2007 | Jacobs |
| 2004/0253382 A1 | 12/2004 | De Bosscher | | 2007/0087187 A1 | 4/2007 | Lu |
| 2004/0253471 A1 | 12/2004 | Thiel | | 2007/0092734 A1 | 4/2007 | Durandeau |
| 2005/0003672 A1 | 1/2005 | Kools | | 2007/0108043 A1 | 5/2007 | Lu |
| 2005/0016835 A1 | 1/2005 | Krisko | | 2007/0109543 A1 | 5/2007 | Hoffman |
| 2005/0019505 A1 | 1/2005 | Hamamoto | | 2007/0111012 A1 | 5/2007 | Rimmer |
| 2005/0019700 A1 | 1/2005 | Hayakawa | | 2007/0116966 A1 | 5/2007 | Mellott |
| 2005/0020444 A1 | 1/2005 | Hiraoka | | 2007/0116967 A1 | 5/2007 | Medwick |
| 2005/0025982 A1 | 2/2005 | Krisko | | 2007/0129248 A1 | 6/2007 | Labrousse |
| 2005/0031876 A1 | 2/2005 | Lu | | 2007/0134501 A1 | 6/2007 | McMaster |
| 2005/0042375 A1 | 2/2005 | Minami | | 2007/0137673 A1 | 6/2007 | Boykin |
| 2005/0044894 A1 | 3/2005 | Nelson | | 2007/0148064 A1 | 6/2007 | Labrousse |
| 2005/0051422 A1 | 3/2005 | Rietzel | | 2007/0184291 A1 | 8/2007 | Harris |
| 2005/0084688 A1 | 4/2005 | Garrec | | 2007/0196563 A1 | 8/2007 | Wuwen |
| 2005/0106397 A1 | 5/2005 | Krisko ..................... 428/432 | | 2007/0218264 A1 | 9/2007 | Gueneau |
| 2005/0137084 A1 | 6/2005 | Krisko | | 2007/0218265 A1 | 9/2007 | Harris |
| 2005/0191505 A1 | 9/2005 | Akarsu | | 2007/0218311 A1 | 9/2007 | O'Shaughnessy |
| 2005/0191522 A1 | 9/2005 | Anzaki | | 2007/0224357 A1 | 9/2007 | Buhay |
| 2005/0221098 A1 | 10/2005 | Azzopardi | | 2007/0231501 A1 | 10/2007 | Finley |
| 2005/0227008 A1 | 10/2005 | Okada | | 2007/0237968 A1 | 10/2007 | Kijima |
| 2005/0233893 A1 | 10/2005 | Sakatani | | 2007/0254163 A1 | 11/2007 | Veerasamy |
| 2005/0233899 A1 | 10/2005 | Anzaki | | 2007/0254164 A1 | 11/2007 | Veerasamy |
| 2005/0238861 A1 | 10/2005 | Buhay | | 2007/0264494 A1 | 11/2007 | Krisko ..................... 428/701 |
| 2005/0244678 A1 | 11/2005 | Arfsten ..................... 427/162 | | 2007/0275252 A1 | 11/2007 | Krasnov |
| 2005/0245182 A1 | 11/2005 | Iwahashi | | 2007/0275253 A1 | 11/2007 | Thiel |
| 2005/0245383 A1 | 11/2005 | Iwahashi | | 2008/0011408 A1 | 1/2008 | Maschwitz |
| 2005/0247555 A1 | 11/2005 | Thiel | | 2008/0014349 A1 | 1/2008 | Otani |
| 2005/0248824 A1 * | 11/2005 | Fukazawa et al. ............ 359/265 | | 2008/0026161 A1 | 1/2008 | Frings |
| 2005/0252108 A1 | 11/2005 | Sanderson | | 2008/0115471 A1 | 5/2008 | Labrousse |
| 2005/0258030 A1 | 11/2005 | Finley | | 2008/0119352 A1 | 5/2008 | Kitaguchi |
| 2005/0266248 A1 | 12/2005 | Millero | | 2008/0124460 A1 | 5/2008 | Athey |
| 2005/0272590 A1 | 12/2005 | Iwahashi | | 2008/0188370 A1 | 8/2008 | Vormberg |
| 2006/0003545 A1 | 1/2006 | Veerasamy | | | | |
| 2006/0011945 A1 | 1/2006 | Spitzer-Keller | | FOREIGN PATENT DOCUMENTS | | |
| 2006/0014027 A1 | 1/2006 | Oudard | | DE | 43 13 284 | 10/1994 |
| 2006/0014050 A1 | 1/2006 | Gueneau | | DE | 19736925 | 3/1998 |
| 2006/0019104 A1 | 1/2006 | Hurst | | DE | 19644752 | 4/1998 |
| 2006/0029813 A1 | 2/2006 | Kutilek | | DE | 19831610 | 1/1999 |
| 2006/0031681 A1 | 2/2006 | Smith | | DE | 10100221 | 7/2001 |
| 2006/0032739 A1 | 2/2006 | Ikeda | | DE | 10100223 | 7/2001 |
| 2006/0051597 A1 | 3/2006 | Anzaki | | EP | 0 207 646 | 1/1987 |
| 2006/0055513 A1 | 3/2006 | French | | EP | 0285130 | 10/1988 |
| 2006/0057298 A1 | 3/2006 | Krisko | | EP | 0 470 379 A | 2/1992 |
| 2006/0057401 A1 | 3/2006 | Krisko | | EP | 0 279 550 | 4/1993 |
| 2006/0070869 A1 | 4/2006 | Krisko | | EP | 0574119 | 4/1993 |
| 2006/0090996 A1 | 5/2006 | Yaniv | | EP | 0345045 | 10/1993 |
| 2006/0102465 A1 | 5/2006 | Blondeel | | EP | 0 369 581 B | 12/1993 |
| 2006/0105103 A1 | 5/2006 | Hartig ..................... 427/166 | | EP | 0 590 477 | 4/1994 |
| 2006/0107599 A1 | 5/2006 | Luten | | EP | 0 601 928 | 6/1994 |
| 2006/0110605 A1 | 5/2006 | Luten | | EP | 0 611 733 | 8/1994 |
| 2006/0118406 A1 | 6/2006 | Delahoy | | EP | 0 515 847 B1 | 2/1995 |
| 2006/0121315 A1 | 6/2006 | Myli | | EP | 0 636 702 | 2/1995 |
| 2006/0127604 A1 | 6/2006 | Ikadai | | EP | 0 637 572 | 2/1995 |
| 2006/0134322 A1 | 6/2006 | Harris | | EP | 0 639 655 | 2/1995 |
| 2006/0134436 A1 | 6/2006 | Maschwitz | | EP | 0 657 562 | 6/1995 |
| 2006/0141290 A1 | 6/2006 | Sheel | | EP | 0 689 096 A | 12/1995 |
| 2006/0152832 A1 | 7/2006 | Aumercier | | EP | 0 689 962 A | 1/1996 |
| 2006/0159906 A1 | 7/2006 | Messere | | EP | 0 737 513 | 10/1996 |
| 2006/0165996 A1 | 7/2006 | Veerasamy | | EP | 0 328 257 A | 4/1997 |
| 2006/0194066 A1 | 8/2006 | Ye | | EP | 0 787 696 | 8/1997 |

| | | | | | | |
|---|---|---|---|---|---|---|
| EP | 0 820 967 A | 1/1998 | | WO | WO 87/06626 | 11/1987 |
| EP | 0 771 766 | 9/1998 | | WO | WO 89/10430 | 11/1989 |
| EP | 0 870 530 | 10/1998 | | WO | WO 92/17621 A | 10/1992 |
| EP | 0 753 882 | 11/1998 | | WO | WO 96/25534 | 8/1996 |
| EP | 0 884 288 | 12/1998 | | WO | WO 97/03763 | 2/1997 |
| EP | 0 799 255 | 2/1999 | | WO | WO 97/07066 | 2/1997 |
| EP | 0901991 | 3/1999 | | WO | WO9707069 | 2/1997 |
| EP | 0 838 535 | 2/2000 | | WO | WO 97/08359 | 3/1997 |
| EP | 0 850 203 | 1/2001 | | WO | WO 97/10185 | 3/1997 |
| EP | 1066878 | 1/2001 | | WO | WO 97/10186 | 3/1997 |
| EP | 1074525 | 2/2001 | | WO | WO 97/11916 | 4/1997 |
| EP | 0 850 204 | 12/2001 | | WO | WO 97/15499 | 5/1997 |
| EP | 1 179 515 | 2/2002 | | WO | WO 97/25201 | 7/1997 |
| EP | 0 944 557 | 11/2002 | | WO | WO97/37801 | 10/1997 |
| EP | 1 254 870 | 11/2002 | | WO | WO 97/37946 | 10/1997 |
| EP | 0 887 104 | 11/2003 | | WO | WO 97/42351 | 11/1997 |
| EP | 1 046 727 | 11/2003 | | WO | WO 97/42357 | 11/1997 |
| EP | 1 375 444 | 1/2004 | | WO | WO9806675 | 2/1998 |
| EP | 1 411 386 | 4/2004 | | WO | WO 98/23549 | 6/1998 |
| EP | 1 466 665 A | 10/2004 | | WO | WO 98/25700 | 6/1998 |
| EP | 1 500 634 | 1/2005 | | WO | WO9911896 | 3/1999 |
| EP | 1 640 149 | 3/2006 | | WO | WO 00/13257 | 3/2000 |
| EP | 0816466 | 5/2006 | | WO | WO0015571 | 3/2000 |
| EP | 1506143 | 5/2006 | | WO | WO0027771 | 5/2000 |
| FR | 2699164 | 2/1995 | | WO | WO 00/37376 | 6/2000 |
| FR | 2738812 | 3/1997 | | WO | WO 00/37377 | 6/2000 |
| FR | 2738813 | 3/1997 | | WO | WO0040402 | 7/2000 |
| FR | 2738836 | 3/1997 | | WO | WO 00/50354 | 8/2000 |
| FR | 2800731 | 5/2001 | | WO | WO 00/75083 | 12/2000 |
| FR | 2814094 | 3/2002 | | WO | WO0075087 | 12/2000 |
| FR | 2838734 | 10/2003 | | WO | WO 01/02496 | 1/2001 |
| FR | 2838735 | 10/2003 | | WO | WO9944954 | 4/2001 |
| FR | 2857885 | 1/2005 | | WO | WO 01/32578 | 5/2001 |
| FR | 2861385 | 4/2005 | | WO | WO01/68786 | 9/2001 |
| FR | 2861386 | 4/2005 | | WO | WO 01/71055 | 9/2001 |
| FR | 2869897 | 11/2005 | | WO | WO 03/12540 | 2/2002 |
| FR | 2884147 | 10/2006 | | WO | 02/24333 | 3/2002 |
| GB | 0232680 | 4/1925 | | WO | WO 02/24971 | 3/2002 |
| GB | 1231280 | 5/1971 | | WO | WO0240417 | 5/2002 |
| GB | 1426906 | 3/1976 | | WO | WO0249980 | 6/2002 |
| GB | 1438462 | 6/1976 | | WO | WO02085809 | 10/2002 |
| GB | 2028376 | 3/1980 | | WO | WO03006393 | 1/2003 |
| GB | 1595061 | 8/1981 | | WO | WO03009061 | 1/2003 |
| GB | 2201428 | 2/1988 | | WO | WO03050056 | 6/2003 |
| GB | 2302102 | 1/1997 | | WO | WO 03/053577 | 7/2003 |
| GB | 2316687 | 8/1997 | | WO | WO03062166 | 7/2003 |
| GB | 2327428 | 7/1998 | | WO | WO03068500 | 8/2003 |
| JP | 57-140339 A | 8/1982 | | WO | WO03072849 | 9/2003 |
| JP | 60-081048 A | 5/1985 | | WO | WO 03/080530 | 10/2003 |
| JP | 61-091042 A | 5/1986 | | WO | WO03087002 | 10/2003 |
| JP | 62-161945 A | 7/1987 | | WO | WO03087005 | 10/2003 |
| JP | 01-014129 A | 1/1989 | | WO | WO 03/095695 | 11/2003 |
| JP | 01-118807 A | 5/1989 | | WO | WO03091471 | 11/2003 |
| JP | 3-122274 A | 5/1991 | | WO | WO03093188 | 11/2003 |
| JP | 3-187039 A | 8/1991 | | WO | WO03095385 | 11/2003 |
| JP | 3-193872 A | 8/1991 | | WO | WO03097549 | 11/2003 |
| JP | 7-149545 A | 6/1995 | | WO | WO 03/106732 | 12/2003 |
| JP | 7-215074 A | 8/1995 | | WO | WO2004013376 | 2/2004 |
| JP | 7-233469 A | 9/1995 | | WO | WO2004034105 | 4/2004 |
| JP | 7-508491 A | 9/1995 | | WO | WO2004061151 | 7/2004 |
| JP | 7-315874 A | 12/1995 | | WO | WO 2004/067464 | 8/2004 |
| JP | 7-315889 A | 12/1995 | | WO | WO2004085699 | 10/2004 |
| JP | 8-011631 A | 1/1996 | | WO | WO2004085701 | 10/2004 |
| JP | 8-012378 A | 1/1996 | | WO | WO2004086104 | 10/2004 |
| JP | 8-109043 A | 4/1996 | | WO | WO2004087985 | 10/2004 |
| JP | 8-134638 A | 5/1996 | | WO | WO2004089836 | 10/2004 |
| JP | 8-227006 A | 9/1996 | | WO | WO2004089838 | 10/2004 |
| JP | 9-189801 A | 7/1997 | | WO | WO2004089839 | 10/2004 |
| JP | 9-202651 A | 8/1997 | | WO | WO2004092088 | 10/2004 |
| JP | 9-249967 A | 9/1997 | | WO | WO2004092089 | 10/2004 |
| JP | 10-36144 A | 2/1998 | | WO | WO2004097063 | 11/2004 |
| JP | 10-048805 A | 2/1998 | | WO | WO2004108618 | 12/2004 |
| JP | 10-278165 | 10/1998 | | WO | WO2004108619 | 12/2004 |
| JP | 11-095014 A | 4/1999 | | WO | WO2004108846 | 12/2004 |
| JP | 11-302038 | 11/1999 | | WO | WO2004113064 | 12/2004 |
| JP | 2000094569 | 4/2000 | | WO | WO2005000758 | 1/2005 |
| JP | 2003-311157 * | 11/2003 | | WO | WO2005000759 | 1/2005 |
| JP | 2005-213585 | 8/2005 | | WO | WO2005005337 | 1/2005 |
| JP | 2006305527 | 11/2006 | | WO | WO2005007286 | 1/2005 |

| | | |
|---|---|---|
| WO | WO2005009914 | 2/2005 |
| WO | WO2005012593 | 2/2005 |
| WO | WO2005023723 | 3/2005 |
| WO | WO 2005/040058 | 5/2005 |
| WO | WO2005040056 | 5/2005 |
| WO | WO 2005/063646 | 7/2005 |
| WO | WO 2005/102953 | 11/2005 |
| WO | WO2005102952 | 11/2005 |
| WO | WO2005110937 | 11/2005 |
| WO | WO2005111257 | 11/2005 |
| WO | WO2006004169 | 1/2006 |
| WO | WO2006007062 | 1/2006 |
| WO | WO 2006/017311 | 2/2006 |
| WO | WO 2006/017349 | 2/2006 |
| WO | WO2006019995 | 2/2006 |
| WO | WO2006020477 | 2/2006 |
| WO | WO2006028729 | 3/2006 |
| WO | WO 2006/036605 | 4/2006 |
| WO | WO2006054954 | 5/2006 |
| WO | WO2006055513 | 5/2006 |
| WO | WO2006057830 | 6/2006 |
| WO | WO2006062902 | 6/2006 |
| WO | WO2006064059 | 6/2006 |
| WO | WO2006064060 | 6/2006 |
| WO | WO2006066101 | 6/2006 |
| WO | WO2006077839 | 7/2006 |
| WO | WO2006089964 | 8/2006 |
| WO | WO2006101994 | 9/2006 |
| WO | WO2006108985 | 10/2006 |
| WO | WO2006117345 | 11/2006 |
| WO | WO2006134335 | 12/2006 |
| WO | WO2007016127 | 2/2007 |
| WO | WO2007018974 | 2/2007 |
| WO | WO2007018975 | 2/2007 |
| WO | WO2007045805 | 4/2007 |
| WO | WO2007080428 | 7/2007 |
| WO | WO2007092511 | 8/2007 |
| WO | WO2007093823 | 8/2007 |
| WO | WO2007096461 | 8/2007 |
| WO | WO2007110482 | 10/2007 |
| WO | WO2007121211 | 10/2007 |
| WO | WO2007121215 | 10/2007 |
| WO | WO2007127060 | 11/2007 |
| WO | WO2007130140 | 11/2007 |

OTHER PUBLICATIONS

C. Ang et al., "Deposition of high stability thin film ternary alloy resistors by sputtering," in: International conf. on Vacuum Metallurgy, $4^{th}$, Tokyo, Japan Jun. 4-8, 1973.

J.M. Bell et al., "Electrochromism in sol-gel deposited $TiO_2$ films," Proceedings SPIE—The International Society for Optical Engineering, vol. 2255, Apr. 18-22, 1994.

T. Brat et al., "The Influence of Tungsten-10Wt% Titanium Sputtering Target Purity and Density on VLSI Applications," 2nd ASM International™ Electronic Materials and Processing Congress (Apr. 24-28, 1989, Philadelphia, PA).

J.R. Creighton, "Non-Selective Tungsten CVD Using Tungsten Hezxacarbonyl," Sandia National Laboratories, Albuquerque, NM, 1987.

N. de Tacconi et al., "Nanoporous $TiO_2$ and $WO_3$ Films by Anodization of Titanium and Tungsten Substrates: Influence of process Variables on Morphology and Photoelectrochemical Response," J. Phys. Chem B 2006, 110, pp. 25347-25355.

D. Diesburg et al., "Low Mobile Ion Contamination From Sputtered High Purity Tungsten," 12th International Plansee Seminar, 1973, 1989, pp. 371-378.

A. Enesca et al., "Novel Approach of $TiO_2/WO_3$ for Water Splitting," $20^{th}$ European photovoltaic Solar Energy Conference, Jun. 6-10, 2005, pp. 262-265.

B. Gao et al., "Great Enhancement of Photocatalytic Activity of Nitrogen-Doped Titania by Coupling with Tungsten Ozxide," J. Phys. Chem B 2006, 110, pp. 14391-14397.

J. Göttsche et al., "Electrochromic mixed $Wo_3$—$TiO_2$ thin films produced by sputtering and the sol-gel technique: a comparison," Solar Energy Materials and Solar Cells 31 (1993) pp. 415-428.

M. Gusev et al., "Sputtering of tungsten, tungsten oxide, and tungsten—carbon mixed layers by deuterium ions in the threshold energy region," Tech Phys. 44 (9), Sep. 1999, pp. 1123-1127.

F. Hamelmann et al., "Metal oxide/silicon oxide multilayer with smooth interfaces produced by in situ controlled plasma-enhanced MOCVD," Thin Solid Films 358 (2000), pp. 90-93.

S. Hashimoto et al., "Lifetime of Electrochromism of Amorphous$WO_3$—$TiO_2$ thin Films," J. Electrochem. Soc., vol. 138, No. 8, Aug. 1991, pp. 2403-2408.

J. Herrera et al., "Synthesis, characterization, and catalytic function of novel highly dispersed tungsten oxide catalysts on mesoporous silica," J. Catalysis 239 (2006), pp. 200-211.

S. Higashimoto et al., "Photoelectrochemical properties of hybrid $WO_3/TiO_2$ electrode. Effect of structures of $WO_3$ on charge separation," Thin Solid Films 503 (2006), pp. 201-206.

A. Hodgson et al., "Photocatalytic Reactor Systems with Tungsten Oxide-Modified Titanium Dioxide for Indoor Air Applications," $11^{th}$ Conference on $TiO_2$ Photocatalysis: fundamentals & Applications (Sep. 25-28, 2006, Pittsburgh, PA).

H. Irie et al., "Interfacial structure dependence of layered $TiO_2/Wo_3$ thin films on the photoinduced hydrophilic property," Vacuum 74 (2004), pp. 625-629.

R. Jossen et al., "Thermal stability and catalytic activity of flame-made silica-vanadia-tungsten oxide-titania,", App. Catalysis B: Environmental 69 (2007), pp. 181-188.

O. Kanou, "Application of High Purity W for VLSI Sputtering Targets," $7^{th}$ International Tungsten Symposium, Sep. 1996, pp. 410-418.

V. Keller et al., "Photocatalytic oxidation of butyl acetate in vapor phase on $TiO_2$, $Pt/TiO_2$ and $WO_3/TiO_2$ catalysts," Journal of Catalysis 215 (2003), pp. 129-138.

M. Kobayashi et al., "$V_2O_5$-$WO_3/TiO_2$-$SiO_2$-$SO_4^{2-}$catalysts: Influence of active components and supports on activities in the selective catalytic reduction of NO by $NH_3$ and in the oxidation of $SO_2$," Applied Catalysis B: Environmental 63 (2006), pp. 104-113.

C. Lo et al., "Influence of Target Structure on Film Stress in WTI Sputtering," Mat. Res. Soc. Symp. Proc. vol. 505, 1998, pp. 427-432.

M. Miyauchi et al., "A Highly Hydrophilic Thin Film Under 1 $\mu W/cm^2$ UV Illumination," Adv. Mater. 2000, 12, pp. 1923-1927 ** [449.3, 449.9 and 449.7].

T. Obee et al., "A Kinetic Study of Photocatalytic Oxidation of VOCs on $WO_3$ Coated Titanium Dioxide," $11^{th}$ Conference on $TiO_2$ Photocatalysis: fundamentals & Applications (Sep. 25-28, 2006, Pittsburgh, PA).

K. Okimura et al., "Characteristics of rutile $TiO_2$films prepared b R.F. magnetron sputtering at a low temperature," Thin Solid Films 281-282 (1996) pp. 427-430.

C. Ramana et al., "Structural Stability and Phase Transitions in $WO_3$ Thin Films," J. Phys Chem B (2006), pp. 10430-10435.

T. Richardson et al., "Tungsten-Vanadium Oxide Sputtered Films for Electrochromic Devices," http://btech.lbl.gov/papers/42381.pdf.

I. Saeki et al., "The Photoelectrochemical Response of $TiO_2$—$Wo_3$ Mixed Oxide Films Prepared by Thermal Oxidation of Titanium Coated with Tungsten," J. Electrochem. Soc., vol. 143, No. 7, Jul. 1996, pp. 2226-2229.

S. Schiller et al., "Influence of Deposition Parameters on the Optical and Structural Properties of $TiO_2$ Films Produced by Reactive D.C. Plasmetron Sputtering," Thin Solid Films 83 (1981), pp. 239-245.

A. Schintlmeister et al., "Optical Coatings ($nb_2O_5$, $Ta_2O_5$ and $WO_3$) for LAC-applications Obtained by DC Quaslreactive magnetron Sputtering of Ceramic Sputtering Targets," 46th Annual Technical Conference Proceedings—Soc. of Vacuum Coaters, May 3-8, 2003, pp. 296-301.

K. Schwarz et al., Thermal material spraying—an alternative technique for the production of special purpose sputtering targets—abstract.

Y. Shen et al., "A new method to prepare tungsten and nitrogen co-doped titanium dioxide and its excellent photocatalytic activities irradiated by visible light," $11^{th}$ Conference on $TiO_2$ Photocatalysis: fundamentals & Applications (Sep. 25-28, 2006, Pittsburgh, PA).

I. Shiyanovskaya et al., "Biocomponent $WO_3/TiO_2$ Films as Photoelectrodes," J. Electrochemical Soc. 146 (1999), pp. 243-249.

V.S. Sinel'nikova et al., "Interaction of a Mixture of Oxides of Tungsten and Silicon With Carbon," Soviet Powder Metallurgy and Metal Ceramics, vol. 29, No. 3(327), Mar. 1990, pp. 234-236.

H. Song et al., "Efficient degradation of organic pollutant with $WO_x$ modified nano $TiO_2$ under visible irradiation," J. of Photochemistry and Photobiology A: Chemistry 181 (2006), pp. 421-428.

R. Staffler et al, "Advanced Coating Technology Based Upon Sputtering Targets Produced by Powder Metallurgy," Horizons of Powder Metallurgy Part I, Proceedings of the 1986 International Powder Metallurgy Conference and Exhibition, Jul. 7-11, 1986, pp. 219-222.

N.E. Stankova et al., "Thin (0 0 1) tungsten trioxide films grown by laser deposition," App. Surface Science 247 (2005), pp. 401-405.

H. Stumpp et al, "Manufacturing of Superclean Refractory and Reactive Metals and Alloys in High Vacuum for Advanced Technologies," 8$^{th}$ ICVM: Special Melting/Refining and Metallurgical Coating Under Vacuum or Controlled Atmosphere, vol. 2, Sep. 1985, pp. 1310-1324.

L. Su et al., "All Solid-State Smart Window of Electrodeposited $WO_3$ and $TiO_2$ Particulate Film With PTREFG Gel Electrolyte," J. Phys Chem Solids, vol. 59, No. 8, 1998, pp. 1175-1180.

J. Szczyrbowski et al., "Properties of $TiO_2$—Layers Prepared by Medium Frequency and DC Reactive Sputtering," 1997 Soc. of Vacuum Coaters (1997), pp. 237-241.

H. Tada et al., "Deactivation of the $TiO_2$ Photocatalyst by Coupling with $WO_3$ and the Electrochemically Assisted High Photocatalytic Activity of $WO_3$," Langmuir 20 (2004), pp. 4665-4670.

I. Wachs et al., "Catalysis science of the solid acidity of model supported tungsten oxide catalysts," Catalysis Today 116 (2006), pp. 162-168.

P. Wilhartitz et al., "3D-SIMS analysis of ultra high purity molybdenum and tungsten: a characterisation of different manufacturing techniques," Fresenius J Anal chem. (1995) 353: pp. 524-532.

N. Yamamoto et al., "Characteristics of Tungsten Gate Devices for MOS VLSI's," Materials Research Society, 1986, pp. 297-311.

N. Yamamoto et al., "Fabrication of Highly Reliable Tungsten Gate MOS VLSI's," J. Electrochem. Soc., vol. 133, No. 2, Feb. 1986, pp. 401-407.

M. Yamauchi et al., "Development of W-Ti Binary Alloy Sputtering Target and Study of its sputtering Characteristics," Nippon Tungsten Review, vol. 22 (1989), pp. 55-72.

D. Yoo et al., "Effects of annealing temperature and method on structural and optical properties of $TiO_2$ films prepared by RF magnetron sputtering at room temperature," App. Surface Science 253 (2007), pp. 3888-3892.

J.K. Yoon et al., "Growth kinetics and oxidation behavior of $WSi_2$ coating formed by chemical vapor deposition of Si on W substrate," J. Alloys and Compounds 420 (2006), pp. 199-206.

W. Zanhai et al., "Preparation of W-Ti Sputtering Targets under Inert Atmosphere," Chinese Journal of Rare Metals, vol. 30, No. 5, 2006, Abstract.

W. Zanhai et al., "Tungsten-Titanium Targets and Manufacturing Technology," Chinese Journal of Rare Metals, vol. 30, No. 1, 2006, Abstract.

P. Zemen et al., "Self-cleaning and antifogging effects of $TiO_2$ films prepared by radio frequency magnetron sputtering," J. Vac. Sci. Technol. A, Mar./Apr. 2002, pp. 388-393.

English-language abstract for FR 2738836, Mar. 1997.
English-language abstract for JP 2006305527 Nov. 2006.
English-language abstract for WO 2005102952 Nov. 2005.
English-language abstract for JP 2000094569 Apr. 2000.
International Preliminary Report on Patentability, dated Oct. 23, 2008 for PCT Application No. PCT/US2007/066390, 7 pages.
International Search Report and Written Opinion, dated Sep. 1, 2009 for PCT Application No. PCT/US2008/076183, 10 pages.
English-language abstract for WO01/68786, Sep. 2001.
English-language abstract for WO2006/077839, Jul. 2006.
English-language abstract for FR2884147, Jan. 2007.
International Search Report and Written Opinion, dated Apr. 17, 2009 for PCT Application No. PCT/US2008/076157, 18 pages.
English-language translation of FR2884147 (Saint Gobain), Jan. 2007.
"Surface Hardening of Ceramic and Glass Materials," IBM Technical Disclosure Bulletin, vol. 36, Issue 1 (Jan. 1993), p. 225.

"Surface Hardening of Ceramic and Glass Materials," IBM Technical Disclosure Bulletin, vol. 36, Issue 3 (Mar. 1993), pp. 291-292.

Anderson et al., "An Improved Photocatalyst of $TiO_2/SiO_2$ prepared by a Sol-Gel Synthesis", J. Phys. Chem., 1995, 99, 9882-9885.

Anderson et al., "Improved Photocatalytic Activity and Characterization of Mixed $TiO_2/SiO_2$ and $TiO_2/Al_2O_3$ Materials", J. Phys. Chem., 1997, 101, 2611-2616.

Chen Wen-mei et al, "The Effect of $SiO_2$ Additive on Superhydrophilic Property of $TiO_2$-$SiO_2$ Thin Film by Sol-gel Method", Journal of Wuhan University of Technology-Mater. Sci. Ed. (Sep. 2001), vol. 16, No. 3, 30-33.

Guan et al, "Enhanced effect and mechanism of $SiO_2$ addition in super-hydrophilic property of $TiO_2$ films" Surf. and Coating Tech 173 (2003) pp. 219-223.

Guan, "Hydrophilic property of $TiO_2/SiO_2$ mixing films" Trans. Nonferrous Met. Soc. China (2004), vol. 14, No. 2, pp. 251-254.

Guan, "Relationship between photocatalytic activity, hydrophilicity and self-cleaning effect of $TiO_2/SiO_2$ films" Surf. and Coating Tech 191 (2005) pp. 155-160.

Hans-Joachim Becker et al., "Herstellung und Eigenschaften von Flachgläsern, die mittels Hochvakuum-zerstäu-bungsverfahrens beschichtet wurden" Magazine Silikattechnik 36 (1985) Issue 5. (with English-language translation).

Hans-Joachin Gläser, "Beschichtung großflächiger Substratscheiben durch Kathodenzerstäubung" Glastechnische Berichte 56 (1983) No. 9 (with English-language translation).

Ingo et al., "XPS studies of $SiO_2$—$TiO_2$ powders prepared by sol-gel process", Appl. Surf. Sci. 1993, 70/71A, pp. 230-234.

Ion-Based Methods for Optical Thin Film Deposition (Journal of Material Science; J.P. Marting, 21 (1986) 1-25).

Kobayashi et al., "$V_2 O_5$—$WO_3/TiO_2$—$SiO_2$—$SO_4^{2-}$ catalysts: Influence of active components and supports on activities in the selective catalytic reduction of NO by $NH_3$ and in the oxidation of $SO_2$" App. Cat. B: Enviro 63. (2006), pp. 104-113.

Lassaletta et al., "Spectroscopic Characterization of Quantum-Sized $TiO_2$ Supported on Silica: Influence of Size and $TiO_2$—$SiO_2$ Interface Composition", J. Phys. Chem., 1995, 99, 484-1490.

Matthews et al., "An Adsorption Water Purifier with in Situ Photocatalytic Regeneration", J. Catal. 1988, 113, pp. 549-555.

MikroElektronick—High-rate Sputtering System for Two-Sided Coating (HZS-o$_4$).

Minero et al., "Role of Adsorption in Photocatalyzed Reactions of Organic Molecules in Aqueous of $TiO_2$ Suspensions", Langmuir, 1992, 113, pp. 481-486.

Miyashita et al., "Spectrum response of the vacuum-deposited $SiO_2/TiO_2$ multilayer film with improved photo-catalytic activity", Journal of Materials Science Letters, 2001, 20, 2137-2140.

Miyashita, et al., "Enhanced Effect of Vacuum-deposited SiO2 Overlayer on Photo-induced Hydrophilicity of TiO2 Film", Journal of Materials Science 36 (2001) p. 3877-3884.

Nakamura, et al., "Hydrophilic property of $SiO_2/TiO_2$ double layer films" Photocatalytic Coatings, Panel Session, pp. 345-350.

Niwa et al., Ammoxidation of Toluene Over $SiO_2$—$Al_2O_3$ $ZrO_{2—SiO2}$ and $TiO_2$—$SiO_2$, J. Catal. 1981, 69, pp. 69-76.

Novotná, et al., "Photocatalytical $TiO_2/SiO_2$—PDMS layers on glass" Photocatalytic Coatings, Panel Session, pp. 383-387.

Ohsaki, et al., "Photocatalytic properties of $SnO_2/TiO_2$ multilayers" Photocatalytic Coatings, Panel Session, pp. 369-376.

Ramirez-Del-Solar et al., "Effect of the Method of Preparation on the Texture of $TiO_2$—$SiO_2$ Gels", J. Non-Cryst. Solids 1990, 121, pp. 84-89.

Salvado et al., "$TiO_2$—$SiO_2$ glasses prepared by the alkoxide route", J. Non-Cryst. Solids 1992, 147/148, pp. 256-261.

Satoh et al., "Sol-gel-derived binary silica glasses with high refractive index", J. Non-Cryst. Solids 1992, 146, pp. 121-128.

Schraml-Marth et al., "Porous silica gels and $TiO_2$—$SiO_2$ mixed oxides prepared via the sol-gel process: characterization by spectroscopic techniques", J. Non-Cryst. Solids 1992, 143, pp. 93-111.

Shibata, K., et al., "Acidic Properties of Binary Metal Oxides", Bull. Chem. Soc. Jpn. 1973, 46, pp. 2985-2988.

Stakheev, et al., "XPS and XAES Study of $TiO_2$—$SiO_2$ Mixed Oxide System", J. Phys. Chem. 1993, 97, pp. 5668-5672.

Takeuchi, et al., "Preparation of Titanium-Silicon Binary Oxide Thin Film Photocatalysts by an Ionized Cluster Beam Deposition Method. Their Photocatalytic Activity and Photoinduced Super-Hydrophilicity", *J. Phys. Chem.* 2003, 107, pp. 14278-14282.

Vakuumbeschichtung 5 Anwendungen Teil II, VDI Verlag 1993, ISBN 3-18-401315-4 (with English-language translation).

Veersamy, et al., "Optical and Electronic Properties of Amorphous Diamond." *Diamond and Related Materials*, vol. 2 (1993), pp. 782-787.

Yu et al., "The grain size and surface hydroxyl content of super-hydrophilic $TiO_2$—$SiO_2$ composite nanometer thin films" *J. Mat. Sci. Lett.* (2001) 20, pp. 1745-1748.

Katsumata et al., "Effect of microstructure on photoinduced hydrophilicity of transparent anatase thin films", Surface Science, 579 (2005) 123-130.

Manfred Von Ardenne, "The Effects of Physics and Their Applications," Verlag Harri Deutsch, Thun and Frankfurt am Main, 1997, 4 pages.

Manfred Von Ardenne, "The Effects of Physics and Their Applications," Verlag Harri Deutsch, Thun and Frankfurt am Main, 1997, 7 pages (English Translation).

\* cited by examiner

US 8,506,768 B2

LOW-MAINTENANCE COATINGS, AND METHODS FOR PRODUCING LOW-MAINTENANCE COATINGS

CROSS-REFERENCE TO RELATED APPLICATIONS

The present application is a divisional application of U.S. application Ser. No. 12/209,679, filed Sep. 12, 2008, which in turn claims priority to U.S. Application No. 60/972,527, filed Sep. 14, 2007; and U.S. Application No. 61/039,760, filed Mar. 26, 2008, the entire contents of each of which are herein incorporated by reference.

FIELD OF THE INVENTION

The present invention provides thin film coatings for substrates. More particularly, the invention provides low-maintenance coatings for glass and other substrates. The invention also provides methods for producing low-maintenance products.

BACKGROUND OF THE INVENTION

Low-maintenance coatings, for example photocatalytic coatings, are well known. A great deal of research has been done in attempting to develop low-maintenance coatings that exhibit good properties, such as self-cleaning properties and hydrophilicity.

Most conventional low-maintenance coatings include a layer of titanium dioxide (i.e., $TiO_2$). While many of these coatings are advantageous, there is much room for improvement. For example, it would be desirable to provide thin low-maintenance coatings that have low visible reflection and good color neutrality, and yet can achieve good photoactivity levels, hydrophilicity, and/or activation ability. It would be particularly desirable to provide coatings that achieve these properties while at the same time being durable, stable, and resistant to haze formation (e.g., during tempering and other heat treatments).

SUMMARY OF THE INVENTION

In certain embodiments, the invention provides a substrate having a major surface on which there is a low-maintenance coating. The low-maintenance coating includes a functional film comprising both titanium oxide and tungsten oxide. In the present embodiments, the substrate is glass in an annealed state, and the functional film has a thickness of less than 150 Å yet the low-maintenance coating has an acetone decomposition rate of greater than $1.4 \times 10^{-10}$ moles/(liter)(second).

Some embodiments of the invention provide a substrate having a major surface on which there is a low-maintenance coating. The low-maintenance coating includes a functional film comprising both titanium oxide and tungsten oxide. In the present embodiments, the substrate is glass in a tempered state, and the functional film has a thickness of less than 150 Å yet the low-maintenance coating has an acetone decomposition rate of greater than $1.8 \times 10^{-10}$ moles/(liter)(second).

In some embodiments, the invention provides a substrate having a major surface on which there is a low-maintenance coating that includes a base film and a functional film. The functional film comprises both titanium oxide and tungsten oxide. In the present embodiments, the base film is a high-rate sputtered film deposited using at least one target in an atmosphere into which both inert gas and oxidizing gas are flowed. Preferably, the inflow rate for the inert gas divided by the inflow rate for the oxidizing gas is between 0.4 and 2.5. The functional film in these embodiments preferably is a high-rate sputtered film deposited from at least one target having a sputterable material comprising both titanium oxide and tungsten oxide.

Certain embodiments provide a substrate having a major surface on which there is a low-maintenance coating. In the present embodiments, the low-maintenance coating has only a single photocatalytic layer, and this layer comprises both titanium oxide and tungsten oxide throughout an entire thickness of the layer. Further, in these embodiments, the substrate is glass in an annealed state, and the photocatalytic layer has a thickness of less than 150 Å yet the low-maintenance coating has an acetone decomposition rate of greater than $1.4 \times 10^{-10}$ moles/(liter)(second). In some of these embodiments, the thickness of the photocatalytic layer is less than 100 Å and yet the acetone decomposition rate is greater than $2.1 \times 10^{-10}$ moles/(liter)(second).

Some embodiments provide a substrate having a major surface on which there is a low-maintenance coating. In the present embodiments, the low-maintenance coating has only a single photocatalytic layer, and this layer comprises both titanium oxide and tungsten oxide throughout an entire thickness of the layer. Further, in these embodiments, the substrate is glass in a tempered state, and the photocatalytic layer has a thickness of less than 150 Å yet the low-maintenance coating has an acetone decomposition rate of greater than $1.8 \times 10^{-10}$ moles/(liter)(second). In some of these embodiments, the thickness of the photocatalytic layer is less than 100 Å and yet the acetone decomposition rate is greater than $6.75 \times 10^{-10}$ moles/(liter)(second).

Certain embodiments provide a method of depositing of a low-maintenance coating on a major surface of a substrate. The low-maintenance coating here includes a base film and a functional film. In the present method, the base film is deposited using a high-rate sputtering technique wherein at least one target is sputtered in an atmosphere into which both inert gas and reactive gas are flowed, and wherein an inflow rate for the inert gas divided by an inflow rate for the reactive gas is between 0.4 and 9. In the present method, the functional film is deposited by a high-rate sputtering technique that uses at least one target having a sputterable material comprising both titanium oxide and tungsten oxide. In some embodiments of this nature, the high-rate sputtering technique for depositing the base film involves a plurality of targets each carrying a sputterable material consisting essentially of: 1) one or more metals, or 2) one or more semi-metals, or 3) at least one metal and at least one semi-metal, while the high-rate sputtering technique for depositing the functional film involves a plurality of oxide targets each carrying the sputterable material comprising both titanium oxide and tungsten oxide. For example, the sputterable target material used in depositing the functional film may include silicon, and the sputterable target material used in depositing the functional film may include: i) tungsten in oxide form, ii) TiO, and iii) $TiO_2$. In the present method, the inert gas can advantageously be argon while the reactive gas is oxygen or nitrogen, and the inflow rate for the argon gas divided by the inflow rate for the oxygen or nitrogen gas can optionally be between 0.35 and 9.

Certain embodiments of the invention provide a sputtering technique for depositing a low-maintenance coating over a major surface of a substrate. The present sputtering technique includes sputter depositing a base film over the major surface and sputter depositing a functional film over the base film. The functional film comprises both titanium oxide and tungsten oxide. In the present embodiments, the sputter deposition is performed such that the low-maintenance coating, as deposited, has an average surface roughness of between about 0.35 nm and 3.0 nm. Also, in the present embodiments, the substrate is glass in an annealed state, and the functional film has a thickness of less than 150 Å yet the low-maintenance coating has an acetone decomposition rate of greater than $1.4 \times 10^{-10}$ moles/(liter)(second).

Further, some embodiments provide a sputtering technique for depositing a low-maintenance coating over a major surface of a substrate. In the present embodiments, the sputtering technique includes depositing a thickness of film comprising titania, wherein at least part of that thickness includes tungsten oxide and is deposited by sputtering one or more targets having a sputterable material comprising both titania and tungsten oxide, wherein the sputterable material includes: i) tungsten in oxide form, ii) TiO, and iii) $TiO_2$. In some cases, substantially all the tungsten in the sputterable material is in oxide form. The depositing can be accomplished by sputtering the targets in an atmosphere comprising argon and oxygen. If desired, the depositing can also be accomplished by sputtering the targets in an atmosphere comprising argon, oxygen, and nitrogen. In some cases, the sputterable material is characterized by a metal-only W/Ti weight ratio of between about 0.01 and 0.34, such as between about 0.01 and about 0.2, this ratio being the total weight of the tungsten in the sputterable material divided by the total weight of the titanium in the sputterable material. The thickness of the film comprising titania preferably is less than 250 Å.

A sputtering target is also provided in accordance with certain embodiments. The target can have a sputterable material comprising both titania and tungsten oxide, wherein the sputterable material includes: i) tungsten in oxide form, ii) TiO, and iii) $TiO_2$. In some cases, substantially all the tungsten in the sputterable material is in oxide form. In some embodiments, the sputterable material consists essentially of: i) tungsten in oxide form, ii) TiO, and iii) $TiO_2$. The sputterable material can optionally have a metal-only W/Ti weight ratio of between about 0.01 and 0.34, such as between about 0.01 and about 0.2, this ratio being the total weight of the tungsten in the sputterable material divided by the total weight of the titanium in the sputterable material. The target can optionally be a cylindrical rotary target, with the sputterable material carried on an exterior wall of an elongated backing tube, and the elongated backing tube having a length of at least 24 inches. In some of the present embodiments, the target is adapted to rotate about a central axis to which the exterior wall of the backing tube is substantially parallel.

DETAILED DESCRIPTION OF PREFERRED EMBODIMENTS

Figure 1:
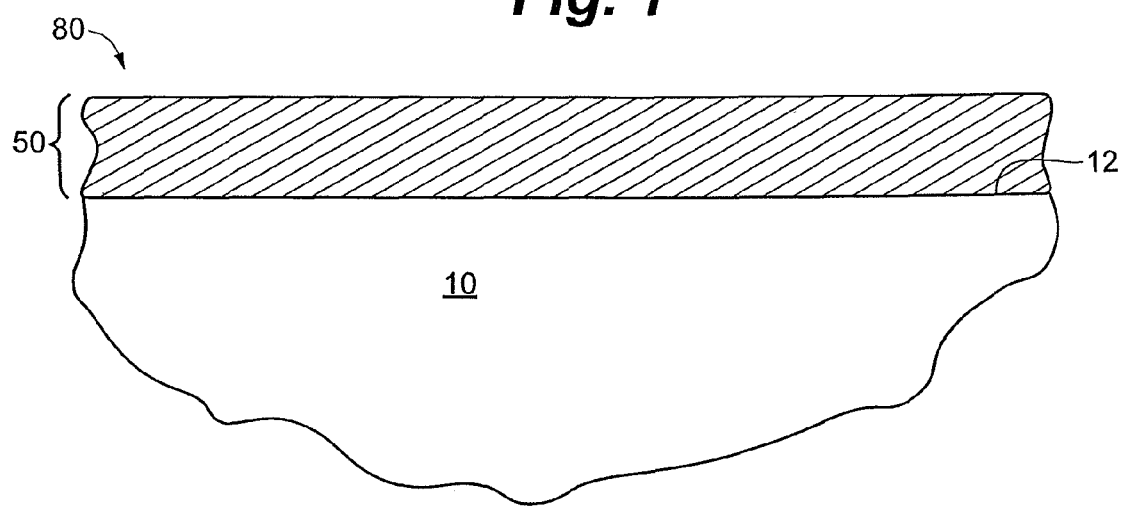
FIG. 1 is a schematic cross-sectional view of a substrate having a major surface carrying a low-maintenance coating in accordance with certain embodiments.

The following detailed description is to be read with reference to the drawings, in which like elements in different drawings have like reference numbers. The drawings, which are not necessarily to scale, depict selected embodiments and are not intended to limit the scope of the invention. Skilled artisans will recognize that the given examples have many alternatives that fall within the scope of the invention.

Many embodiments of the invention involve a coated substrate. A wide variety of substrate types are suitable for use in the invention. In some embodiments, the substrate 10 is a sheet-like substrate having generally opposed first 12 and second 14 major surfaces. For example, the substrate can be a sheet of transparent material (i.e., a transparent sheet). The substrate, however, is not required to be a sheet, nor is it required to be transparent.

The substrate can optionally be a component of any of a variety of building materials. Examples of anticipated applications include embodiments wherein the substrate is a sash (e.g., a window sash or a door sash), a siding panel (e.g., an aluminum siding panel), a tent panel, a tarpaulin (e.g., a fluorocarbon polymer tarpaulin), a plastic film (e.g., a fluorocarbon plastic film), a roofing shingle, a window blind (such as a metal, plastic, or paper window blind), a paper screen (e.g., a shoji), a railing, a baluster, or an escutcheon. In one embodiment, the substrate is a ceramic tile, such as a wall, ceiling, or floor tile. In another embodiment, the substrate is a glass block. A variety of suitable glass blocks can be obtained commercially from Saint-Gobain Oberland (Koblenz, Germany). In still other embodiments, the substrate is a polyester film, a polyethylene film, a terephthalate film, etc. Suitable films of this nature can be obtained commercially from Nippon Soda Co., Ltd. (Tokyo, Japan). In further embodiments, the substrate is a fence or wall, such as a noise-reduction fence or wall. The substrate can alternatively be part of a photovoltaic device (e.g., it can be a cover for a photovoltaic device).

For many applications, the substrate will comprise a transparent (or at least translucent) material, such as glass or clear plastic. For example, the substrate is a glass sheet (e.g., a window pane) in certain embodiments. A variety of known glass types can be used, and soda-lime glass will commonly be preferred. In certain preferred embodiments, the substrate is part of a window, skylight, door, shower door, or other glazing. In some cases, the substrate is part of an automobile windshield, an automobile side window, an exterior or interior rear-view mirror, a bumper, a hubcap, a windshield wiper, or an automobile hood panel, side panel, trunk panel, or roof panel. In other embodiments, the substrate is a piece of aquarium glass, a plastic aquarium window, or a piece of greenhouse glass. In a further embodiment, the substrate is a refrigerator panel, such as part of a refrigerator door or window. In another embodiment, the substrate is part of an electrochromic device.

Substrates of various sizes can be used in the present invention. Commonly, large-area substrates are used. Certain embodiments involve a substrate 10 having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

In some embodiments, the substrate 10 is a generally square or rectangular glass sheet. The substrate in these embodiments can have any of the dimensions described in the preceding paragraph and/or in the following paragraph. In one particular embodiment, the substrate is a generally rectangular glass sheet having a width of between about 3 meters and about 5 meters, such as about 3.5 meters, and a length of between about 6 meters and about 10 meters, such as about 6.5 meters.

Substrates of various thicknesses can be used in the present invention. In some embodiments, the substrate 10 (which can optionally be a glass sheet) has a thickness of about 1-5 mm. Certain embodiments involve a substrate 10 with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used. In one group of embodiments, the thickness of the substrate is between about 4 mm and about 20 mm. Thicknesses in this range, for example, may be useful for aquarium tanks (in which case, the substrate can optionally be glass or acrylic). When the substrate is float glass, it will commonly have a thickness of between about 4 mm and about 19 mm. In another group of embodiments, the substrate is a thin sheet having a thickness of between about 0.35 mm and about 1.9 mm. Embodiments of this nature can optionally involve the substrate 10 being a sheet of display glass or the like.

FIGS. 1-7 show a substrate 10 with a major surface 12 bearing a low-maintenance coating 80. The low-maintenance coating 80 can have photocatalytic properties, hydrophilic properties, or both. In preferred embodiments, the coating 80 has photoactivity as determined by the acetone decomposition test that will now be described.

Figure 21:
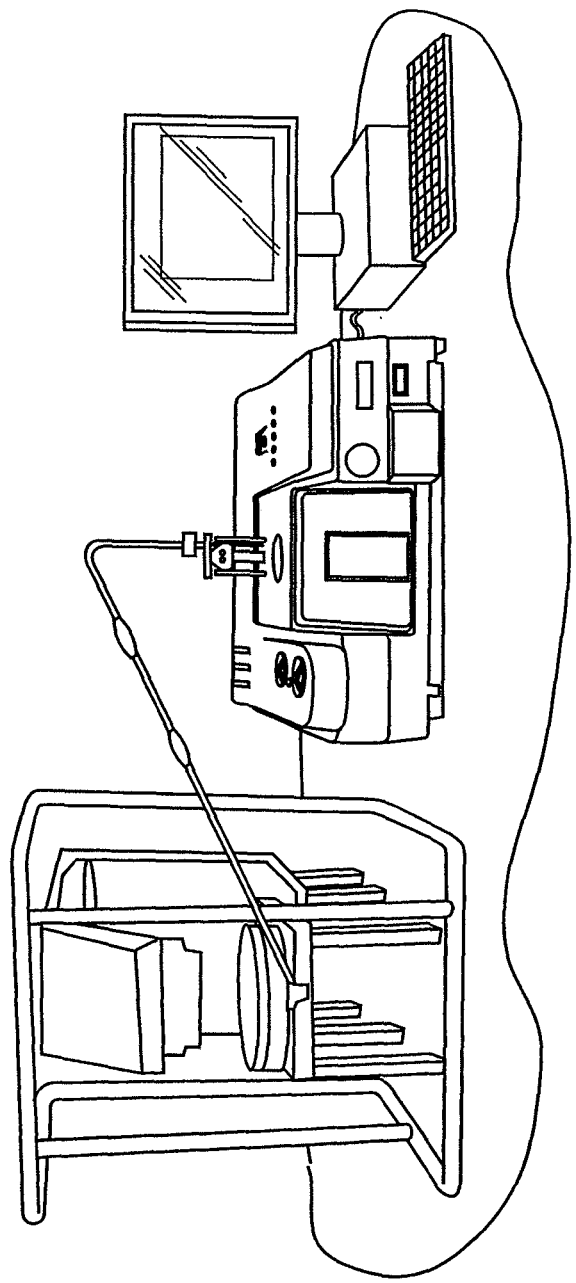
FIG. 21 is a photograph of a testing system used for calculating acetone decomposition rates for substrates bearing photocatalytic coatings.
Figure 22:
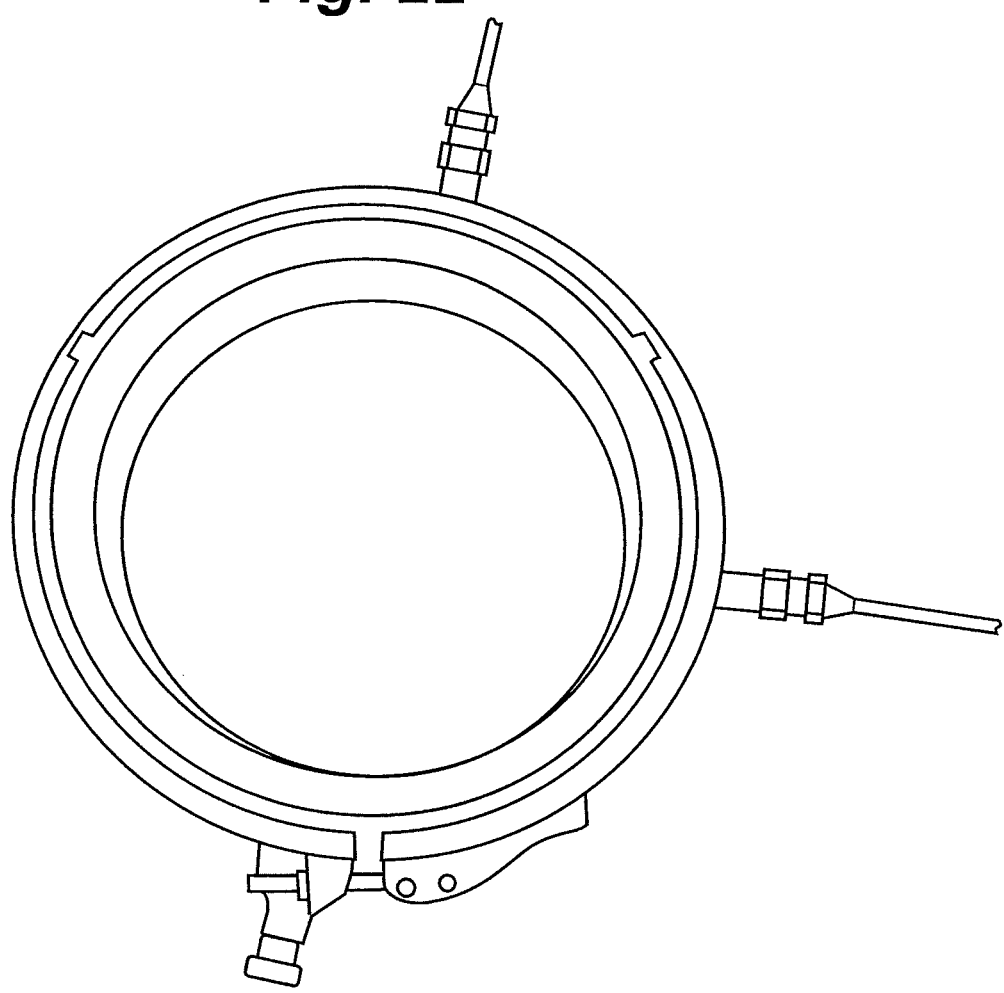
FIG. 22 is a photograph of a reactor dish that is part of a testing system used for calculating acetone decomposition rates for substrates bearing photocatalytic coatings.

The following system is used to determine the acetone decomposition slope. Reference is made to FIGS. 21 and 22. Fourier transform infrared (FT-IR) spectroscopy is used (Thermo Nicolet 8700 FT-IR with MCT-A liquid nitrogen cooled detector and a KBr beam splitter). In particular, the following system features are used: Nicolet 8700 Gold system optics; sealed, desiccated optical bench; Ge-on KBr beam splitter (7800-350 $cm^{-1}$); MCT-A liquid nitrogen cooled detector (11700-600 $cm^{-1}$); Research OMNIC Professional 7.1; Val-Q System validation package; OMNIC FT-IR Software Operations. The system is a recycling closed loop system, including a pump (a piston pump) and a reactor cell (a reactor dish). Stainless steel tubing connects the components. The piston pump is commercially available from Fluid Metering, Inc. (Syosset, N.Y., USA): Item ID=Pump Drive Module, Q 115 VAC 60 Hz; Item ID=Q1CSY, Q Pump Head Module, and; Item ID=R412-2, Adapter, ⅜" Tube, SS (the pump setting used is 8 out of a possible 10). The reactor dish can be obtained from Allen Scientific Glass, Inc. (Boulder, Colo., USA), e.g., under product code 530. The dish has a solid bottom with a diameter of 8 inches. The sidewall of the dish has a height of 1.8 inches. The dish is gas tight and has an internal volume of 1.5 liters. The dish has three ports, each with a diameter of ⅜ inch. The bottom portion of the dish is Pyrex, and it has a lid formed of quartz. Two ports on the dish are connected to stainless steel tubing so that gas circulates, and another port on the dish is provided to allow acetone injection into the dish through a rubber disc. The quartz lid is placed on an O-ring that is seated into the lip of the dish's Pyrex bottom portion. A delrin hold down ring is placed over the quartz lid, and the ring and quartz lid are clamped down by a schott flange with quick clamp. Following acetone injection, the rubber disc seals the port so the system is closed. One 4"×6" low-maintenance coated sample is placed in the reactor dish with the low-maintenance coating facing up. The volumes for the FTIR sample cell, reactor dish, and stainless steel tubing are: 500 milliliters (FTIR sample cell); 1.5 liters (reactor dish); and 97 milliliters (stainless steel tubing). The UV source is a 1,000 Watt Oriel Solar Simulator with a 4 inch by 4 inch beam, which is commercially available from Newport Corporation (Mountain View, Calif., U.S.A.). The gas sample cell is commercially available from Infrared Analysis Inc. (Anaheim, Calif., USA) under the model number 7.2-V. The gas sample cell is the 6-PA customized to be a variable-path long path cell adjustable in steps of 0.6 meters from 0.6 meters to 7.2 meters. The gas sample cell has the following features: black-anodized aluminum endplates; interior mirror carriage hardware; glass mirror blanks with protected-Gold optical coating; KCl windows, Viton o-ring seals; laser for path length verification and mirror alignment.

The test is performed by closing the system and pumping for an hour to stabilize. Closed means there is no longer any dry air purging through the system, all valves are closed, and the pump is circulating air through the tubing, reactor dish, and sample cell. A background scan and three FT-IR scans are taken prior to injecting acetone into the closed system. One half micro liter of acetone is injected. Once the acetone is injected, FT-IR scans are taken every 5 minutes. The UV is turned on 2-3 hours after injecting the acetone. This allows the system to equilibrate prior to turning on the 1000 W Oriel Solar Simulator. The UV is on for 4-5 hours, during which time FT-IR scans are taken every 5 minutes.

The data resulting from each scan are plotted as a curve of absorbance versus wavenumbers ($cm^{-1}$). The FT-IR peaks show the presence of acetone. The acetone peak from 1260-1160 $cm^{-1}$ is used to calculate the acetone decomposition slope. In particular, the corrected peak area under the curve at 1260-1160 $cm^{-1}$ is calculated using a macro set up within the FT-IR software and is plotted in Excel versus time in minutes to calculate the slope (thus, the reported slope is the change in this corrected peak area over time in minutes). The data points used are those from the linear portion of the data from the time UV is turned on until all the acetone is decomposed. The linear portion of the data is plotted versus time in minutes, and from this the slope is calculated, such plotting and slope calculation being performed with the Trendline option in Microsoft Excel 2000.

The following discussion of a few acetone peaks is useful to further illustrate the foregoing method. A first curve results from a scan done prior to the acetone being injected into the system, and therefore has no peak at 1260-1160 $cm^{-1}$. Another curve results from a scan taken once the acetone has equilibrated and just before UV is turned on. Subsequent curves show the decline in the acetone peak, illustrating photodecomposition of the acetone and hence a reduction in the amount of acetone measured by the FT-IR. Thus, the slope is calculated by plotting the change in the area under the noted curve after the UV light is turned on and prior to all the acetone being decomposed.

Once an acetone decomposition slope has been determined, the slope can be converted to a rate using the following equation: acetone decomposition rate=$(2.55\times10^{-9})\times$(acetone decomposition slope). It is to be understood that this conversion factor is specific to the present system; it is not a universal conversion factor. The rate is in units of moles/(liter)(second). As examples, consider the following:

| Product | Slope | Rate moles/(liter)(second) |
|---|---|---|
| Annealed glass/200 Å high rate $SiO_2$/55 Å high rate $TiO_2$:W | .0772 | $1.97 \times 10^{-10}$ |
| Tempered* glass/200 Å high rate $SiO_2$/55 Å high rate $TiO_2$:W | .2141 | $5.46 \times 10^{-10}$ |
| Annealed glass/200 Å high rate $SiO_2$/70 Å high rate $TiO_2$:W | .0839 | $2.14 \times 10^{-10}$ |
| Tempered* glass/200 Å high rate $SiO_2$/70 Å high rate $TiO_2$:W | .2674 | $6.82 \times 10^{-10}$ |

*After being coated, the glass was heat-treated in a furnace to simulate tempering in a commercial production setting.

In certain embodiments, the low-maintenance coating has an acetone decomposition rate of greater than $1.4\times10^{-10}$, preferably greater than $1.785\times10^{-10}$, more preferably greater than $1.91\times10^{-10}$, or even greater than $2\times10^{-10}$, and perhaps optimally greater than $2.1\times10^{-10}$. In some embodiments of this nature, the functional film has a thickness of less than 150 Å, or even less than 100 Å (such as about 50-80 Å), and yet the low-maintenance coating has an acetone decomposition rate above one or more of the noted levels. Some embodiments provide annealed glass bearing a low-maintenance coating with an acetone decomposition rate above one or more of these levels.

In some embodiments where the substrate is annealed glass, the low-maintenance coating has an average surface roughness Ra of between 0.35 nm and 3.0 nm, such as between 0.35 nm and 2.0 nm, and in some cases between 0.4 nm and 1.0 nm. The surface roughness, though, can be varied; it is by no means required to be within any of these ranges. Some embodiments, for example, may provide much higher surface roughness.

Glass in an annealed state can readily be scored and cut. Heat treatment above 350 degrees Fahrenheit will normally remove the anneal of soda-lime glass. As is well known, annealing is a process of slowly cooling glass to relieve internal stresses. The process is carried out in a temperature-controlled kiln, which is called a lehr. Glass that has not been annealed, or has lost its anneal, tends to crack or shatter when subjected to temperature change or mechanical shock. Annealing glass, and retaining the anneal, is desirable for the durability of the glass. If glass is not annealed, or loses its anneal, it will have substantial thermal stresses and its strength will be decreased considerably.

In the annealing process, glass is heated until its temperature reaches a stress-relief point (i.e., the annealing temperature, which is also referred to as the annealing point). At this point, the glass is sufficiently soft that the stresses in the glass relax, yet it is still too hard to deform. The glass is then heat-soaked until its temperature is even throughout. Then, the glass is cooled slowly at a predetermined rate until the temperature of the glass is below its strain point. Finally, the glass temperature can be dropped to room temperature. Glass in an annealed state can be cut, drilled, polished, etc.

Thus, some embodiments provide a low-maintenance coating that is on glass in an annealed state and can achieve acetone decomposition rates above one or more of the noted levels. Some prior art photocatalytic coatings only report photoactivity (or significant levels of photoactivity) after being calcined or otherwise heat treated at temperatures that would remove the anneal of glass. While such high temperature treatments may be advantageous for increasing the photoactivity of the coating, they may not be feasible when it is necessary to provide the coating on annealed glass (which can be readily scored and cut). Thus, the present embodiments provide a low-maintenance coating that can provide surprising levels of photoactivity without requiring the coating to be calcined or otherwise treated at temperatures that would remove the anneal of glass.

Similarly, some embodiments provide a low-maintenance coating made by maintaining the substrate during deposition at a temperature not exceeding 350 degrees Fahrenheit, not exceeding 300 degrees Fahrenheit, or not exceeding 250 degrees Fahrenheit.

In certain embodiments, the invention provides a substrate (optionally glass in an annealed state) bearing a low-maintenance coating that, if tempered, experiences an increase of its acetone decomposition rate. Preferably, the increase results in the acetone decomposition rate being greater than $1.8\times10^{-10}$ moles/(liter)(second), more preferably greater than $2.5\times10^{-10}$ moles/(liter)(second), and even more preferably greater than $4\times10^{-10}$ moles/(liter)(second). Perhaps optimally, the increase results in the rate being greater than $5.1\times10^{-10}$ moles/(liter)(second), greater than $6.3 \times 10^{-10}$ moles/(liter)(second), or even greater than $6.75 \times 10^{-10}$ moles/(liter)(second).

Additionally or alternatively, the low-maintenance coating may in some cases have the advantageous property that, if tempered, it experiences an increase of its acetone decomposition rate by more than a factor of 1.5, or by more than a factor of two, or even by more than a factor of three. The acetone decomposition rate of the first product tabulated above, for example, increased from $1.97 \times 10^{-10}$ moles/(liter)(second) to $5.46 \times 10^{-10}$ moles/(liter)(second) due to tempering, resulting in a post-temper decomposition rate that is more than 2.75 times its pre-temper rate. And the acetone decomposition rate of the second product tabulated above increased from $2.14 \times 10^{-10}$ moles/(liter)(second) to $6.82 \times 10^{-10}$ moles/(liter)(second) due to tempering, resulting in a post-temper decomposition rate that is more than three times its pre-temper rate. However, it is by no means required that the photoactivity of the present coatings increase if tempered; in some cases, there may be no substantial change in photoactivity due to tempering.

Tempered glass is much stronger than standard glass. Tempered glass breaks in a special way. It does not break into large dangerous shards. And if any part of the glass breaks, then the entire pane shatters. Tempered glass is manufactured by a process that involves intense heating and rapid cooling, making it harder than standard glass. Tempered glass may be characterized, for example, as having a surface compression of greater than about 10,000 psi.

In tempering, glass is commonly placed in a furnace maintained at about 680-705° C. (preferably controlled to 690-700° C.). The glass is typically held in the furnace for 100-120 seconds with constant movement to better ensure temperature uniformity of the product. This is intended to raise the glass temperature to about 640° C. The glass is then removed from the furnace and cooled rapidly in a stream of air for about 50 seconds such that the glass is cool enough for an operator to handle.

Thus, the invention also provides embodiments wherein the substrate bearing the low-maintenance coating is tempered glass. Here, the substrate is glass in a tempered state, and the low-maintenance coating preferably has an acetone decomposition rate of greater than $1.8 \times 10^{-10}$ moles/(liter)(second), more preferably greater than $2.5 \times 10^{-10}$ moles/(liter)(second), and even more preferably greater than $4 \times 10^{-10}$ moles/(liter)(second). Perhaps optimally, the rate is greater than $5.1 \times 10^{-10}$ moles/(liter)(second), greater than $6.3 \times 10^{-10}$, or even greater than $6.75 \times 10^{-10}$. In some embodiments of this nature, the functional film has a thickness of less than 150 Å, or even less than 100 Å (such as about 50-80 Å), yet the low-maintenance coating has an acetone decomposition rate above one or more of the noted levels.

In some embodiments where the substrate is tempered glass, the low-maintenance coating has an average surface roughness Ra of between 0.35 nm and 5.0 nm, such as between 1.0 nm and 4.5 nm, e.g., between 2.0 nm and 4.0 nm. Again, the surface roughness is not required to be within any of these ranges. For example, some embodiments may involve greater roughness.

The coating 80 includes a functional film 50 comprising both titanium oxide and tungsten oxide. In certain embodiments, some, substantially all, or all of the tungsten in the functional film 50 is in oxide form. In some cases, the functional film 50 consists essentially of titanium oxide and tungsten oxide. Preferably, the functional film contains more titanium oxide than tungsten oxide. In some embodiments, the functional film 50 has between about 1-20 weight percent tungsten, such as about 1-10 weight percent tungsten, and perhaps optimally about 1-6 weight percent tungsten (such percentages being determined on the basis of the weight of the tungsten in the film relative to the total weight of all components of the film, e.g., which in some cases will consist of the combined weight of titanium, oxygen, and tungsten in the film).

The functional film 50 can generally be a homogenous film, a substantially homogenous film, a graded film, or some other type of non-homogenous film. In one group of embodiments, the functional film 50 is a homogenous or substantially homogenous film comprising both titanium oxide (e.g., $TiO_2$) and tungsten oxide. The film 50, for example, can be a substantially homogenous film of a mixed oxide comprising both titanium oxide and tungsten oxide (as opposed to a film of $TiO_2$ with islands of WO on the surface of the $TiO_2$). In some embodiments, the film is substantially uniform in that it does not comprise pre-formed particles (e.g., of $TiO_2$) dispersed in a binder (e.g., of WO).

In some preferred embodiments, the functional film 50 defines an exposed, outermost face of the low-maintenance coating 80. In alternate embodiments, at least one film (such as a thin hydrophilic film, or another photocatalytic film) may be positioned over the functional film. Embodiments of this nature are exemplified in FIG. 3, which depicts an outermost film (OF) over the functional film 50.

Adding tungsten oxide to a film comprising titanium oxide can increase photoactivity and hydrophilicity. However, a thick film of titanium oxide and tungsten oxide may be limited in terms of haze resistance, durability, and/or stability. Surprisingly, the inventors have discovered that incorporating tungsten oxide into a titanium oxide film of small thickness and/or providing the tungsten load at special percentages can provide good photoactivity and hydrophilicity while at the same time achieving good haze resistance, durability, and stability. The inventors have also found that these properties can be improved by adjusting the surface roughness of the coating (such as by depositing a base layer using a special high rate process), by adjusting the thickness of the base layer, or both.

The functional film 50 can include $TiO_2$, TiO, or both. Other forms of titanium oxide may also be present. In certain embodiments, the film 50 includes titanium oxide, tungsten oxide, and at least one additional material, such as a material selected from the group consisting of nitrogen, tantalum, copper, silica, palladium, tin, niobium, and molybdenum. Other "additional materials" can also be used. The additional material can be a dopant, which may be present in an amount up to about ten weight percent, such as about five weight percent or less, e.g., about 2-3 weight percent or less. Larger concentrations may be preferred in other cases. The additional material, when provided, can be present throughout the functional film 50 or only in a certain portion of the film 50.

In one group of embodiments, the functional film 50 includes nitrogen, e.g., it can comprise an oxynitride. When provided, the nitrogen may be present in an amount of 10 weight percent or less, more preferably 5 weight percent or less.

The thickness of the functional film 50 generally is less than 500 Å, preferably less than 300 Å, more preferably less than 250 Å, such as less than 200 Å, less than 150 Å, or even less than 100 Å. In some embodiments, the thickness is 30-90 Å, preferably 40-85 Å, and perhaps optimally 50-80 Å. The inventors have found these thickness ranges to be particularly advantageous in minimizing, or even eliminating, the color that can occur with thicker films. In other embodiments, though, thicker films may be used for applications where more color is desirable, or at least acceptable, or where another coating or pane neutralizes the color adequately.

The inventors have discovered that when the thickness of the functional film is less than about 100 Å (more preferably less than 90 Å), the coating 80 can achieve an exceptional degree of haze resistance. For example, the haze of a glass pane carrying the present low-maintenance coating 80 can be less than 0.40 after tempering, or even less than 0.30, such as between about 0.2 and about 0.27. Haze can be measured using a BYK Gardner Haze-Gard Plus device. The specimen surface is illuminated perpendicularly, and the transmitted light is measured photoelectrically, using an integrating sphere (0°/diffuse geometry).

The inventors have also discovered that if the thickness of the film comprising titanium oxide and tungsten oxide is greater than about 40 Å (more preferably greater than about 50 Å), then there is a surprising boost in photoactivity, hydrophilicity, or both when the coated substrate is tempered. When the thickness is substantially smaller, tempering does not appear to provide such a boost. Thicknesses of about 40 Å or greater, perhaps optimally 50 Å or greater (e.g., about 50 Å-80 Å, such as about 70 Å) are therefore preferred in this regard. The mechanism behind this surprising boost in properties has not been explained definitively. It is surmised, however, that when the coated substrate is heat treated, this causes a decrease in density of defect states of the film allowing the photoexcited electrons in the conduction band of the titania to have a longer lifetime resulting in an increase in quantum efficiency. The improved quantum efficiency results in more electron-hole pairs to generate hydroxyl radicals (OH.) and superoxide ions ($O_2^-$) to decompose and mineralize organic compounds by participating in a series of oxidation reactions. This results in a favorable change in photoactivity, hydrophilicity, or both. Surprisingly, the boost seems not to occur unless the noted minimum thickness threshold is exceeded. The inventors, though, do not wish to be bound by this explanation.

In certain embodiments, the functional film 50 has a tungsten load characterized by a metal-only atomic ratio of between about 0.001 and 0.4, such as between about 0.01 and about 0.34. This ratio is the number of tungsten atoms in the film 50 divided by the number of titanium atoms in the film.

Figure 2:
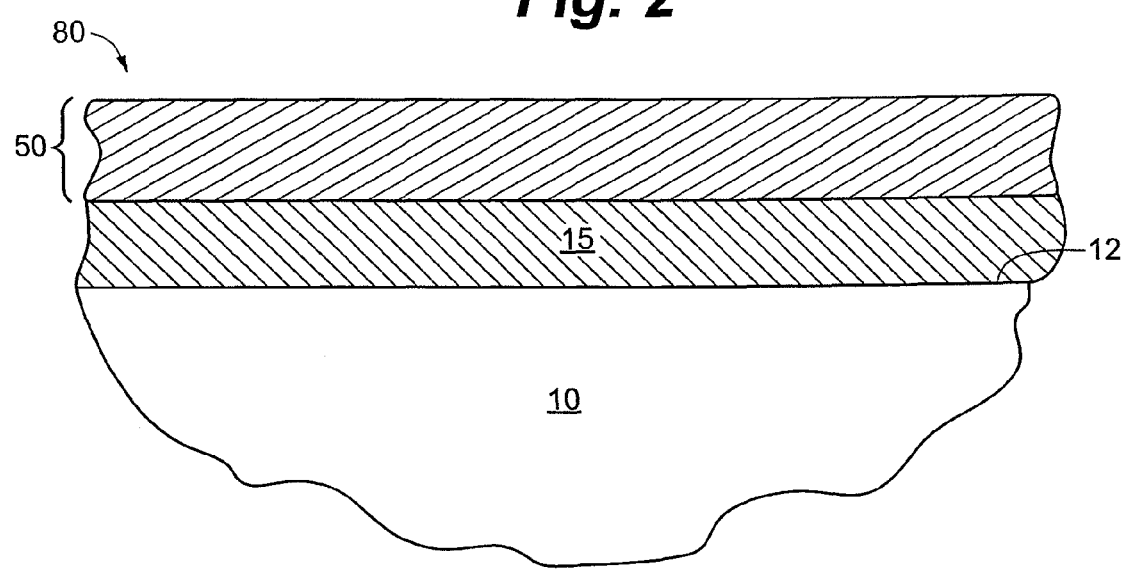
FIG. 2 is a schematic cross-sectional view of a substrate having a major surface carrying a low-maintenance coating in accordance with certain embodiments.
Figure 3:
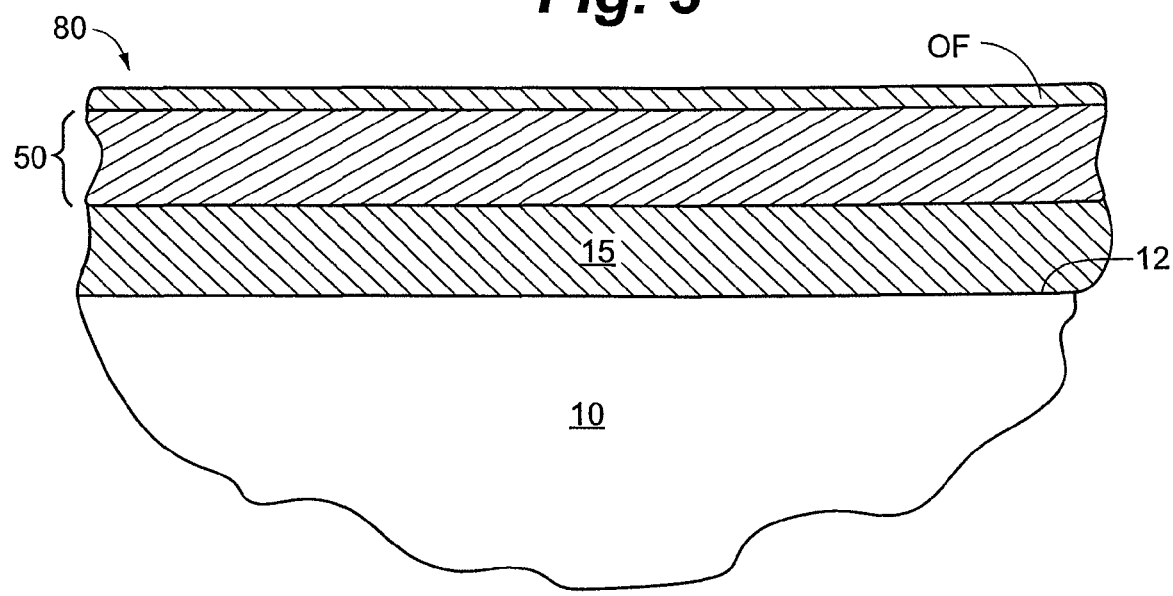
FIG. 3 is a schematic cross-sectional view of a substrate having a major surface carrying a low-maintenance coating in accordance with certain embodiments.

With reference to FIG. 2, in some embodiments, the low-maintenance coating 80 includes a base film 15 between the functional film 50 and the substrate 10. In general, the base film 15 can be any suitable material that adheres well to the substrate, protects the functional film 50 from sodium ion diffusion, or both. In cases where the base film 15 is omitted, the substrate 10 itself can optionally be treated to reduce or perhaps deplete the surface area of the substrate of sodium ions. The base film 15 comprises a dielectric film in some embodiments. In certain embodiments, the base film comprises silica, alumina, or both. The base film 15 can optionally be a mixed oxide film including two or more materials. In some cases, it is a mixed oxide film comprising silica and alumina, or silica and titania, or silica, alumina and titania. Other materials can be used as well.

The base film 15 can generally be a homogenous film, a substantially homogenous film, a graded film, or some other non-homogenous film. When provided, the base film 15 may be deposited directly onto the substrate, with the functional film 50 being deposited directly onto the base film 15. This, however, is by no means required. When provided, the base film 15 can optionally have a thickness of less than about 300 Å. In certain embodiments, the base film 15 has a thickness of less than 275 Å or even less than 250 Å. The base film 15, for example, can have a thickness of between 175 Å and 225 Å, such as about 200 Å-225 Å. The noted thickness ranges, however, are merely exemplary; it may be desirable to provide much greater thicknesses, e.g., to provide more of a barrier to sodium ion diffusion.

In certain embodiments, the base film 15 comprises or consists essentially of silica and alumina. The entire thickness of the base film, for example, can optionally comprise a mixed oxide of silica and alumina. Such a mixed oxide film can be formed by sputtering an alloy target that includes silicon and aluminum, for example about 50% silicon and about 50% aluminum, or about 25% silicon and about 75% aluminum, about 75% silicon and about 25% aluminum, or about 85% silicon and about 15% aluminum. Such alloy targets can be sputtered in an oxidizing atmosphere. A mixed film of this nature can also be formed by co-sputtering two targets, wherein one target is a silicon target and the other target is an aluminum target. Co-sputtering can be performed in an oxidizing atmosphere. In other embodiments, the base film 15 comprises or consists essentially of alumina. Alumina is believed to be a good barrier to sodium ion diffusion. And it may help improve performance of the coated substrate in certain testing (e.g., 100% relative humidity testing).

In still other embodiments, the base film 15 comprises or consists essentially of silicon nitride. One embodiment provides a substrate on which there is a low-maintenance coating comprising the following films in sequence: substrate/film comprising silicon nitride/film comprising both titanium oxide and tungsten oxide. In this embodiment, there can optionally be one or more additional films under, between, and/or over the noted films. Alternatively, the film comprising silicon nitride can be contiguous to the substrate, and the film comprising titanium oxide/tungsten oxide can be contiguous to the film comprising silicon nitride. If desired, these two films can have a combined thickness of less than 350 Å. In the present embodiment, the films comprising, respectively, silicon nitride and titanium oxide/tungsten oxide can have any of the properties and characteristics described herein for the functional film 50 and the base film 15, respectively.

In some preferred embodiments, the low-maintenance coating is provided with an average surface roughness Ra of between 0.35 nm and 5.0 nm, such as between 0.35 nm and 4.0 nm, and in some cases between 0.4 nm and 3.0 nm. Conventional DC reactive sputtering may provide a surface roughness of about 0.3 nm for a coating consisting of a first layer comprising silica at about 75 Å and an overlying $TiO_2$ layer at about 25-45 Å. In the present embodiments, special techniques can be used to provide the coating with an average surface roughness in the specified ranges. The base film, for example, can be sputter deposited using a special high rate process (e.g., using a large amount of argon). When a high rate process is used, the base film tends to develop a surface roughness within the noted ranges (other appropriate deposition methods, other starting materials, and/or post-deposition treatments could also be used to provide the noted surface roughness levels, and such other means are within the scope of the present embodiments). When the functional film 50 is then deposited over this controlled-roughness base film, the resulting low-maintenance coating can have an advantageous level of surface roughness. Additionally or alternatively, the functional film 50 can be sputter deposited using a high rate process (e.g., using an oxide target, a large amount argon, or both). It is surmised that the resulting level of surface roughness contributes to the coating's ability to achieve good photoactivity while being provided at such a small thickness.

In the present controlled-surface-roughness embodiments, the coating still is relatively smooth compared to films produced by many other conventional methods that yield high surface roughness. In this regard, the present films are designed to have a level of surface roughness that inhibits dirt particles from becoming trapped in the roughness of the coating. When dirt particles get trapped in the roughness of a coating, it can be difficult to rinse away the trapped particles. The photoactivity of the coating does not break down inorganics/minerals, so they may stay trapped in the coating. In contrast, the present low-maintenance coating can be designed to be smooth enough that many dirt particles are simply too big to get trapped in the roughness of the coating, thereby allowing those particles to be readily rinsed away.

One group of embodiments provides the low-maintenance coating 50 with a base film 15 that is a high-rate sputtered film, which (as an example) can be deposited from at least one target in an atmosphere into which both inert gas and reactive gas are flowed. Preferably, the ratio of the inflow rate for the inert gas (e.g., Ar) divided by the inflow rate for the reactive gas (e.g., $O_2$) is between 0.4 and 9, such as between 0.4 and 6, commonly between 0.4 and 2.5, and in some cases between 0.5 and 2. In some embodiments, the reactive gas consists essentially of oxygen, nitrogen, or both. Some embodiments provide the base film as a film comprising $SiO_2$ or $Si_3N_4$. In certain embodiments, the high-rate sputtering technique for depositing the base film involves a plurality of targets each carrying a sputterable material consisting essentially of: 1) one or more metals, or 2) one or more semi-metals, or 3) at least one metal and at least one semi-metal. As one example, the high-rate base film can comprise silica sputtered from targets consisting of about 85% silicon and about 15% aluminum in an atmosphere into which argon is flowed at about 40-85% with the remainder being oxygen.

Additionally or alternatively, the functional film 50 can be a high-rate sputtered film, which (as an example) can be deposited from at least one target having a sputterable material comprising both titanium oxide and tungsten oxide. In connection with the atmosphere used to sputter deposit the functional film 50, the ratio of the inflow rate for the inert gas (e.g., Ar) divided by the inflow rate for the reactive gas (e.g., $O_2$) preferably is between 0.4 and 9, such as between 0.4 and 6. The functional film 50 can, for example, be sputtered from oxide targets in an atmosphere into which argon is flowed at about 85% with the remainder being oxygen. In some embodiments, the oxide targets have a sputterable material comprising: i) tungsten in oxide form, ii) TiO, and iii) $TiO_2$. In some cases, the oxide target comprises a sputterable material consisting essentially of titanium oxide and tungsten oxide, where the titanium is present at about 59-74 weight %, the tungsten is present at about 1.4-3.8 weight %, and the oxygen is present at about 23.3-38.6 weight %. The specific composition, of course, will vary depending upon the requirements for a particular product.

In the present embodiments (where the coating includes a high-rate base layer, a high-rate functional film, or both), the coating can have a surface roughness within one or more of the ranges noted herein. Of course, different applications may call for different levels of surface roughness, so these ranges are not required. Similarly, the coating in the present embodiments can have the small thickness and high acetone decomposition levels specified herein. However, this is not strictly required either, since different products may call for different thicknesses, different photoactivity levels, etc.

When the coating consists essentially of sputtered film, it can have a high degree of thickness uniformity. In such embodiments, the physical thickness of the coating preferably varies by less than 40 Å, and more preferably by less than 20 Å, across the area of the coating. That is, the maximum local thickness of the coating preferably is not more than 40 Å greater (e.g., not more than 20 Å greater) than the minimum local thickness of the coating, taking into account the thickness of the coating at all regions. The thickness uniformity of such a sputtered coating can provide particularly uniform properties (color, visible reflection, lack of haze, etc.).

Some embodiments provide the low-maintenance coating with a base film 15 and a functional film 50 having a combined thickness of less than about 350 Å, or even less than 300 Å.

Certain embodiments provide the low-maintenance coating with only a single photocatalytic layer (e.g., only one layer including titanium oxide). And yet the coating 80 in these embodiments preferably achieves the acetone deposition rates described herein (e.g., even when the thickness of the sole photocatalytic layer is less than 150 Å, or less than 100 Å). Preferably, the layer 50 in these embodiments contains both titanium oxide and tungsten oxide throughout the entire thickness of the layer 50. More generally, the single photocatalytic layer of the present embodiments can have the properties and characteristics (thickness, tungsten load, surface roughness, product-by-process distinction, etc.) of any embodiment described herein. Further, in the present embodiments, the coating preferably includes the optional base layer 15. As with the photocatalytic layer, the base layer (when provided in the present embodiments) can have the properties and characteristics (thickness, surface roughness, product-by-process distinction, etc.) of any embodiment described herein. In the present embodiments, the coating can be very thin (hence having little or no color) and yet can achieve surprisingly high photoactivity rates. The inventors have discovered that this good photoactivity can be achieved even when the coating is so thin that it presents essentially no visible defects if the coating is scratched or otherwise damaged. Thus, even if the coating is damaged, the damage can be invisible or at least inconspicuous.

In some embodiments, the coating consists essentially of two layers: a base film 15 and a functional film 50. In other embodiments, between the substrate and a base film 15 there is provided at least one other film, e.g., an optional innermost layer can comprise silica or silicon nitride, and the base film 15 can comprise alumina, titania, tungsten oxide, or zirconia. Many other variants are possible and will be apparent to skilled artisans given the present teaching as a guide.

Figure 4:
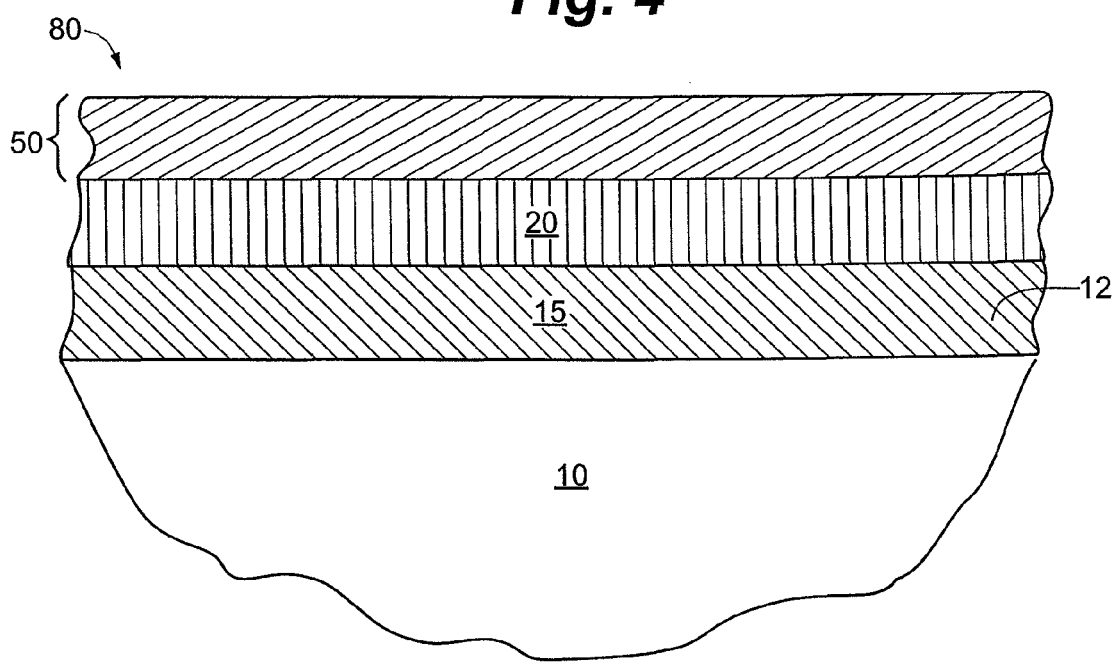
FIG. 4 is a schematic cross-sectional view of a substrate having a major surface carrying a low-maintenance coating in accordance with certain embodiments.
Figure 5:
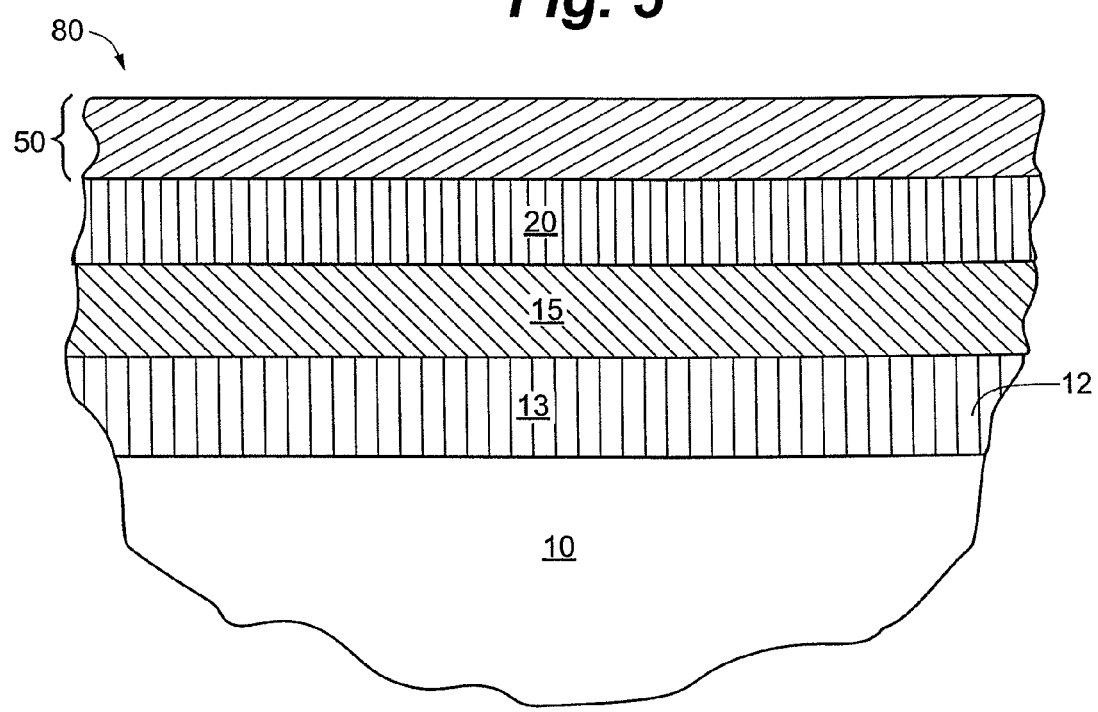
FIG. 5 is a schematic cross-sectional view of a substrate having a major surface carrying a low-maintenance coating in accordance with certain embodiments.

Additionally or alternatively, the low-maintenance coating 80 can optionally include at least one additional film 20 between the functional film 50 and a base film 15. FIGS. 4 and 5 show a single intermediate film 20 of this nature. However, multiple intermediate films can be provided, if so desired. When provided, such film(s) 20 can comprise various materials, such as silica, alumina, titania, zirconia or tungsten oxide to name just a few.

Table 1 below shows an embodiment where the low-maintenance coating 80 has a total thickness of about 270 Å. It is to be appreciated, however, that the coating 80 can have much larger thicknesses, depending on the requirements of the intended application. Smaller thicknesses are also anticipated.

Following are several exemplary embodiments.

TABLE 1

(Coating #1)

| Component | Material (comprising, consisting essentially of, or consisting of) | Thickness |
|---|---|---|
| Functional Film 50 | Titania and tungsten oxide | 50-80 Å, e.g., 70 Å |

TABLE 1-continued (Coating #1)

| Component | Material (comprising, consisting essentially of, or consisting of) | Thickness |
|---|---|---|
| Base Film 15 | Silicon-containing film, optionally comprising $SiO_2$ or $Si_3N_4$ | 50 Å-400 Å, e.g., 200 Å |
| Substrate | Glass | — |

TABLE 2

(Coating #2)

| Component | Material (comprising, consisting essentially of, or consisting of) | Thickness |
|---|---|---|
| Functional Film 50 | Titania and tungsten oxide | 50-80 Å, e.g., 70 Å |
| Base Film 15 | Alumina | 50 Å-400 Å, e.g., 200 Å |
| Substrate | Glass | — |

TABLE 3

(Coating #3)

| Component | Material (comprising, consisting essentially of, or consisting of) | Thickness |
|---|---|---|
| Functional Film 50 | Titania and tungsten oxide | 50-80 Å, e.g., 70 Å |
| Intermediate Film 20 | Silicon-containing film, optionally comprising $SiO_2$ or $Si_3N_4$ | 10 Å-300 Å, e.g., 40 Å |
| Base Film 15 | Alumina | 10 Å-300 Å, e.g., 30 Å |
| Substrate | Glass | — |

TABLE 4

(Coating #4)

| Component | Material (comprising, consisting essentially of, or consisting of) | Thickness |
|---|---|---|
| Functional Film 50 | Titania and tungsten oxide | 50-80 Å, e.g., 70 Å |
| Intermediate Film 20 | Alumina | 10 Å-300 Å, e.g., 40 Å |
| Base Film 15 | Silicon-containing film, optionally comprising $SiO_2$ or $Si_3N_4$ | 10 Å-300 Å, e.g., 30 Å |
| Substrate | Glass | — |

In FIG. 5, the low-maintenance coating 80 includes a film 13 between the substrate 10 and a base film 15. When provided, film 13 can comprise, for example, a transparent conductive oxide (TCO) film. Film 13 can optionally be in direct contact with both the substrate 10 and the base film 15. This, however, is not required. For example, one or more other films (such as a single film comprising silica, or a film sequence comprising SiO/SnO/SiO) can be provided between the substrate 10 and film 13. Additionally or alternatively, films 15 and/or 20 can be omitted, if so desired. In certain embodiments, film 13 is a semi-conductor film. Suitable TCO films include zinc aluminum oxide, fluorine-doped tin oxide, and indium tin oxide. In some embodiments, film 13 is provided at a thickness of 10,000 Å or less, such as between about 1,000 Å to about 7,000 Å, e.g., about 3,000 Å. By providing a transparent conductive film 13 under the low-maintenance coating 80, it is possible to reduce the overall U value of a glazing incorporating the coated substrate.

Following are a few exemplary embodiments.

TABLE 5

(Coating #5)

| Component | Material (comprising, consisting essentially of, or consisting of) | Thickness |
|---|---|---|
| Functional Film 50 | Titania and tungsten oxide | 50-80 Å, e.g., 70 Å |
| Intermediate Film 20 | Silicon-containing film, optionally comprising $SiO_2$ or $Si_3N_4$ | 10 Å-300 Å, e.g., 40 Å |
| Base Film 15 | Alumina | 10 Å-300 Å, e.g., 30 Å |
| Semi-Conductor Film 13 | Transparent Conductive Oxide (zinc aluminum oxide, ITO, fluorine-doped tin oxide, or any other TCO) | 1,000 Å-7,000 Å, e.g., 3,000 Å |
| Substrate | Glass | — |

TABLE 5A (Coating #5A)

| Component | Material (comprising, consisting essentially of, or consisting of) | Thickness |
|---|---|---|
| Functional Film 50 | Titania and tungsten oxide | 50-80 Å, e.g., 70 Å |
| Intermediate Film 20 | Silicon-containing film, optionally comprising $SiO_2$ or $Si_3N_4$ | 10 Å-300 Å, e.g., 70 Å |
| Semi-Conductor Film 13 | Transparent Conductive Oxide (zinc aluminum oxide, ITO, fluorine-doped tin oxide, or any other TCO) | 1,000 Å-7,000 Å, e.g., 3,000 Å |
| Barrier Layer | Silicon-containing film, optionally comprising $SiO_2$ or $Si_3N_4$ | 10 Å-800 Å, e.g., 500 Å |
| Substrate | Glass | — |

TABLE 5B (Coating #5B)

| Component | Material (comprising, consisting essentially of, or consisting of) | Thickness |
|---|---|---|
| Functional Film 50 | Titania and tungsten oxide | 50-80 Å, e.g., 70 Å |
| Intermediate Film 20 | Alumina | 10 Å-300 Å, e.g., 70 Å |
| Semi-Conductor Film 13 | Transparent Conductive Oxide (zinc aluminum oxide, ITO, fluorine-doped tin oxide, or any other TCO) | 1,000 Å-7,000 Å, e.g., 3,000 Å, |
| Barrier Layer | Silicon-containing film, optionally comprising $SiO_2$ or $Si_3N_4$ | 10 Å-800 Å, e.g., 500 Å |
| Substrate | Glass | — |

One group of embodiments provides a substrate with a major surface on which the following films are coated in sequence, moving outwardly from the major surface: (1) a first functional film comprising a material selected from the group consisting of zinc aluminum oxide, indium tin oxide, and fluorine-containing tin oxide; and (2) a second functional film comprising both titanium oxide and tungsten oxide. In some of these embodiments, a thickness ratio defined as the thickness of the second functional film divided by the thickness of the first functional film is between about 0.004 and about 0.08, and perhaps more preferably between about 0.004 and about 0.025. In one example, the second functional film has a thickness of about 70 Å and the first functional film (e.g., transparent conductive oxide layer) has a thickness of about 3,000 Å, such that the noted thickness ratio is about 0.023. In another example, the second functional film has a thickness of about 70 Å and the first functional film has a thickness of about 2,000 Å, such that the noted thickness ratio is about 0.035. In still another example, the second functional film 50 has a thickness of about 70 Å and the first functional film has a thickness of about 5,000 Å, such that the noted thickness ratio is about 0.014. In yet another example, the second functional film 50 has a thickness of about 50 Å and the first functional film has a thickness of about 3,000 Å, such that the noted thickness ratio is about 0.016. In some of the present embodiments, the noted thickness ratio is within one or more of the specified ranges in combination with the second functional film being less than 200 angstroms thick, e.g., less than 100 angstroms thick, and/or the first functional film is less than 5,500 angstroms thick, or even less than 3,500 angstroms thick.

Figure 6:
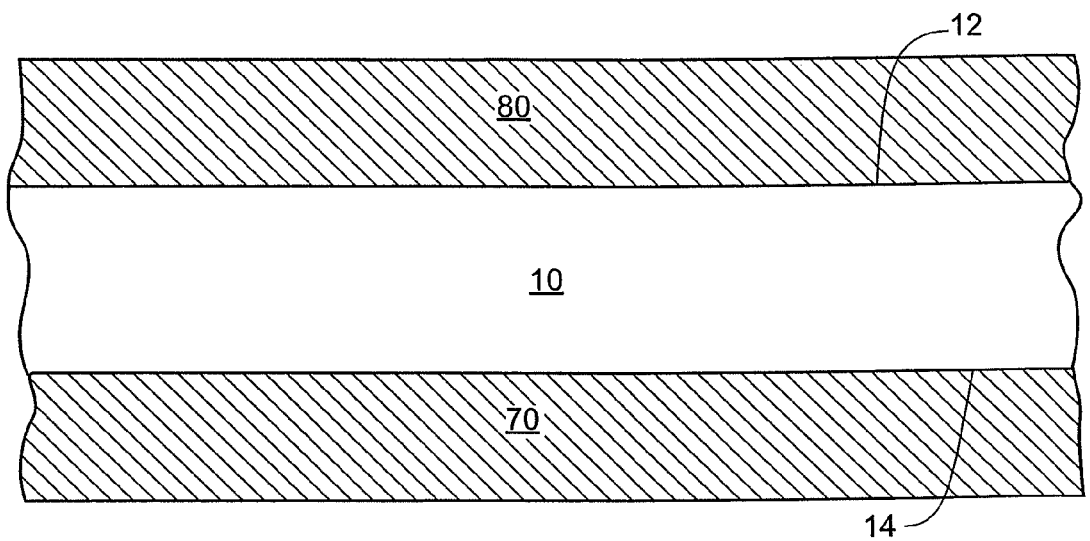
FIG. 6 is a schematic cross-sectional view of a substrate having one surface carrying a low-maintenance coating and another surface carrying an additional functional coating in accordance with another embodiment.

In some cases, the low-maintenance coating 80 is provided on one major surface of the substrate and another functional coating 70 is provided on an opposite major surface of the same substrate. FIG. 6 illustrates one such embodiment. Here, the substrate 10 has a first surface 12 bearing the low-maintenance coating 80 and a second surface 14 bearing another functional coating 70. Functional coating 70 can be a single layer or a stack of layers. Various functional coatings can be used. In some cases, the functional coating 70 is a low-emissivity coating. In some embodiments, the coating 70 has three or more infrared-reflective layers (e.g., silver-containing layers). Low-emissivity coatings with three or more infrared-reflective layers are described in U.S. patent application Ser. Nos. 11/546,152, 11/545,323, 11/545,231, 11/545,212, 11/545,211, 11/398,345, and 11/360,266, the salient teachings of each of which are incorporated herein by reference. In other cases, functional coating 70 can be a "single silver" or "double silver" low-emissivity coating, which are well-known to skilled artisans. When provided, functional coating 70 can alternatively comprise a transparent conductive oxide (TCO) layer, as will now be discussed.

One particular product includes the following sequence: film comprising both titanium oxide and tungsten oxide/substrate/film comprising silicon/film comprising zinc aluminum oxide. As just one example, the film comprising silicon can include silicon oxide (e.g., $SiO_2$). The zinc aluminum oxide can optionally have a thickness of less than 8,000 Å, less than 7,000 Å, or even less than 6,500 Å, such as about 6,000 Å. The film comprising both titanium oxide and tungsten oxide can optionally have a thickness of less than 200 Å, such as less than 100 Å. The substrate can be glass, such as soda-lime glass. The noted sequence can include other films in addition to those shown. As just one example, the article can include the following sequence: film comprising both titanium oxide and tungsten oxide/film comprising silicon oxide/substrate/film comprising silicon oxide/film comprising zinc aluminum oxide. Additional films, layers, substrates, contacts, etc. can also be provided.

Figure 7:
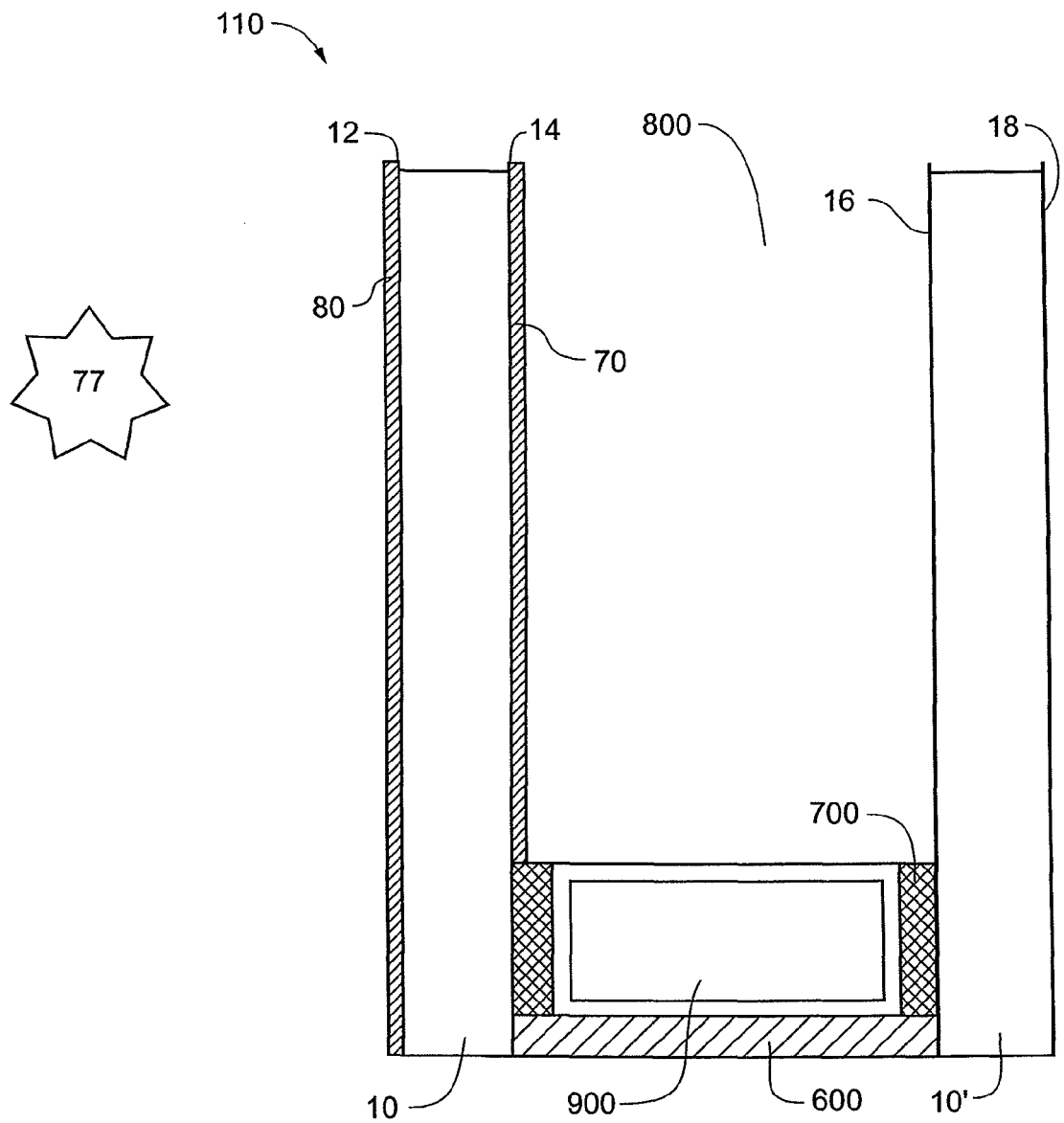
FIG. 7 is a partially broken-away schematic cross-sectional side view of a multiple-pane insulating glazing unit that includes an exterior pane having a first surface carrying a low-maintenance coating and a second surface carrying an additional functional coating in accordance with certain embodiments.
Figure 8:
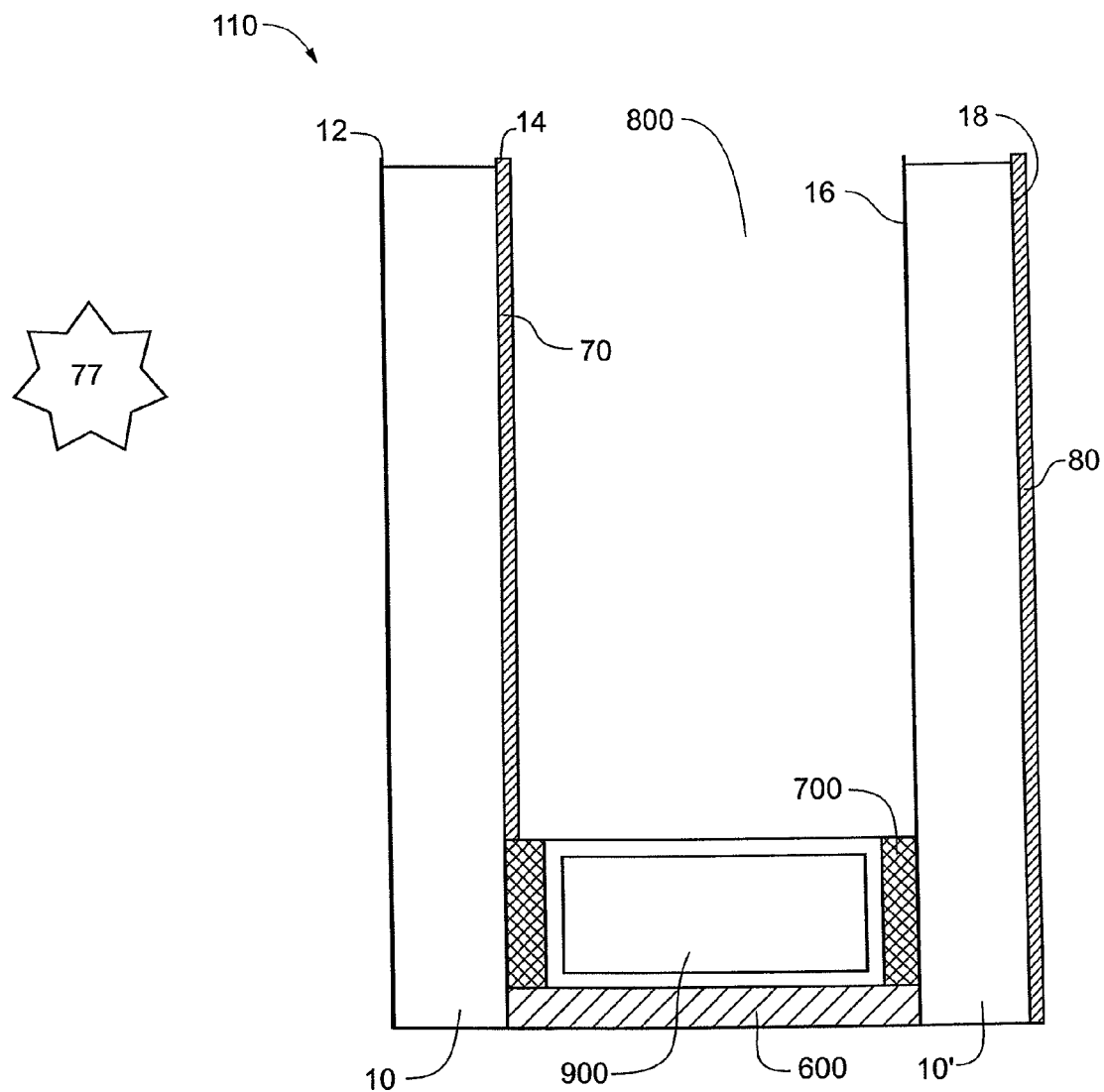
FIG. 8 is a partially broken-away schematic cross-sectional side view of a multiple-pane insulating glazing unit that includes an exterior pane having a second surface carrying a functional coating and an interior pane having a fourth surface carrying a low-maintenance coating in accordance with certain embodiments.

With reference to FIGS. 7 and 8, the substrate 10 can optionally be a transparent pane that is part of an insulating glazing unit 110. Typically, an insulating glazing unit 110 has an exterior pane 10 and an interior pane 10' separated by a between-pane space 800. A spacer 900 (which can optionally be part of a sash) is commonly provided to separate the panes 10 and 10'. The spacer 900 can be secured to the interior surfaces of each pane using an adhesive or seal 700. In some cases, an end sealant 600 is also provided. In the illustrated embodiment, the exterior pane 10 has an exterior surface 12 (the #1 surface) and an interior surface 14 the #2 surface). The interior pane 10' has an interior surface 16 (the #3 surface) and an exterior surface 18 (the #4 surface). The unit can optionally be mounted in a frame (e.g., a window frame) such that the exterior surface 12 of the exterior pane 10 is exposed to an outdoor environment 77 while the exterior surface 18 of the interior pane 10' is exposed to a room-side interior environment. Interior surfaces 14 and 16 are both exposed to the atmosphere in the between-pane space 800 of the insulating glazing unit.

In the embodiment of FIG. 7, the exterior surface 12 of pane 10 has the low-maintenance coating 80. In the embodiment of FIG. 8, the exterior surface 18 of pane 10' has the low-maintenance coating 80. In other embodiments, both exterior major surfaces of an IG unit have low-maintenance coatings. The coating(s) 80 can be in accordance with any embodiment described in this disclosure. If desired, the coating 80 can be one of those described in Tables 1-5B. In other words, any of Coatings #1-5B in Tables 1-5B (or any other embodiment of the low-maintenance coating disclosed herein) can be provided on exterior surface 12, exterior surface 18, or both. The interior surface 14 of pane 10 can optionally have a functional coating 70 selected from the group consisting of a low-emissivity coating and a transparent conductive oxide coating. The IG unit can have two, three, or more panes. For example, one group of embodiments provides a triple-pane insulating glazing unit having at least one exterior surface bearing the low-maintenance coating.

Figure 9:
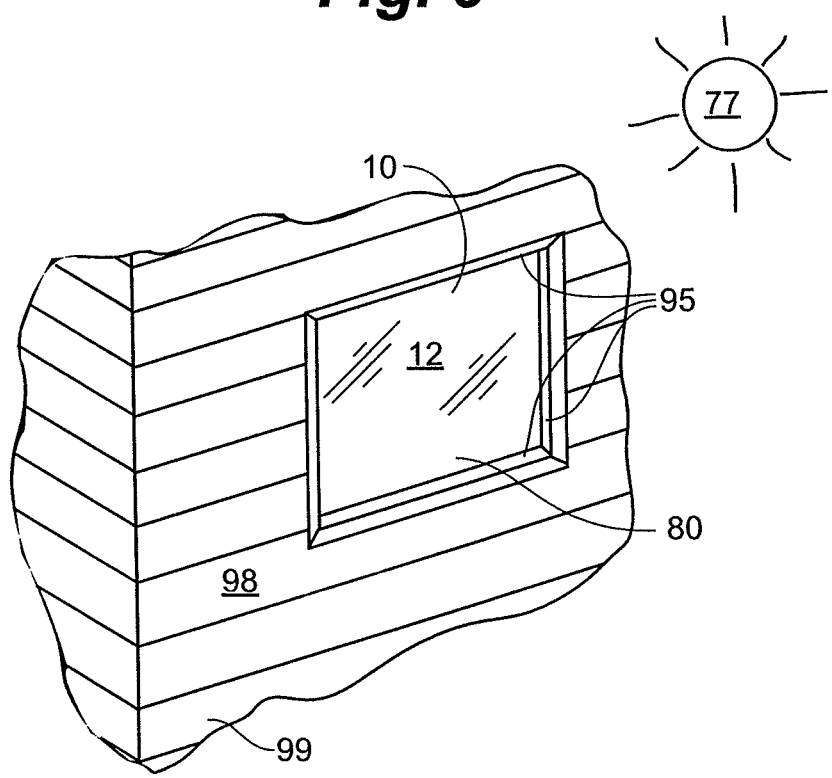
FIG. 9 is a partially broken-away perspective view of a window pane having a major surface carrying a low-maintenance coating, the pane being mounted in an exterior wall of a building in accordance with certain embodiments.

FIG. 9 exemplifies embodiments where the substrate 10 is a window pane mounted on a window frame 95 (e.g., in an exterior wall 98 of a building 99). In certain applications, the first surface of the window carries the low-maintenance coating 80. In some embodiments of this nature, coated surface 12 is exposed to an outdoor environment 77 (e.g., so as to be in periodic contact with rain).

The invention also provides methods for producing low-maintenance products. In these methods, each film of the coating 80 can generally be deposited by a variety of well known coating techniques. Suitable coating techniques include, but are not limited to, chemical vapor deposition (CVD), plasma enhanced chemical vapor deposition, pyrolytic deposition, sol-gel deposition and sputtering. In preferred embodiments, the films are deposited by sputtering.

Some embodiments involve depositing the low-maintenance coating so as to have an average surface roughness Ra, as deposited, of between 0.35 nm and 3.0 nm, such as between 0.35 nm and 3.0 nm, and in some cases between 0.35 nm and 1.5 nm. Different applications, however, may require different levels of photoactivity, different levels of surface roughness, etc., so the noted roughness ranges are not required in all embodiments.

Figure 10:
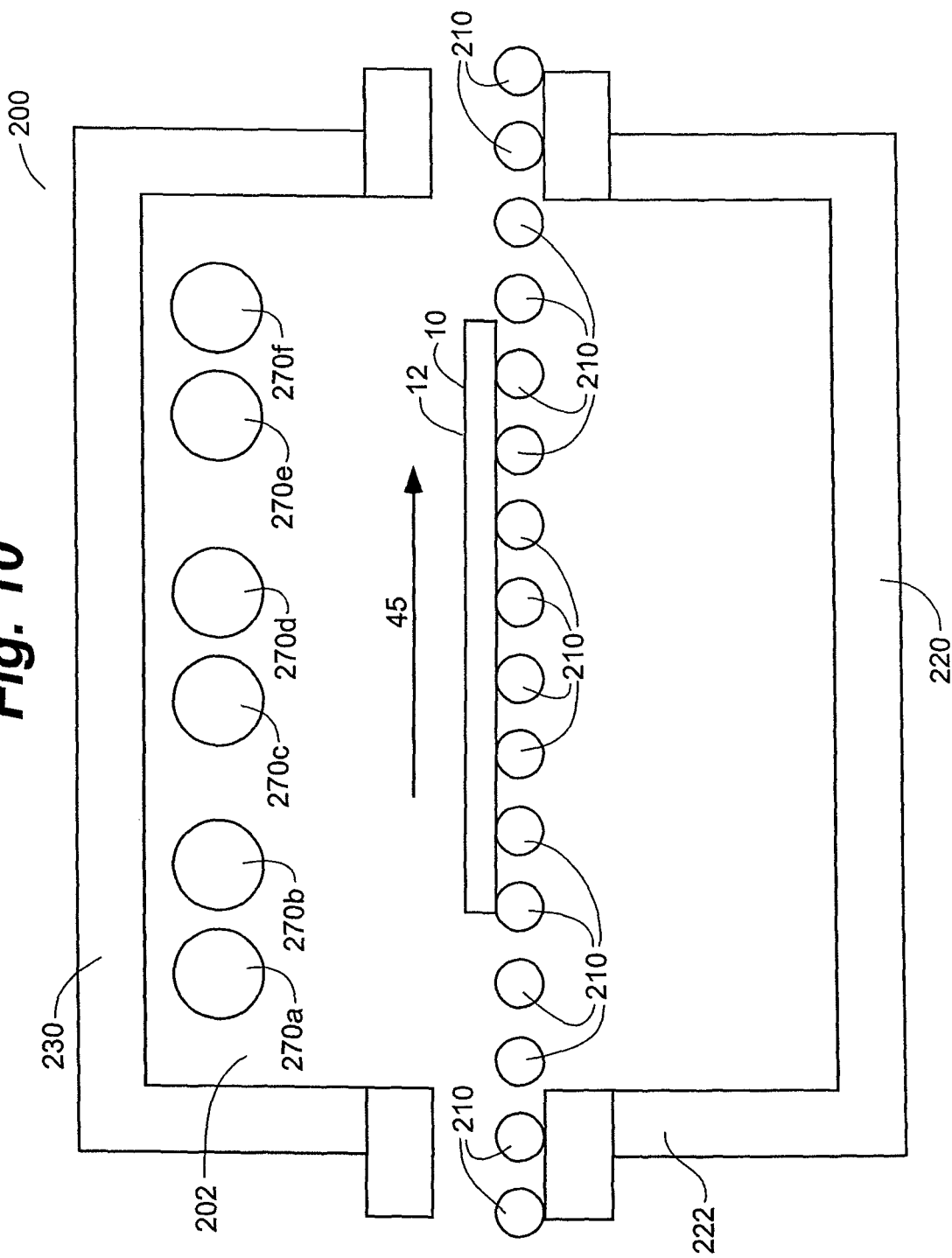
FIG. 10 is a schematic side view of a downward sputtering chamber adapted for use in certain methods.
Figure 11:
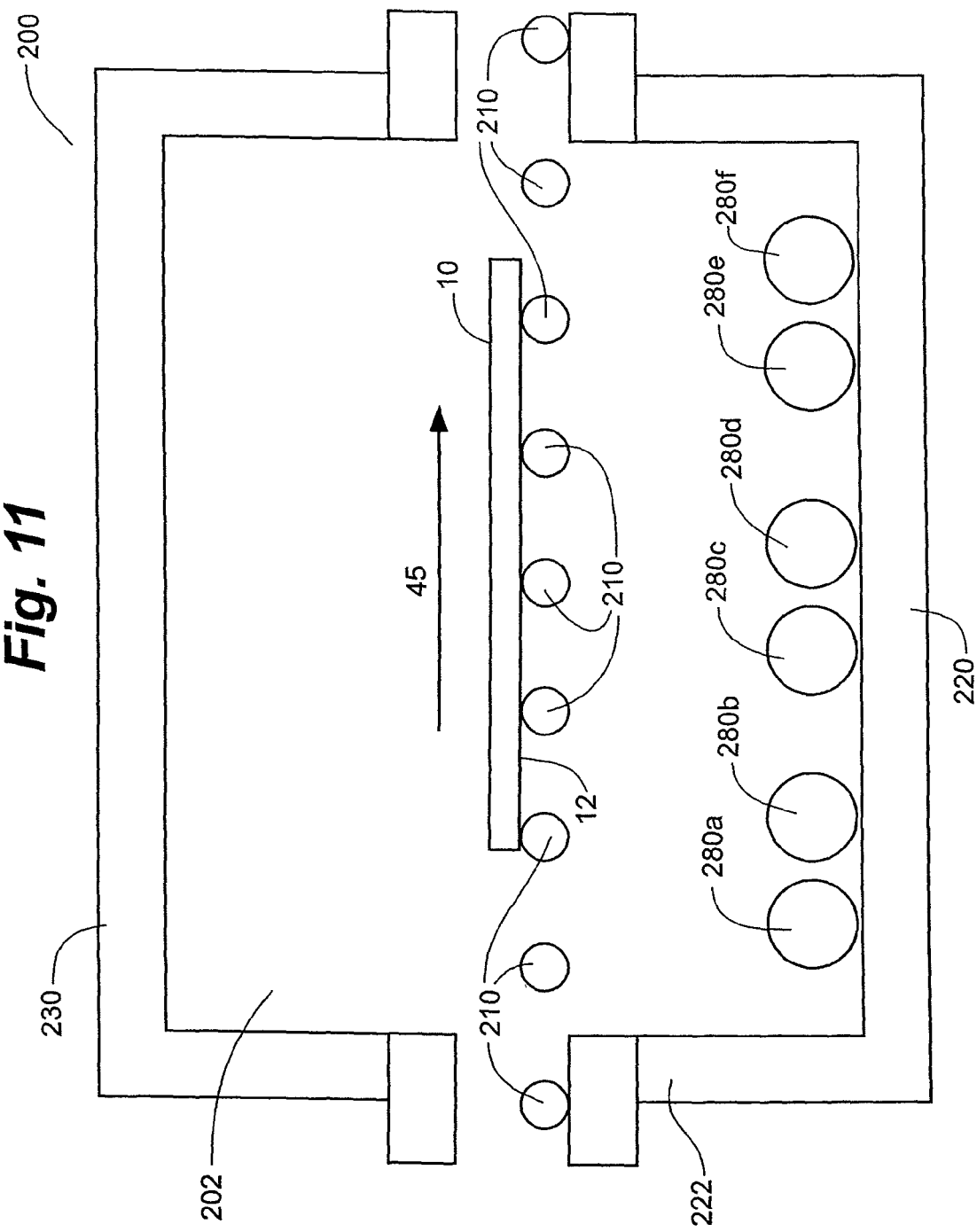
FIG. 11 is a schematic side view of an upward sputtering chamber adapted for use in certain methods.
Figure 12:
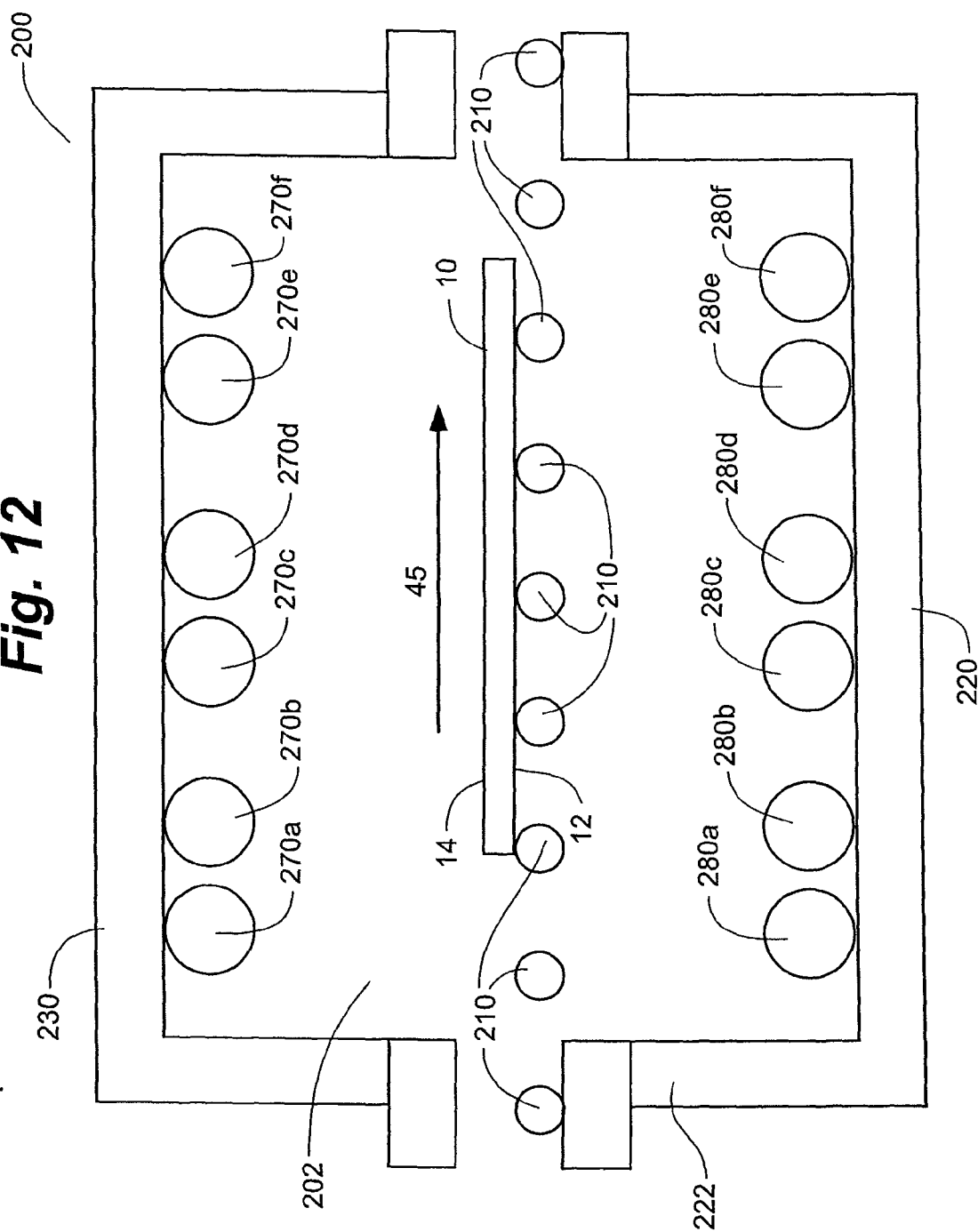
FIG. 12 is a schematic side view of a dual-direction sputtering chamber adapted for use in certain methods.

FIGS. 10-12 each schematically depict a coat zone 200 that can be used to deposit one or more films of the low-maintenance coating 80. FIGS. 10-12 depict six targets above and/or below the path of substrate travel in each coat zone. One or more of the adjacent target pairs, however, can be replaced with a single target, if so desired. In practice, each adjacent pair of targets may be in its own chamber (or "bay"), and the chambers may be grouped into separate coat zones. Since many different types of coaters can be used, these details are by no means limiting.

Sputtering chambers and related equipment are commercially available from a variety of sources (such as Applied Materials or Leybold). Useful magnetron sputtering techniques and equipment are described in U.S. Pat. No. 4,166,018, issued to Chapin, the salient teachings of which are incorporated herein by reference. In FIGS. 10-12, each coat zone 200 is shown as being a single chamber that includes a base (or "floor") 220, a plurality of side walls 222, and a ceiling (or "top lid" or "cover") 230, together bounding a sputtering cavity 202. However, each coat zone may actually comprise a series of chambers. The chambers can be connected by a series of tunnels or inter-stage sections. The substrate 10 is conveyed along the path of substrate travel 45 during film deposition, optionally over a plurality of spaced-apart transport rollers 210.

In FIG. 10, upper targets 270a-270f are mounted above the path of substrate travel 45. Thus, the coat zone of FIG. 10 operates as a downward sputtering chamber. In FIG. 11, lower targets 280a-280f are mounted beneath the path of substrate travel 45. Thus, the coat zone of FIG. 11 operates as an upward sputtering chamber. In FIG. 12, both upper targets 270a-270f and lower targets 280a-280f are provided. One or more films of the low-maintenance coating 80 can therefore be sputter deposited onto one side of the substrate, while one or more films of another functional coating 70 are simultaneously sputtered onto the other side of the substrate. Thus, the coat zone of FIG. 12 can operate as a dual-direction sputtering chamber. Dual-direction sputtering chambers are described in U.S. Pat. No. 6,964,731, the teachings of which concerning dual-direction sputtering chambers are incorporated herein by reference. FIGS. 10 and 11 each show six total targets, and FIG. 12 shows 12 total targets, but this is by no means required. Rather, any suitable number of targets can be provided. Moreover, FIGS. 10-12 show cylindrical targets, but planar targets can also be used (in combination with, or in place of, cylindrical targets).

In certain embodiments, the substrate 10 is subjected to one or more heat treatments. The substrate, for example, can optionally be heat treated before and/or after the low-maintenance coating has been deposited. The substrate can also be heat treated during deposition of the low-maintenance coating. For example, the substrate can optionally be heated in one or more chambers in which at least some of the film comprising titania is deposited. In some embodiments, the low-maintenance coating 80 includes a base film 15 and the substrate is heat treated before, after, or during deposition of the base film 15. It is to be appreciated, though, that the coating is not required to undergo any heating before, during, or after deposition.

Figure 13:
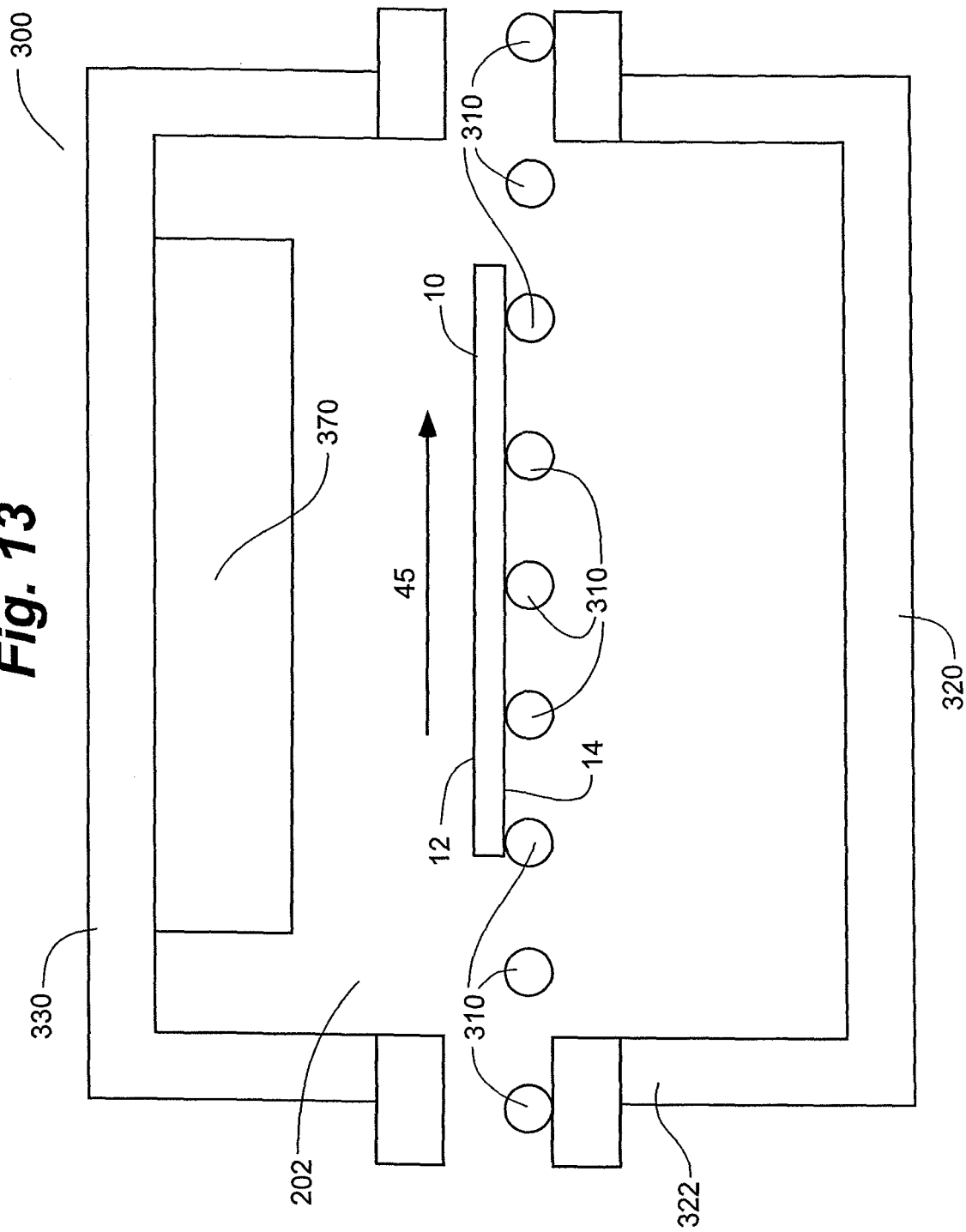
FIG. 13 is a schematic side view of a downward heating chamber adapted for use in certain methods.
Figure 14:
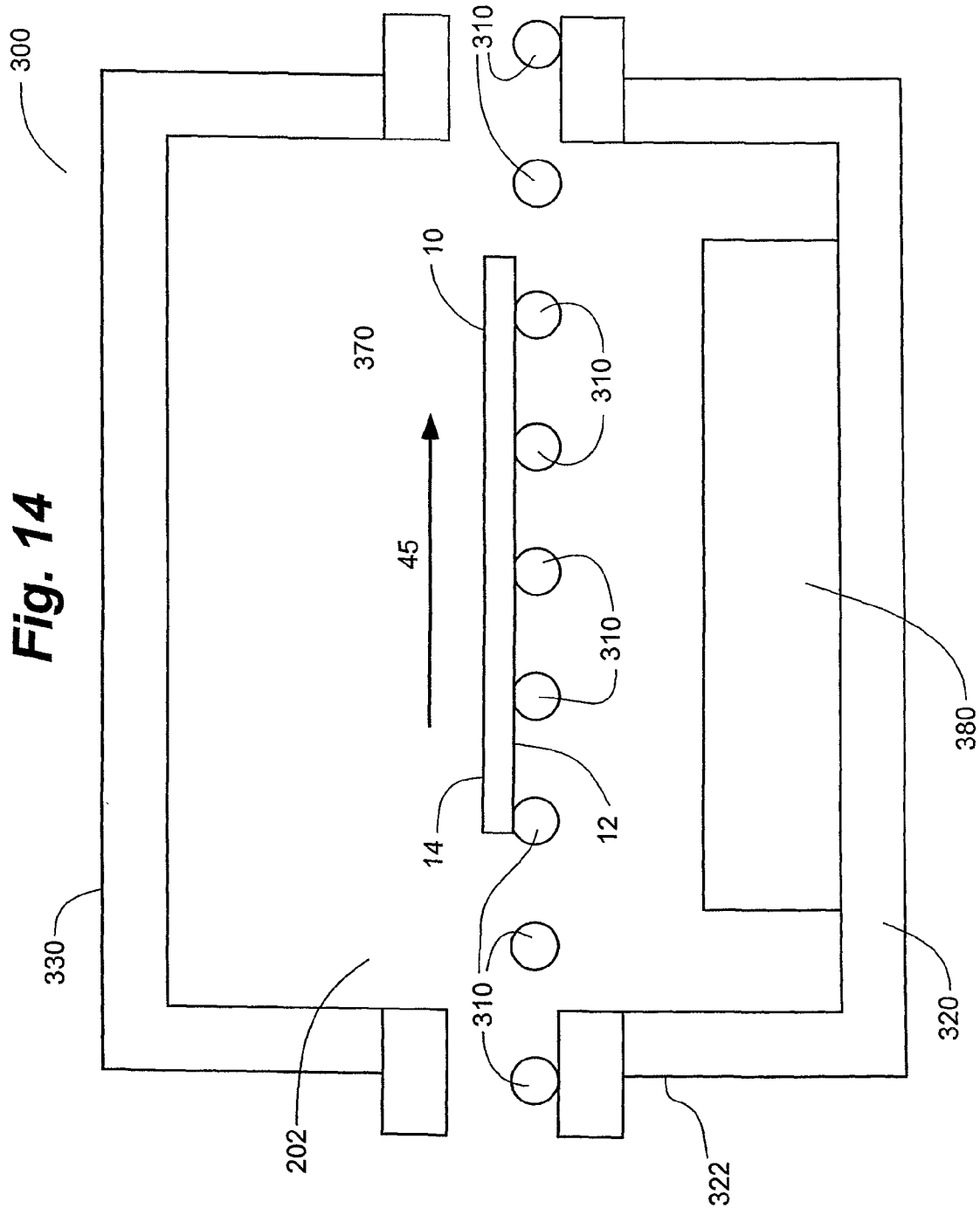
FIG. 14 is a schematic side view of an upward heating chamber adapted for use in certain methods.

In some embodiments, heat treatment occurs in a heating chamber that is part of a coater. Reference is made to FIGS. 13 and 14, which illustrate two exemplary heating chambers 300. Here, the heating chamber 300 includes a base (or "floor") 320, a plurality of side walls 322, and a ceiling (or "top lid" or "cover") 330, together bounding a heating cavity 202. When provided, the heating device 370, 380 is adjacent to the path of substrate travel. In FIG. 13, the heating device 370 is mounted above the path of substrate travel. The heating chamber of FIG. 13 may be particularly useful for heating a substrate on which a low-maintenance coating is deposited by downward sputtering, such as in a downward sputtering chamber (as illustrated by FIG. 10) or a dual-direction sputtering chamber (as illustrated by FIG. 12). In FIG. 14, the heating device 380 is mounted beneath the path of substrate travel. The heating chamber of FIG. 14 may be particularly useful for heating a substrate on which a low-maintenance coating is deposited by upward sputtering, such as in an upward sputtering chamber (as illustrated by FIG. 11) or a dual-direction sputtering chamber (as illustrated by FIG. 12). The heating device 370, 380 can also be used in conjunction with deposition methods other than sputtering.

The heating device 370, 380 can include any apparatus known in the art for heating glass substrates or the like. The device 370, 380, for example, can be a resistance heater. In certain embodiments, the heating device includes ceramic heaters, such as radiant quartz heaters. One suitable heater is a High Intensity Quartz Faced Radiant Heater sold commercially by Chromalox, Inc., a corporation having its headquarters in Pittsburgh, Pa., USA. In other embodiments, flash lamps are used for heating. Ceramic infrared heaters are available from a variety of commercial suppliers, such as National Plastic Heater Sensor & Control Inc. (Scarborough, Ontario, Canada).

While FIGS. 13 and 14 illustrate heating chambers that perform the heat treating, heat treatments can alternatively (or additionally) be performed at other locations inside a coater. For example, the heat treatments can be performed inside a deposition chamber, such as inside a sputtering chamber. Thus, a heating device can be provided inside a deposition chamber. For example, the heating device can be mounted below the path of substrate travel 45 in a downward deposition chamber (such as a downward sputtering chamber). As another alternative, the heating device can be mounted above the path 45 in an upward deposition chamber (such as an upward sputtering chamber). The heating device can be mounted at a position inside a deposition chamber upstream from where deposition takes place, downstream from where deposition takes place, or at a location where deposition takes place.

Heating can also be made to occur inside a deposition chamber by adjusting the deposition parameters to increase the temperature of the substrate. Methods of adjusting the deposition parameters are known to skilled artisans and need not be discussed in detail. In some cases, the deposition chamber is a sputtering chamber and helium or hydrogen is added to the sputtering atmosphere. In other cases, AC sputtering can be used, rather than DC sputtering, so as to increase the temperature of the substrate. Thus, the substrate can optionally be heated in at least one deposition chamber in which the functional film 50 is deposited, and the heating may be caused at least in part by the sputtering process itself.

Figure 15:
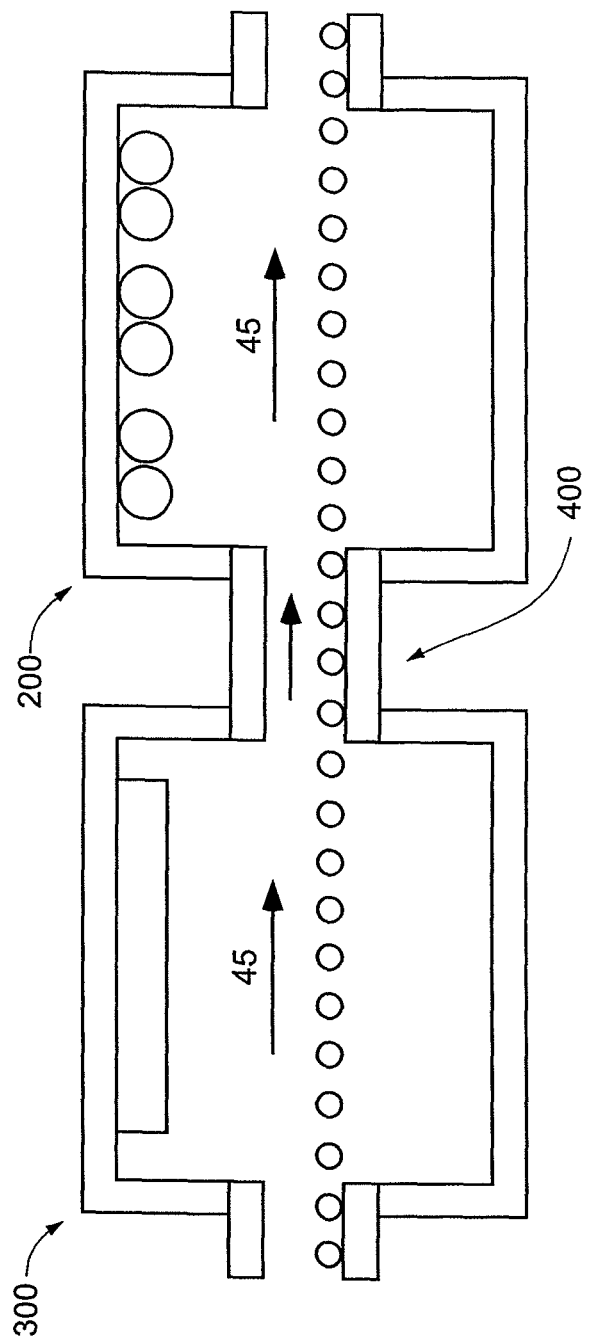
FIG. 15 is a schematic side view of an inter-stage section adapted for use in certain methods.

In some embodiments, heat treatment takes place at an inter-stage section 400 of a coater (i.e., in a non-deposition section between neighboring deposition chambers). In some cases, the inter-stage section 400 comprises a tunnel. FIG. 15 schematically illustrates an inter-stage section 400 connecting a heating chamber 300 and a sputtering chamber 200. Skilled artisans will understand that the inter-stage section 400 can instead connect two sputtering chambers or other sections of a coater. Preferably, transport rollers extend from one chamber, through the inter-stage section 400, and into the next chamber. The substrate thus travels from one chamber to the next by passing through section 400. Typically, as substrates are transported from one chamber to the next, heat from the substrate is lost. Thus, in certain embodiments, the inter-stage section 400 is adapted to allow the substrate to retain heat, such that as the substrate is transported through it, heat loss is minimized. In some cases, a heating device is provided in the inter-stage section 400. In other cases, the inter-stage section 400 is heated by an external heating source, e.g., a radiant heater.

Figure 16:
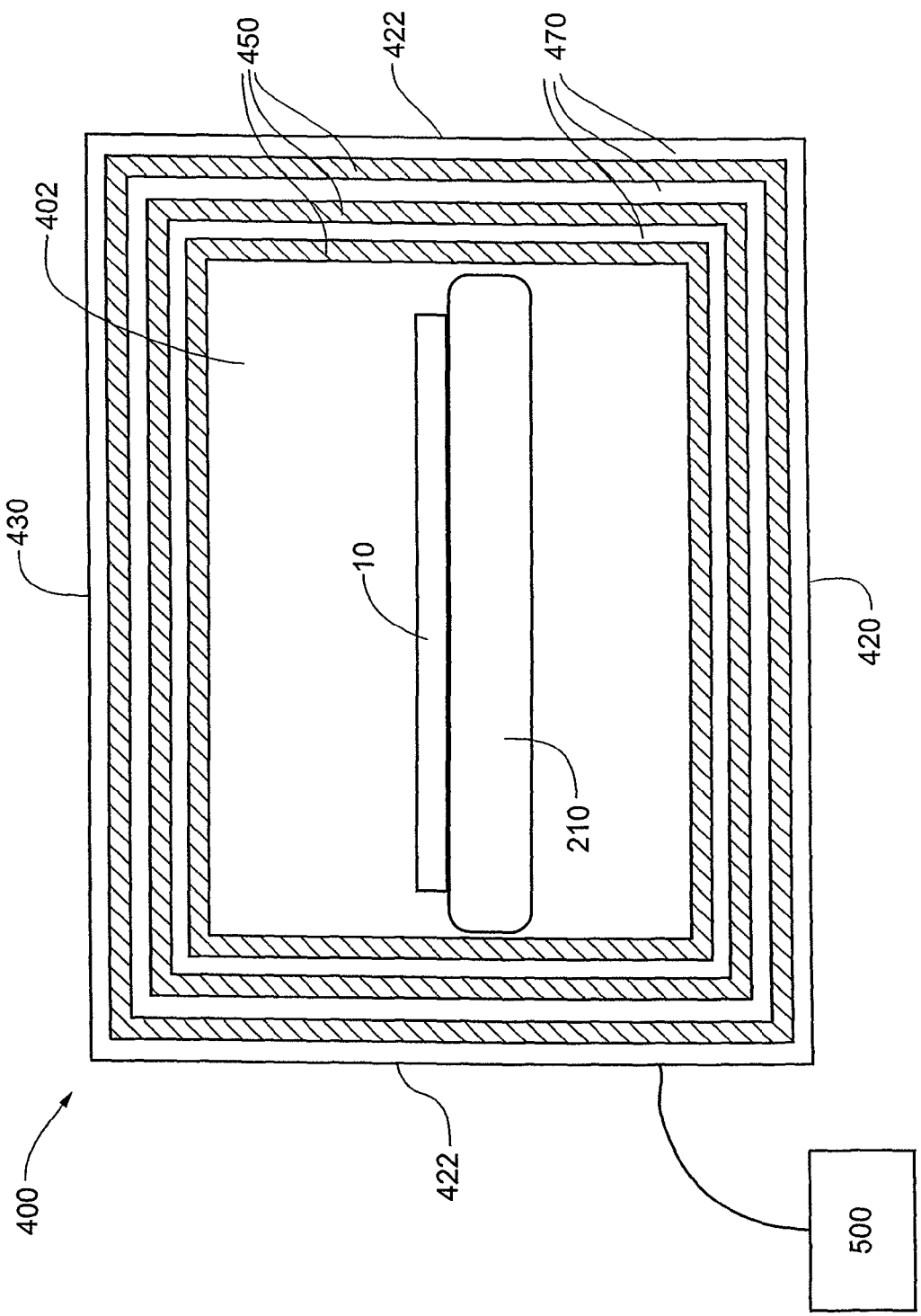
FIG. 16 is a front cross-section view of an inter-stage section adapted for use in certain methods.

If desired, the inter-stage section 400 can be fabricated of material that holds heat. FIG. 15 illustrates one embodiment of an inter-stage section 400 that is constructed so that it maintains heat. Referring to FIG. 16, section 400 can optionally have a base (or "floor") 420, side walls 422, and a ceiling 430, together bounding an interior space 402 that houses transport rollers 210 that transport a substrate 10. The base 420, side walls 422, and ceiling 430 form a rectangular tunnel, but other shapes, for example square and circular tunnels, are within the scope of the invention. Preferably, the base 420, side walls 422, and ceiling 430 are formed as a single piece, for example like a matchbox slip. In FIG. 16, the section 400 has a layered configuration, including layers of a conductive material 450 surrounded by layers of a ceramic material 470. In the illustrated embodiment, three layers of conductive material 450 and three layers of ceramic material 470 are shown, but any suitable number of layers can be provided. The layer of conductive material 450 can include any conductive metal, such as aluminum or copper. The layer of ceramic material 470 can include any dielectric that prevents heat from escaping outwards. Such ceramic may include silicon nitride, magnesium oxide, calcium oxide, zirconia, alumina, chromite, silicon carbide, carbon, and mullite. A heating source 500 can be provided, for example a radiant heater that applies heat to one or more of the conductive layers 450. Such a layered configuration may help to maintain the heat inside the interior space 402. In some embodiments, the interior space is maintained at a temperature of at least 160° F.

Some particularly advantageous methods involve depositing a low-emissivity coating on one major surface of a substrate and depositing a low-maintenance coating on an opposite major surface. In sputter-up/sputter-down embodiments of this nature, the low-emissivity coating can optionally be deposited before beginning the sputter deposition of the low-maintenance coating. This can be advantageous, since the heat associated with depositing the low-emissivity coating can provide the substrate with an elevated temperature upon beginning the sputter deposition of the low-maintenance coating. In connection with the coated glass reported in the examples below (which are also tabulated above), the low-maintenance coating was deposited by an upward sputtering process that was begun after a double-silver low-emissivity coating was deposited on the other side of the glass by a downward sputtering process. It is surmised that the heat associated with depositing the low-emissivity coating provides the glass with an elevated temperature when beginning to sputter deposit the low-maintenance coating, and the reported photoactivity levels are believed to be achieved at least in part due to this substrate heating.

Thus, certain embodiments provide a production method wherein a low-emissivity coating is sputter deposited onto one major surface of a substrate, and thereafter at least part of (optionally an entirety of) a low-maintenance coating is deposited onto the other major surface of the substrate. As noted above, the sputter deposition of the low-emissivity coating can heat the substrate, whereafter the deposition of the low-maintenance coating can be initiated while the substrate is still hot (i.e., before it has cooled to room temperature). This may improve the photoactivity, hydrophilicity, morphology, or other characteristics of the low-maintenance coating.

Figure 17:
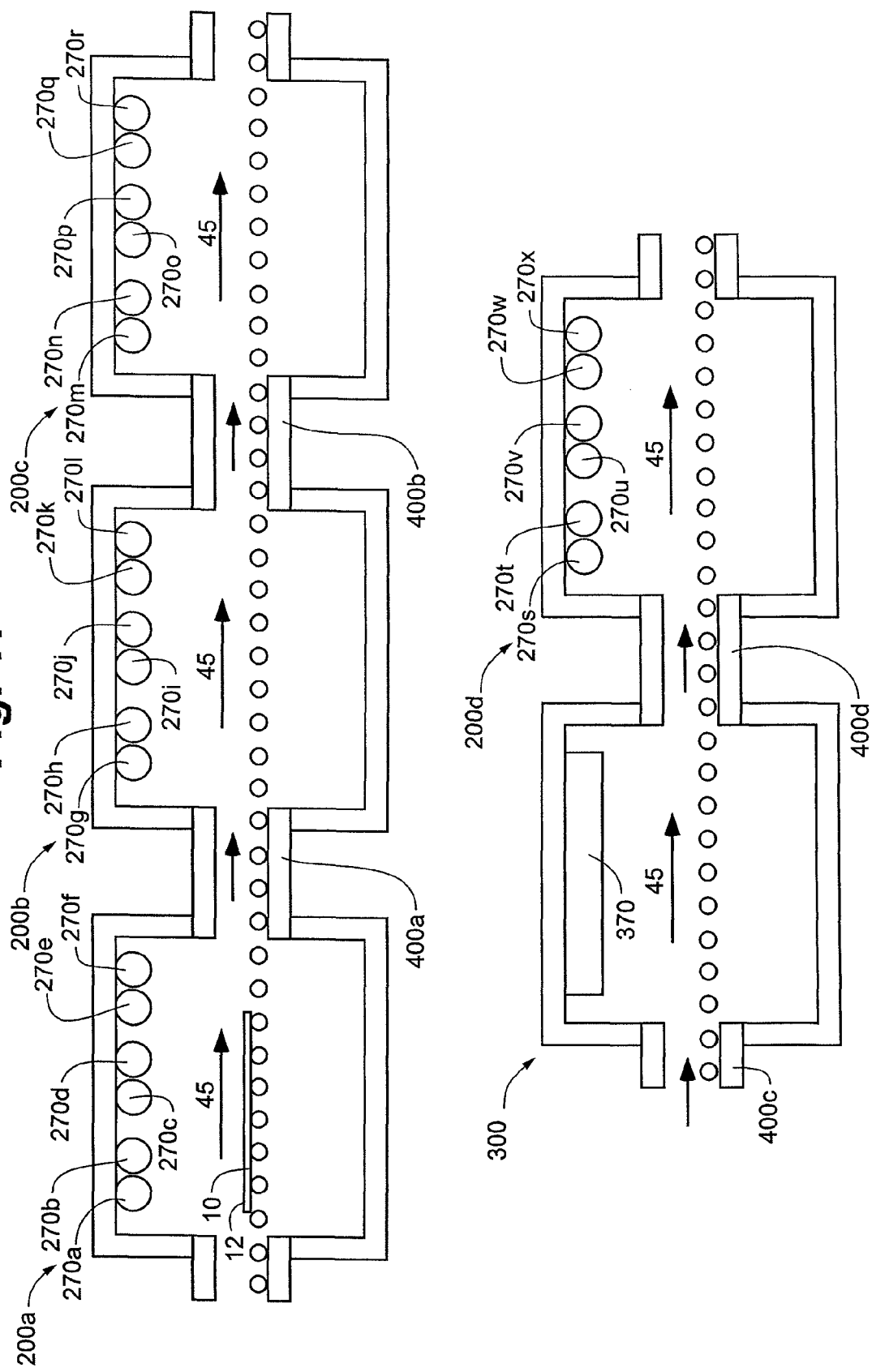
FIG. 17 is a schematic side view of a coating line, including downward sputtering chambers and a downward heating chamber, which is adapted for use in certain methods.
Figure 18:
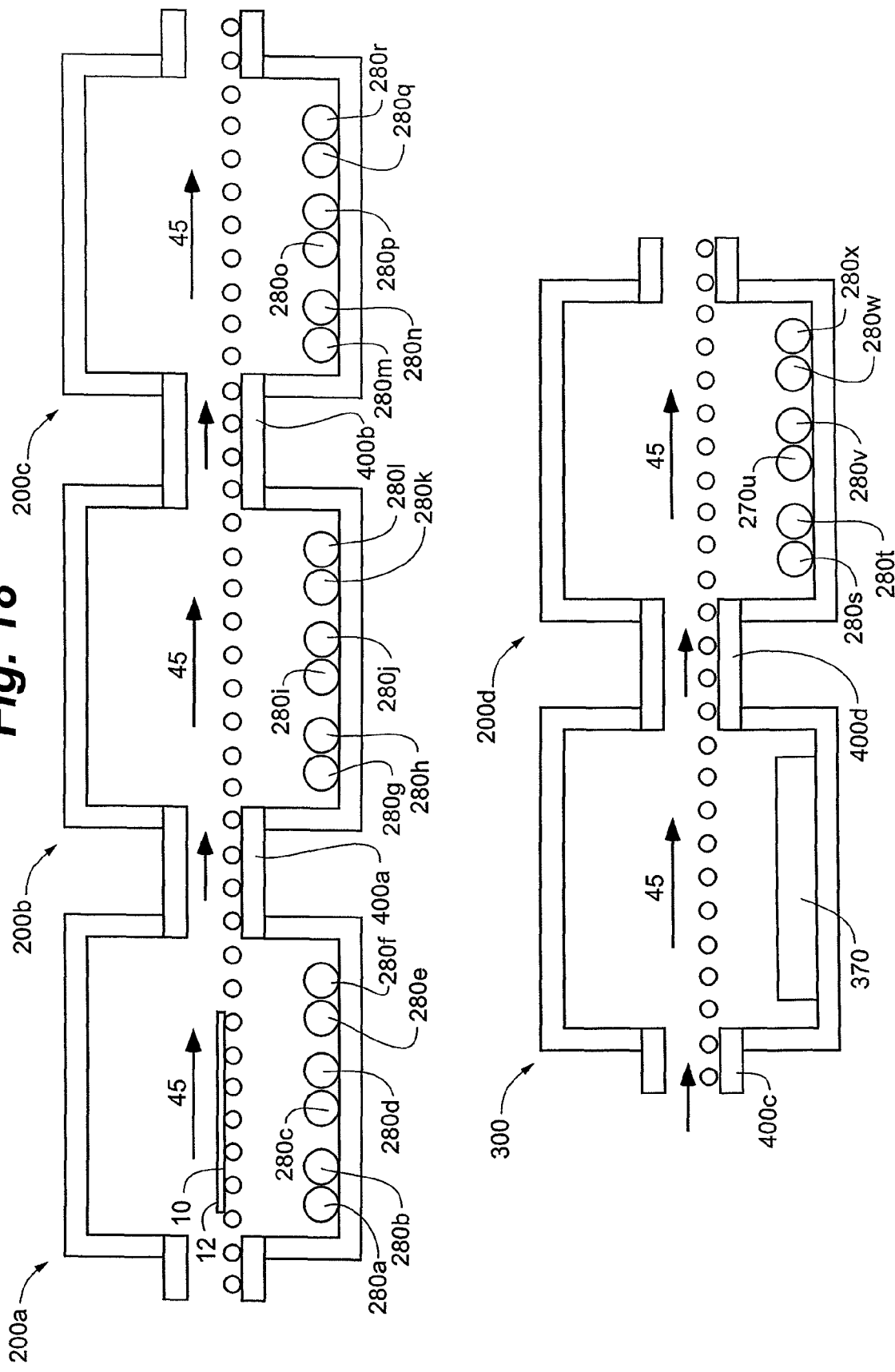
FIG. 18 is a schematic side view of a coating line, including upward sputtering chambers and an upward heating chamber, which is adapted for use in certain methods.
Figure 19:
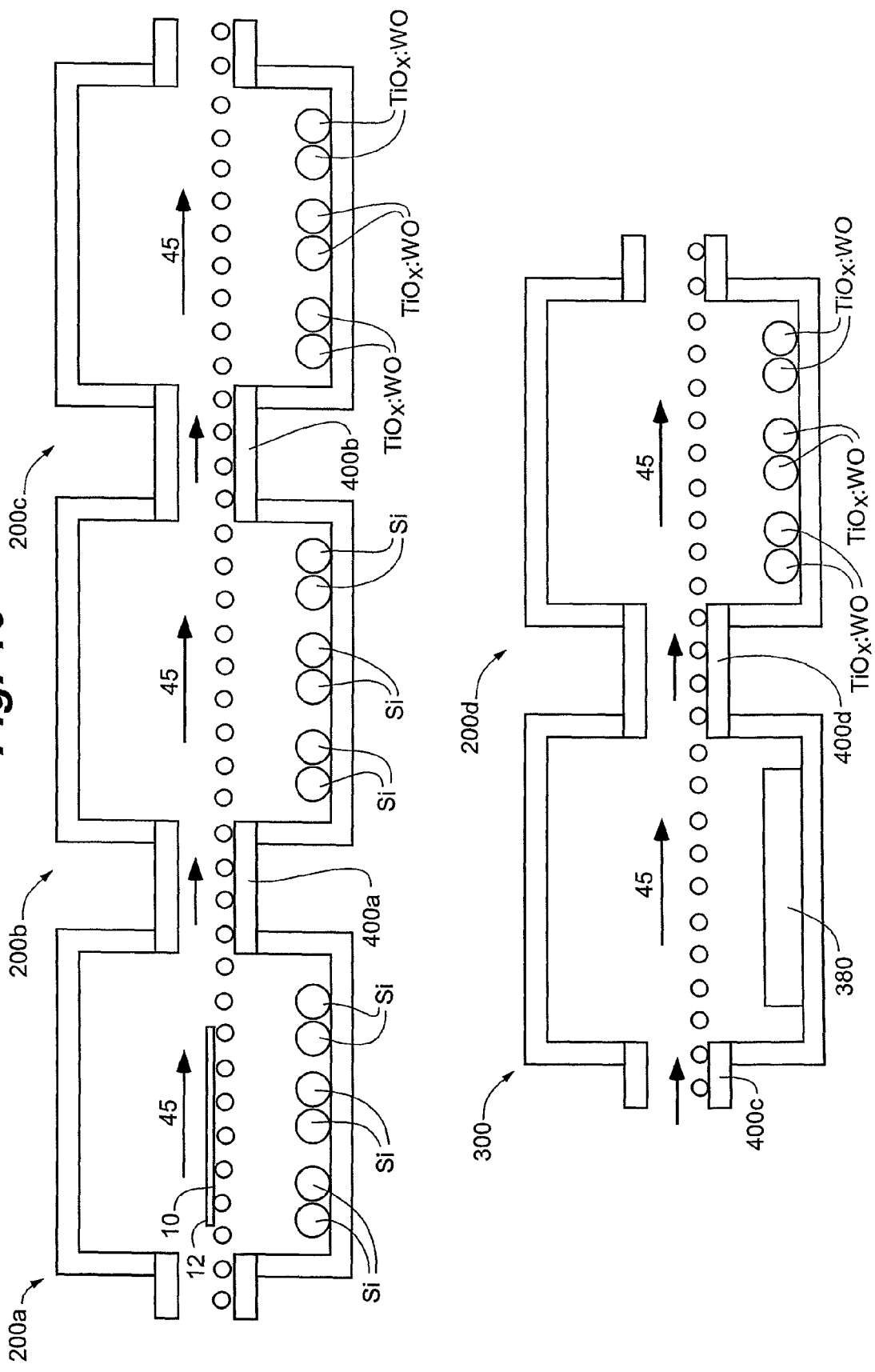
FIG. 19 is a schematic side view of a coating line, including upward sputtering chambers and an upward heating chamber, which is adapted for use in certain methods.
Figure 20:
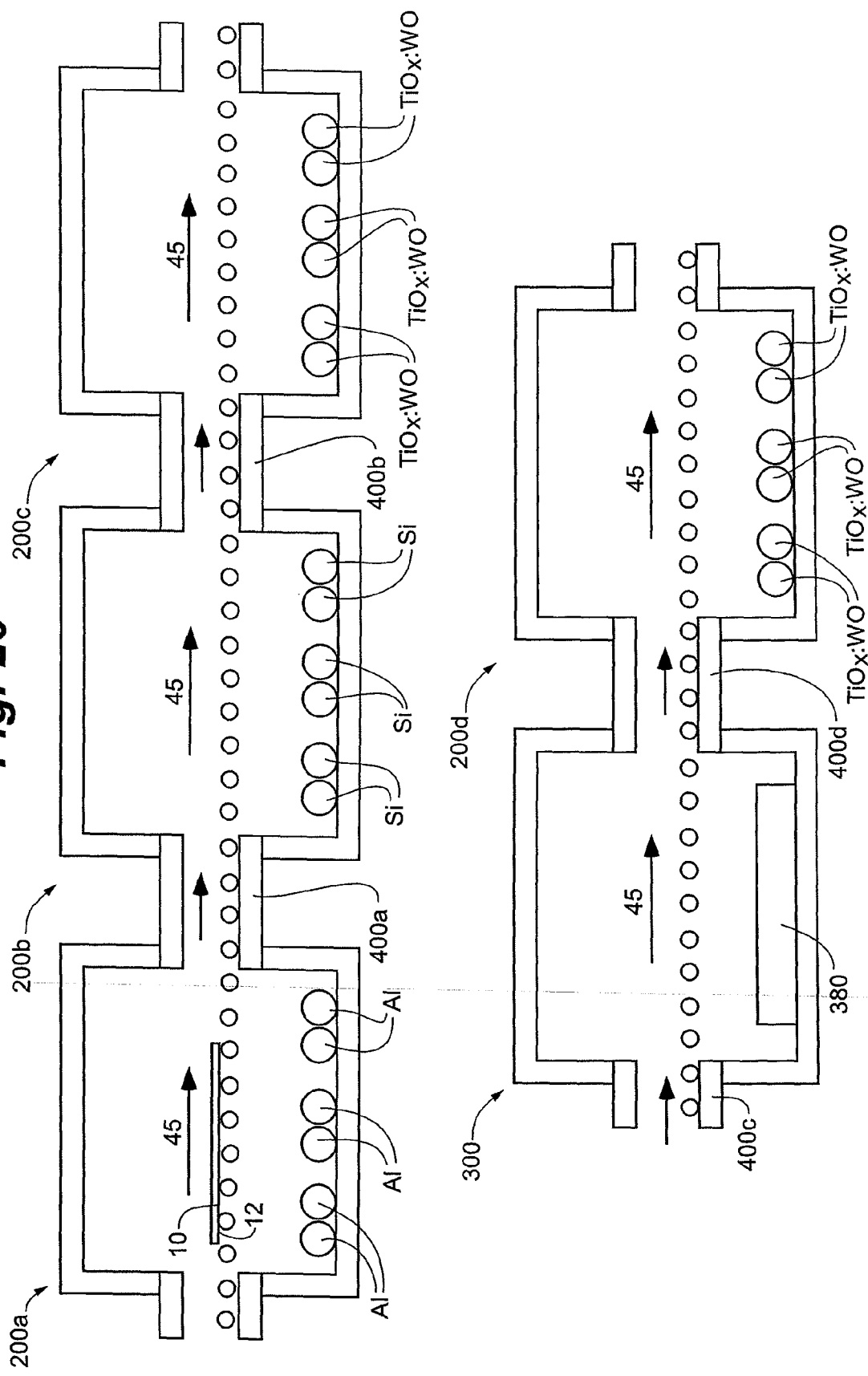
FIG. 20 is a schematic side view of a coating line, including upward sputtering chambers and an upward heating chamber, which is adapted for use in certain methods.

FIGS. 17 and 18 schematically illustrate two exemplary coaters that can be used to produce the low-maintenance coating in accordance with certain embodiments. FIG. 17 illustrates a coater having downward coating chambers 200a, 200b, 200c, and 200d (shown here with upper sputtering targets 270a-270x) and a downward heating chamber 300 (with upper heating device 370). FIG. 18 illustrates a coater having upward coating chambers 200a, 200b, 200c, and 200d (shown here with lower sputtering targets 280a-280x) and an upward heating chamber (with lower heating device 380). A substrate is conveyed along the path of substrate travel 45 through the coater in the following order: coating chamber 200a, inter-stage section 400a, coating chamber 200b, inter-stage section 400b, coating chamber 200c, inter-stage section 400c, heating chamber 300, inter-stage section 400d, and coating chamber 200d. In certain embodiments, coating chambers 200a and 200b are used to deposit a base film 15 and/or any intermediate films 20, and coating chambers 200c and 200d are used to deposit the functional film 50. If desired, additional chambers can be provided, e.g., in embodiments where more films are provided.

In certain embodiments, a base film 15 is deposited in coating chambers 200a and 200b. In these embodiments, coating chambers 200a and 200b can optionally be provided with targets carrying the same sputterable material (270a-270l, 280a-280l). In other embodiments, the base film 15 is deposited in coating chamber 200a and an intermediate film 20 is deposited in coating chamber 200b. In these embodiments, coating chamber 200a is provided with the same sputterable material (270a-270f, 280a-280f) for depositing a base film 15 and coating chamber 200b is provided with another sputterable material (270g-270l, 280g-280l) for depositing an intermediate film 20.

The sputterable material can optionally be a metal, semimetal, compound of different metals, or a compound of at least one metal and at least one semi-metal. In such cases, an oxidizing atmosphere (optionally including some argon and/or nitrogen) may be used for sputtering. The targets can alternatively be ceramic (e.g., oxide), and an inert (or slightly oxidizing and/or slightly nitriding) atmosphere may be used. In embodiments where the base film 15 comprises silica, targets comprising silicon may be used. The targets comprising silicon may, for example, be silicon-aluminum targets. In embodiments where the base film 15 comprises alumina, targets comprising aluminum can be used. When the base film 15 is provided, it can alternatively comprise titanium dioxide, silicon nitride, tin oxide, zirconium oxide, another dielectric, or a semiconductor.

In embodiments where the base film 15 is a mixed oxide film, a co-sputtering method can optionally be used. For example, one target in a chamber can comprise one material while another target in the same chamber comprises another material. For example, if coating chamber 200a is used to deposit a base film 15, targets 270a, 270c, and 270e (or targets 280a, 280c, 280e) can comprise material A and targets 270b, 270d, and 270f (or targets 280b, 280d, and 280f) can comprise material B. Likewise, if both coating chambers 200a and 200b are used to deposit a base film 15, targets 270a, 270c, 270e, 270g, 270i, and 270k (or targets 280a, 280c, 280e, 280g, 280i, and 280k) can comprise material A and targets 270b, 270d, 270f, 270h, 270j, and 270l (or targets 280b, 280d, 280f, 280h, 280j, and 280l) can comprise material B.

If desired, the targets can be metal targets and an oxidizing atmosphere (optionally including argon and/or nitrogen) can be used. The targets can alternatively be ceramic, and an inert (or slightly oxidizing and/or slightly nitriding) atmosphere can be used. For example, in embodiments where the base film 15 is a mixed oxide film comprising silica and titania, material A can comprise silicon and material B can comprise titanium. Any intermediate film(s) 20 having a mixed oxide film can be deposited in the same manner.

With continued reference to FIGS. 17 and 18, once the base film 15 and/or any intermediate films 20 are deposited, in some embodiments the substrate then travels through chamber 200c, where deposition of the functional film 50 begins. In embodiments where this film 50 is substantially homogenous, targets 270m-270r, 280m-280r can all carry the same sputterable material. These targets, for example, can be metal and an oxidizing atmosphere can be used. The targets can alternatively be ceramic, and an inert (or slightly oxidizing) atmosphere can be used.

In the exemplary embodiments of FIGS. 17 and 18, once a first part of the functional film 50 is deposited in chamber 200c, the substrate 10 travels through a heating chamber 300, where a heater 370, 380 supplies heat to the substrate. Again, it is to be appreciated that the heater can be omitted, if so desired. The substrate then travels through coater 200d, where the rest of the film 50 is deposited.

As noted above, if the substrate is annealed glass (and is to retain the anneal), it is preferred not to heat the glass to temperatures that will adversely affect the annealed state of the glass. For example, maximum glass temperatures below 350° F. are preferred, and temperatures below 300° F. (or even below 250° F.) may be more preferred. In some embodiments, the substrate is heated (e.g., during deposition) to a maximum temperature of between 140° F. and 350° F., such as between about 170° F. and about 210° F. It is to be appreciated that the substrate is not required to be heated prior to or during deposition. Instead, the coated substrate may be heat treated after deposition. Or, the coated substrate may simply be produced without heat treatment.

One group of embodiments provides a sputtering target having a sputterable material comprising both titanium and tungsten. For example, the sputterable material can optionally include titanium in the form of metal titanium, titanium monoxide, titanium dioxide and/or titanium trioxide, while the tungsten is in the form of metal tungsten, tungsten oxide, tungsten dioxide, and/or tungsten trioxide. In some cases, the sputterable material comprises both titanium and tungsten in a variety of the above forms.

In certain embodiments, the sputterable material consists essentially of titanium metal and tungsten metal. An alloy target comprising both titanium and tungsten could be used. Or, one could use a metal titanium target provided with strips (or the like) of metal tungsten. When metal targets are sputtered, an oxidizing atmosphere (optionally with a slight amount of nitrogen) can be used.

In other embodiments, the sputterable material comprises both titanium oxide and tungsten oxide. In these cases, an inert atmosphere or a slightly oxidizing atmosphere (optionally including a small amount of nitrogen) can be used during sputtering. In certain embodiments, the sputterable material comprises titanium monoxide, titanium dioxide, and tungsten oxide. In these cases, a slightly oxidizing atmosphere (optionally including a small amount of nitrogen) can be used during sputtering. Or, the targets could be sputtered in an inert atmosphere, e.g., if the resulting film is not required to be fully oxidized (or if it will be further oxidized, such as during a subsequent heat treatment in air). In certain cases, the sputterable material is characterized by a metal-only W/Ti weight ratio of between about 0.01 and 0.34, such as between about 0.01 and about 0.2, this ratio being the total weight of the tungsten atoms in the sputterable material divided by the total weight of the titanium atoms in the sputterable material.

A target with sputterable material comprising both titanium and tungsten can be prepared using a number of different methods. In some embodiments, a target is prepared by plasma spraying titanium oxide together with tungsten metal onto a target base in an atmosphere that is oxygen deficient and does not contain oxygen-containing compounds. During the plasma spraying process, the action of the plasma on the titanium oxide causes the titanium oxide to lose some oxygen atoms from their lattices. These oxygen atoms are believed to combine with the metal tungsten to form tungsten oxide, as tungsten has a high electrochemical potential. The titanium oxide sprayed onto the backing tube may thus comprise titanium monoxide, titanium dioxide, and tungsten oxide. The sputterable target may, as just one example, be a cylindrical rotary target having a backing tube with a length of at least 24 inches. In such cases, the sputterable material is carried on an exterior wall of the backing tube. Such a cylindrical target is also adapted to rotate about a central axis to which the exterior wall of the backing tube is substantially parallel. Alternatively, hot isostatic pressing may be used to form a target. Other target forming methods can also be used.

When the functional film 50 is deposited by sputtering one or more targets comprising both tungsten oxide and substoichiometric TiOx, the sputtering is preferably carried out using argon, a mixture of argon and oxygen, a mixture of nitrogen and argon, a mixture of nitrogen and oxygen, or a mixture of oxygen, nitrogen, and argon. If the plasma gas does not contain oxygen, e.g., if pure argon is used, then the coating will not be fully oxidized when deposited. In contrast, if the plasma gas contains oxygen, then the reduced form(s) of titanium oxide may be converted during the sputtering process into the transparent form, which is stoichiometric or substantially stoichiometric. The film's degree of transparency will depend upon the amount of oxygen contained in the plasma gas and/or whether any subsequent heat treatment is performed in air. An exemplary gas mixture to form transparent film is 70-90% by volume argon and 30-10% by volume of oxygen. In some cases, the gas mixture can include as little as 1-3% by volume oxygen, with the remainder being argon.

In embodiments where the film 50 comprises both titanium oxide and tungsten oxide, a co-sputtering method can optionally be used. For example, one target can comprise titanium metal while an adjacent target comprises tungsten metal. As another option, each target can carry a sputterable metallic material that is a compound (e.g., an alloy) comprising both titanium metal and tungsten metal.

As noted above, the substrate in some embodiments is glass. It is often desirable or necessary to use tempered glass for certain applications, as is well known. In such cases, after the substrate has been coated with the low-maintenance coating 80, the coated substrate can be tempered. In certain embodiments, the coated substrate is positioned in a tempering furnace for at least 60 seconds, during which time the furnace is set at a temperature of at least 650° C. In some cases, this brings the coated substrate to a temperature of at least about 640° C. Then, the substrate is rapidly cooled down. Preferably, once the substrate reaches room temperature, it exhibits a haze of less than 0.4 (more preferably less than 0.2, or even less than 0.15) after heat treatment. Skilled artisans will be familiar with a variety of tempering methods that can be used to produce commercially acceptable tempered glass.

Some exemplary film stacks and deposition methods will now be described.

Example #1

A soda-lime glass substrate was transported through a coat zone having two operating pairs of rotary silicon targets (each including about 15% aluminum). A gas mix comprising about 40-60% argon and the remainder oxygen was provided in each chamber, and the targets were sputtered to deposit a high-rate base film comprising silica on surface 12 of the substrate. The power on each pair of rotary targets was 60 Kw. The glass was conveyed at about 275 inches per minute. The base film had a thickness of about 200 Å.

Next, the substrate was transported through another coat zone, this one having three operating pairs of rotary ceramic targets (each with sputterable material consisting essentially of titanium oxide and tungsten oxide, where the titanium is present at about 59-74 weight %, the tungsten is present at about 1.4-3.8 weight %, and the oxygen is present at about 23.3-38.6 weight %). A gas mix of about 85% argon (and the remainder oxygen) was used, and the ceramic targets were sputtered to deposit the functional film. The power on each pair of rotary targets was 80 Kw. The functional film had a thickness of about 70 Å. The glass was conveyed at a speed of about 267 inches per minute.

The substrate was annealed glass. No post-deposition tempering or other heat treatment was performed. However, the low-maintenance coating was applied by upward sputtering after a double-silver low-emissivity coating was applied by downward sputtering (the low-emissivity coating was downwardly sputtered in a first part of the coater, and the low-maintenance coating was upwardly sputtered in a second part of the same coater). Thus, it is surmised that the glass retained heat from the deposition of the low-emissivity coating when the sputtering began for the low-maintenance coating.

The low-maintenance coating had an average surface roughness Ra of about 0.39 nm. The coating exhibited an acetone decomposition rate of about $2.14 \times 10^{-10}$ moles/(liter)(second).

Example #2

A low-maintenance coating was deposited on a glass substrate in the manner described above in Example #1. Once the coating was deposited, the glass was heat-treated in a furnace in a manner that simulates tempering in a commercial production setting. The furnace used is a HengLi RSK-2506 Fast Response Conveyor Furnace manufactured by HengLi Eletek Co., Ltd. (Hefei.Ah.China). The furnace is approximately 5.3 meters long with 6 zones for heating and cooling. The coated glass was conveyed in a single pass through the furnace at about 300 mm/second, taking about 19.4 minutes. The heat zone of the lab furnace was set at 690° F. The coated glass takes about 7.2 minutes to go through the approximately 2.2 meter long heat zone. The coated glass then exits the heat zone, and enters and passes through the approximately 1.8 meter cooling zone for about 6 minutes before exiting the furnace. It is estimated that the glass (which in this example was 3.1 mm soda-lime glass) reached a temperature of about 640° F.

The low-maintenance coating had an average surface roughness Ra of about 2.75 nm. The coating exhibited an acetone decomposition rate of about $6.82 \times 10^{-10}$ moles/(liter)(second).

Example #3

A soda-lime glass substrate was coated with a base film comprising silica at a thickness of about 200 Å in the manner described above in Example #1.

Next, the substrate was transported through another coat zone, this one having three operating pairs of rotary ceramic targets (with the same sputterable material described above in Example #1). A gas mix of about 85% argon (and the remainder oxygen) was used, and the ceramic targets were sputtered to deposit the functional film. The power on each pair of rotary targets was 80 Kw. The functional film had a thickness of about 55 Å. The glass was conveyed at a speed of about 340 inches per minute.

The substrate was annealed glass. However, this coating was applied by upward sputtering after a double-silver low-emissivity coating was applied by downward sputtering. Therefore, it is believed that the glass retained heat from the deposition of the low-emissivity coating when the sputtering began for the low-maintenance coating. No post-deposition tempering or other heat treatment was performed.

The low-maintenance coating had an average surface roughness Ra of about 0.44 nm. The coating exhibited an acetone decomposition rate of about $1.97 \times 10^{-10}$ moles/(liter)(second).

Example #4

A low-maintenance coating was deposited on a glass substrate in the manner described above in Example #3. The glass was then heat treated in the manner described above in Example #2.

The low-maintenance coating had an average surface roughness Ra of about 2.34 nm. The coating exhibited an acetone decomposition rate of about $5.46 \times 10^{-10}$ moles/(liter)(second).

Comparative Example

A coating having an outer film of titanium dioxide was prepared, and is illustrated in Table 6 ("Comparative Coating #6").

TABLE 6

| (Comparative Coating #6) | | |
|---|---|---|
| Component | Material | Thickness |
| Outer Film | Titanium Oxide | 25-40 Å |
| Base Film | Silica | 75 Å |
| Substrate | Glass | — |

Comparative Coating #6 exhibited an acetone decomposition rate of about $1.25 \times 10^{-10}$ moles/(liter)(second).

While certain preferred embodiments of the invention have been described, it should be understood that various changes, adaptations and modifications can be made without departing from the spirit of the invention and the scope of the appended claims.

What is claimed is:

1. A method comprising:
   depositing a low-maintenance coating on a major surface of a glass sheet, the low-maintenance coating including a base film and a functional film,
   wherein the base film is deposited by a sputtering technique where at least one target is sputtered in an atmosphere into which both inert gas and reactive gas are flowed and an inflow rate for the inert gas divided by an inflow rate for the reactive gas is between 0.4 and 9, and
   wherein the functional film is deposited by a sputtering technique that uses at least one target having a sputterable material comprising both titanium oxide and tungsten oxide, the titanium oxide comprising TiO and $TiO_2$.

2. The method of claim 1 wherein the sputtering technique for depositing the base film involves a plurality of targets each carrying a sputterable material consisting essentially of: 1) one or more metals, or 2) one or more semi-metals, or 3) at least one metal and at least one semi-metal, and the sputtering technique for depositing the functional film involves a plurality of oxide targets each carrying the sputterable material comprising both titanium oxide and tungsten oxide.

3. The method of claim 2 wherein the sputterable material used in depositing the base film includes silicon.

4. The method of claim 1 wherein the inert gas is argon and the reactive gas is oxygen or nitrogen.

5. The method of claim 1, wherein the at least one target having the sputterable material comprising both titanium oxide and tungsten oxide is at least one target consisting essentially of titanium oxide and tungsten oxide, wherein titanium is present at about 59-74 weight percent of the target, tungsten is present at about 1.4-3.8 weight percent of the target, and oxygen is present at about 23.3-38.6 weight percent of the target.

6. The method of claim 1, wherein the sputtering technique for depositing the base film and the sputtering technique for depositing the functional film both use magnetron sputtering.

7. The method of claim 1, wherein the base film is deposited to a thickness of less than about 300 angstroms.

8. The method of claim 1, wherein the functional film is deposited to a thickness of less than 200 angstroms.

9. The method of claim 1, wherein the functional film is deposited to a thickness of less than 150 angstroms.

10. The method of claim 1, wherein the low-maintenance coating is deposited such that the base film and the functional film have a combined thickness of less than about 350 angstroms.

11. The method of claim 1, wherein the functional film is deposited by sputtering the at least one target having the sputterable material comprising both titanium oxide and tungsten oxide in an atmosphere into which both inert gas and reactive gas are flowed, and an inflow rate for the inert gas divided by an inflow rate for the reactive gas is between 0.4 and 6.

12. The method of claim 1, wherein the depositing of the low-maintenance coating is performed such that the low-maintenance coating has an average surface roughness of between 0.4 and 3.0 nm.

13. The method of claim 1, wherein the low-maintenance coating has a physical thickness and an area, the physical thickness varying by less than 20 angstroms over the area of the low-maintenance coating.

14. A method comprising:
depositing a low-maintenance coating on a major surface of a glass sheet, the low-maintenance coating including a base film and a functional film,
wherein the base film is deposited by a sputtering technique where at least one target is sputtered in an atmosphere into which both inert gas and reactive gas are flowed and an inflow rate for the inert gas divided by an inflow rate for the reactive gas is between 0.4 and 9, and
wherein the functional film is deposited by a sputtering technique that uses at least one target having a sputterable material comprising both titanium oxide and tungsten oxide, the titanium oxide comprising TiO and $TiO_2$, and
the depositing of the low-maintenance coating is performed such that the functional film defines an exposed outermost face of the low-maintenance coating.

15. The method of claim 14, wherein the base film is deposited to a thickness of less than about 300 angstroms.

16. The method of claim 14, wherein the functional film is deposited to a thickness of less than 200 angstroms.

17. The method of claim 14, wherein the functional film is deposited to a thickness of less than 150 angstroms.

18. The method of claim 14, wherein the low-maintenance coating is deposited such that the base film and the functional film have a combined thickness of less than about 350 angstroms.

19. The method of claim 14, wherein the functional film is deposited by sputtering the at least one target having the sputterable material comprising both titanium oxide and tungsten oxide in an atmosphere into which both inert gas and reactive gas are flowed, and an inflow rate for the inert gas divided by an inflow rate for the reactive gas is between 0.4 and 6.

20. The method of claim 14, wherein the depositing of the low-maintenance coating is performed such that the low-maintenance coating has an average surface roughness of between 0.4 and 3.0 nm.

* * * * *